(12) United States Patent
Soutome et al.

(10) Patent No.: US 8,089,280 B2
(45) Date of Patent: Jan. 3, 2012

(54) RF COIL AND MRI SYSTEM

(75) Inventors: Yoshihisa Soutome, Tokyo (JP); Hideta Habara, Musashino (JP); Hisaaki Ochi, Bellevue, WA (US)

(73) Assignee: Hitachi, Ltd., Tokyo (JP)

( * ) Notice: Subject to any disclaimer, the term of this patent is extended or adjusted under 35 U.S.C. 154(b) by 242 days.

(21) Appl. No.: 11/782,679

(22) Filed: Jul. 25, 2007

(65) Prior Publication Data

US 2008/0061785 A1  Mar. 13, 2008

(30) Foreign Application Priority Data

Sep. 13, 2006 (JP) ................................. 2006-247478

(51) Int. Cl.
*G01V 3/00* (2006.01)
(52) U.S. Cl. ....................................................... 324/318
(58) Field of Classification Search .......... 324/300–322; 600/410–435; 333/219–235
See application file for complete search history.

(56) References Cited

U.S. PATENT DOCUMENTS

| | | | | |
|---|---|---|---|---|
| 4,740,752 A * | 4/1988 | Arakawa et al. | ............... | 324/318 |
| 5,041,790 A * | 8/1991 | Tropp et al. | ................... | 324/318 |
| 6,029,082 A * | 2/2000 | Srinivasan et al. | ............ | 600/422 |
| 6,414,488 B1 * | 7/2002 | Chmielewski | ................. | 324/311 |
| 7,352,185 B1 * | 4/2008 | Zens et al. | .................... | 324/322 |
| 7,626,390 B2 * | 12/2009 | Gleich et al. | ................... | 324/318 |
| 7,728,591 B2 * | 6/2010 | Weizenecker et al. | ........ | 324/318 |
| 2006/0244453 A1 * | 11/2006 | Doty | ............................ | 324/322 |

OTHER PUBLICATIONS

G.H. Glover, "A Comparison of Linear and Circular Polarization for Magnetic Resonance Imaging," Journal of Magnetic Resonance, vol. 64, and pp. 255-270 (1985).
Cecil E. Hayes, et al., "An Efficient, Highly Homogeneous RF Coil for Whole-Body NMR Imaging at 1.5 Tesla," Journal of Magnetic Resonance, vol. 63, and pp. 622-628.
James Tropp et al., "The Theory of the Bird-Cage Resonator," Journal of Magnetic Resonance, vol. 82 and pp. 51-62 (1989).
Peter M. Joseph et al., "A Technique for Double Resonance Operation of Birdcage Imaging Coils," IEEE Transactions on Medical Imaging, 1989, 8, pp. 286-294).

* cited by examiner

*Primary Examiner* — Dixomara Vargas
(74) *Attorney, Agent, or Firm* — Antonelli, Terry, Stout & Kraus, LLP.

(57) ABSTRACT

In an MRI apparatus, an RF coil is provided which can generate or detect a circularly-polarized magnetic field with one feeding port, and which can radiate highly efficient, highly homogeneous electromagnetic waves and detect a highly sensitive, highly homogeneous magnetic resonance signal. For this purpose, the coil has a cylindrical shape, one feeding port which exchanges signals, plural first capacitors disposed at circumferential positions in at least one cross-section effectively orthogonal to the direction of the static magnetic field, and at least one second capacitor. In this RF coil, in which a static magnetic field is applied in essentially an identical direction to the direction of the central axis of the cylindrical shape, a second capacitor having a smaller capacity than the capacity of the first capacitor, is disposed at a position from 22.5° to 67.5° or 202.5° to 247.5° in a clockwise direction with respect to the center of the cylindrical shape from the feeding port in a cross-section viewed from a direction passing through the static magnetic field.

20 Claims, 35 Drawing Sheets

$C \neq C'$

RF COIL AND MRI SYSTEM

CLAIM OF PRIORITY

The present application claims priority from Japanese application JP 2006-247478 filed on Sep. 13, 2006, the content of which is hereby incorporated by reference into this application.

FIELD OF THE INVENTION

The present invention relates to MRI (magnetic resonance imaging), and more particularly to a RF coil for transmitting electromagnetic waves and detecting a magnetic resonance signal.

BACKGROUND OF THE INVENTION

A magnetic resonance imaging apparatus is a medical imaging and diagnostic device which generates a magnetic resonance with atomic nuclei in an arbitrary cross-section passing horizontally through a test subject, and obtaining a tomogram in that cross-section from the magnetic resonance signal which is generated.

In order to obtain an image of high precision and high resolution, various parts of magnetic resonance imaging apparatus are being improved. In particular, in a RF coil (RF coil) which performs irradiation of electromagnetic waves and detection of a magnetic resonance signal, improvements are desired in the transmit efficiency, transmit uniformity, sensitivity and sensitivity distribution uniformity.

The QD (Quadrature Detection) method is known as a method of improving the transmit efficiency and sensitivity of an RF coil (for example, see the document, G. H. Glover, "A Comparison of Linear and Circular Polarization for Magnetic Resonance Imaging," Journal of Magnetic Resonance, Vol. 64, and pp. 255-270 (1985)). In the QD method, a magnetic resonance signal is detected using two RF coils whose axes are disposed mutually orthogonal to each other. When this method detects a magnetic resonance signal, signals differing in phase by 90° will be detected from each RF coil. By combining these detection signals, the Signal-To-Noise ratio is theoretically improved by √2 times compared to the case where the signal is received by one RF coil. Since only ½ the power is required when irradiating the radio frequency magnetic field, the RF heating delivered to the patient is reduced. The QD method is also effective from the viewpoint of uniformity of the image obtained.

A birdcage coil is an RF coil in which transceive can be performed by the QD method (for example, see the document, Cecil E. Hayes, et al., "An Efficient, Highly Homogeneous RF Coil for Whole-Body NMR Imaging at 1.5 Tesla," Journal of Magnetic Resonance, Vol. 63, and pp. 622-628 (1985)). In the case of a birdcage coil, transceive by the QD method are attained with one coil by arranging two feeding ports for transmitting and receiving a signal in a position in which they intersect orthogonally to each other. In the birdcage coil, the distribution of the irradiated RF magnetic field is uniform, and the sensitivity of the coil is high.

It is known that, when two feeding ports have been arranged in a birdcage coil, due to the effect of the impedance of the feeding port, the value of the capacitor disposed in the birdcage coil effectively changes, so the resonance frequency of the coil in each feeding port will change (for example, see the document, James Tropp et al., "The Theory of the Bird-Cage Resonator," Journal of Magnetic Resonance, Vol. 82 and pp. 51-62 (1989)). It is known also that, if the capacities of one or two opposite capacitors among the plural capacitors disposed in the birdcage coil are arranged to be different, as far as concerns the RF magnetic field transmitted and received by the birdcage coil, the oscillating magnetic field generated will have a different frequency in a direction connecting a capacitor of different capacity and the capacitor in the opposite position, and the direction orthogonal to this direction (see the above-mentioned document and the document, Peter M. Joseph et al., "A Technique for Double Resonance Operation of Birdcage Imaging Coils," IEEE Transactions on Medical Imaging, 1989, 8, pp. 286-294).

In order to operate a birdcage coil by the QD method, the RF signal supplied to the two orthogonal ports must be divided/phase-shifted, the magnetic resonance signal generated by the test subject received by two feeding ports as a circularly-polarized wave, and phase shifting/combining performed. Therefore, in the case of wiring using a birdcage coil respectively as a transmit coil and receive coil, as shown in FIG. 35, the signal line extending from the transmitter is split into two by a divider. One of the signals passes through a phase shifter, and is connected to the feeding port of the transmit coil disposed in a mutually orthogonal position, while of two signal lines extending from two feeding ports connected in orthogonal positions of the receive coil, one passes through a phase shifter to be combined into one signal line by a combiner connected to a receiver.

SUMMARY OF THE INVENTION

In the prior art method as described above, when using a birdcage coil by the QD method as a transmit coil or receive coil, the wiring connected to the coil becomes two lines, and a divider, combiner and phase shifter are connected. Since two sets of wiring must be connected for one coil, the construction becomes complex and the number of parts increases, so adjustment is complicated and manufacturing costs increase. There is the problem that, due to phase shifts in the divider, combiner and phase shifter and mechanical distortion in the coils, orthogonality decreases, and the transmit efficiency and sensitivity of the coils decrease.

It is therefore an object of the present invention, which was conceived to solve the above problems, to provide a RF coil which can detect or generate a circularly-polarized in which there is one feeding port to a coil, irradiate a high efficiency, high uniformity electromagnetic wave, or detect a high sensitivity, high uniformity magnetic resonance signal. For this purpose, the RF coil has a cylindrical shape and one feeding port, and has an instrument to generate or detect a circularly-polarized magnetic field inside this cylindrical shape.

In the document, James Tropp et al., "The Theory of the Bird-Cage Resonator," Journal of Magnetic Resonance, Vol. 82 and pp. 51-62 (1989), a coil is described where, among plural capacitors in a birdcage coil, the value of one capacitor at a position which makes an angle of 45° with a capacitor which supplies power with the axis of the birdcage coil as center, is varied. However, in this document, the spatial relationship of the coil with the static magnetic field direction in which transmit or receive of the circularly-polarized magnetic field is possible, and the spatial relationship between the capacitor whose value is changed and the feeding port, are not described. In the document, an arrangement in which transmit or receive of the circularly-polarized magnetic field is possible, cannot be specified. Moreover, with the capacitor value described in the document, transceive of the circularly-polarized magnetic field cannot be performed.

In the document, Peter M. Joseph et al., "A Technique for Double Resonance Operation of Birdcage Imaging Coils,"

IEEE Transactions on Medical Imaging, 1989, 8, pp. 286-294, among plural capacitors disposed in a birdcage coil, a coil supplied by a capacitor is described in which the capacity values of two capacitors symmetrically disposed with respect to the coil axis are changed, and power is supplied to a capacitor disposed at an angle of 45° with respect to the capacitor whose capacity value was changed and the coil axis. However, in this document, the spatial relationship of the coil with the static magnetic field direction in which transmit or receive of the circularly-polarized magnetic field is possible, and the spatial relationship between the capacitor whose value is changed and the feeding port, are not described. Moreover, with the capacitor value described in the document, transceive of a circularly-polarized magnetic field cannot be performed.

The present invention, by suitably specifying the spatial relationship between the direction of a static magnetic field which can transmit or receive a circularly-polarized magnetic field and a coil, and the spatial relationship between a capacitor whereof the value is changed and a feeding port, can generate or detect a circularly-polarized magnetic field in a cylindrical shape in an RF coil construction having one feeding port.

As an example, an RF coil according to the invention has a cylindrical shape, to which a static magnetic field is applied in effectively the same direction as the direction of the central axis of the cylindrical shape, and has one feeding port which receives a signal from the RF coil. Here, the RF coil further includes plural capacitors disposed at circumferential positions in at least one cross-section effectively orthogonal to the direction of the static magnetic field, in which the plural capacitors may include plural first capacitors having a first capacity, and at least one second capacitor disposed at a position from 22.5° to 67.5° or 202.5° to 247.5° in a clockwise direction with respect to the center of the cylindrical shape from the feeding port in a cross-section viewed from a direction passing through the static magnetic field, and having a smaller second capacity than the first capacity. Alternatively, it may include plural first capacitors having a first capacity, and at least one third capacitor disposed at a position from 22.5° to 67.5° or 202.5° to 247.5° in an anti clockwise direction with respect to the center of the cylindrical shape from the feeding port in a cross-section viewed from a direction passing through the static magnetic field, and having a larger third capacity than the first capacity.

As another example of the RF coil according to the invention, the RF coil has a cylindrical shape, in which a static magnetic field is applied in effectively the same direction as direction of the central axis of the cylindrical shape, including plural double-tuned circuits disposed circumferentially in at least one cross-section effectively orthogonal to the direction of the static magnetic field for the purpose of resonating with a first resonance frequency and a second resonance frequency, a first feeding port which feeds. a first resonance frequency signal, and a second feeding port which feeds a second resonance frequency signal, in which the second feeding port is disposed at a position 90° in the counterclockwise direction with respect to the center of the cylindrical shape from the first feeding port in the cross-section viewed from a direction passing through the static magnetic field, and the plural double-tuned circuits include plural first double-tuned circuits in which, when the first resonance frequency is higher than the second resonance frequency, the first capacity at the first resonance frequency shows a smaller value than the second capacity at the second resonance frequency, and a second double-tuned circuit disposed at a position 22.5° to 67.5° or 202.5° to 247.5° in the clockwise direction with respect to the center of the cylindrical shape from the first feeding port in a cross-section viewed in a direction passing through the static magnetic field, showing a smaller capacity than the first capacity at the first resonance frequency and showing a larger capacity than the second capacity at the second resonance frequency.

As another example of the RF coil according to the invention, the RF coil has a cylindrical shape, in which a static magnetic field is applied in effectively the same direction as direction of the central axis of the cylindrical shape, including plural double-tuned circuits disposed circumferentially in at least one cross-section effectively orthogonal to the direction of the static magnetic field for the purpose of resonating with a first resonance frequency and a second resonance frequency, a first feeding port which feeds a first resonance frequency signal, and a second feeding port which feeds a second resonance frequency signal, in which the second feeding port is disposed at a position 90° in the clockwise direction with respect to the center of the cylindrical shape from the first feeding port in the cross-section viewed from a direction passing through the static magnetic field, and the plural double-tuned circuits include plural first double-tuned circuits in which, when the first resonance frequency is higher than the second resonance frequency, the first capacity at the first resonance frequency shows a smaller value than the second capacity at the second resonance frequency, and a second double-tuned circuit disposed at a position 22.5° to 67.5° or 202.5° to 247.5° in the clockwise direction with respect to the center of the cylindrical shape from the first feeding port in a cross-section viewed in a direction passing through the static magnetic field, showing a smaller capacity than the first capacity at the first resonance frequency and showing a larger capacity than the second capacity at the second resonance frequency.

The magnetic resonance imaging apparatus according to the invention as an example includes a static magnetic field providing instrument which forms a static magnetic field, a gradient magnetic field providing instrument which forms a gradient magnetic field, a RF magnetic field providing instrument which forms a RF magnetic field, a transmit coil which applies a RF magnetic field to a test subject, a receive coil which detects a magnetic resonance signal from the test subject, a receive instrument which receives the magnetic resonance signal, a control instrument which controls the gradient magnetic field providing instrument, RF magnetic field providing instrument and receive instrument, the RF coil being used as a transmit coil or a receive coil.

According to the invention, an RF coil which can transceive a circularly-polarized magnetic field having high Signal-To-Noise ratio and uniformity can be provided as in the case where power is supplied by the QD method with one feeding port. Therefore, since there is one less feeding port compared with the QD method, in the case of a transmit coil, the divider and phase shifter are unnecessary, and in the case of a receive coil, the combiner and phase shifter are unnecessary, while the number of the parts which form the transceiver system is reduced to half or less. For this reason, manufacturing cost can be lowered while adjustment of the transceiver system becomes easy. Also, since there is only one feeding port to the coil and a divider, combiner and phase shifter are not used, decrease of orthogonality due to mechanical distortion of the coil, and decrease of Signal-To-Noise ratio of the coil due to phase shifts resulting from the divider, combiner and phase shifter, can be suppressed, so compared to the prior art, transmit efficiency and sensitivity of the RF coil are enhanced.

DETAILED DESCRIPTION OF THE PREFERRED EMBODIMENTS

Hereafter, some suitable embodiments of the RF coil and the magnetic resonance imaging apparatus will be described in detail. However, the invention is not to be construed as being limited in anyway by these embodiments.

Figure 1:
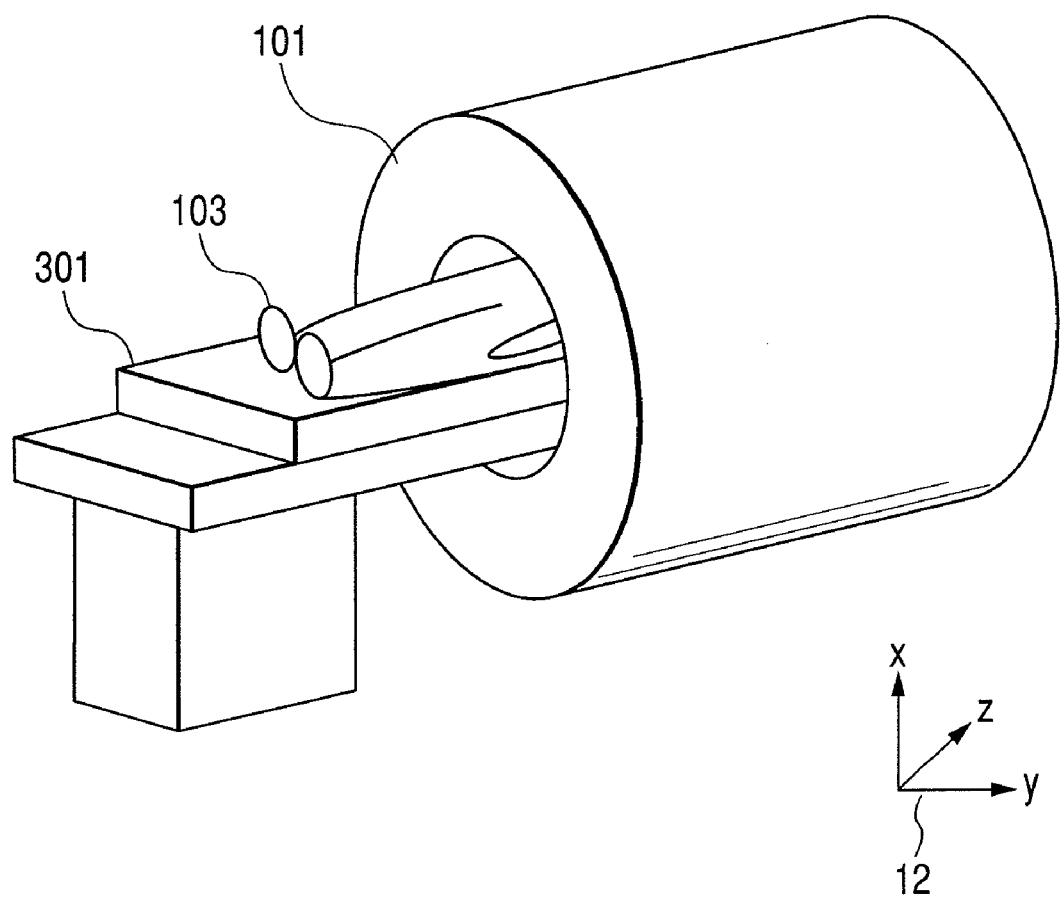
FIG. 1 is a schematic view of a magnetic resonance imaging apparatus.

First, the overall construction of the magnetic resonance imaging apparatus will be described. FIG. 1 is a schematic view of a magnetic resonance imaging apparatus. In the diagram, the z axis direction is the static magnetic field direction. FIG. 1 shows a magnetic resonance imaging apparatus including a horizontal magnetic field type magnet 101, a test subject 103 on the patient table 301 being inserted in an imaging space in a bore of the magnet 101 so that is imaged by applying a magnetic field.

First Embodiment

Figure 2:
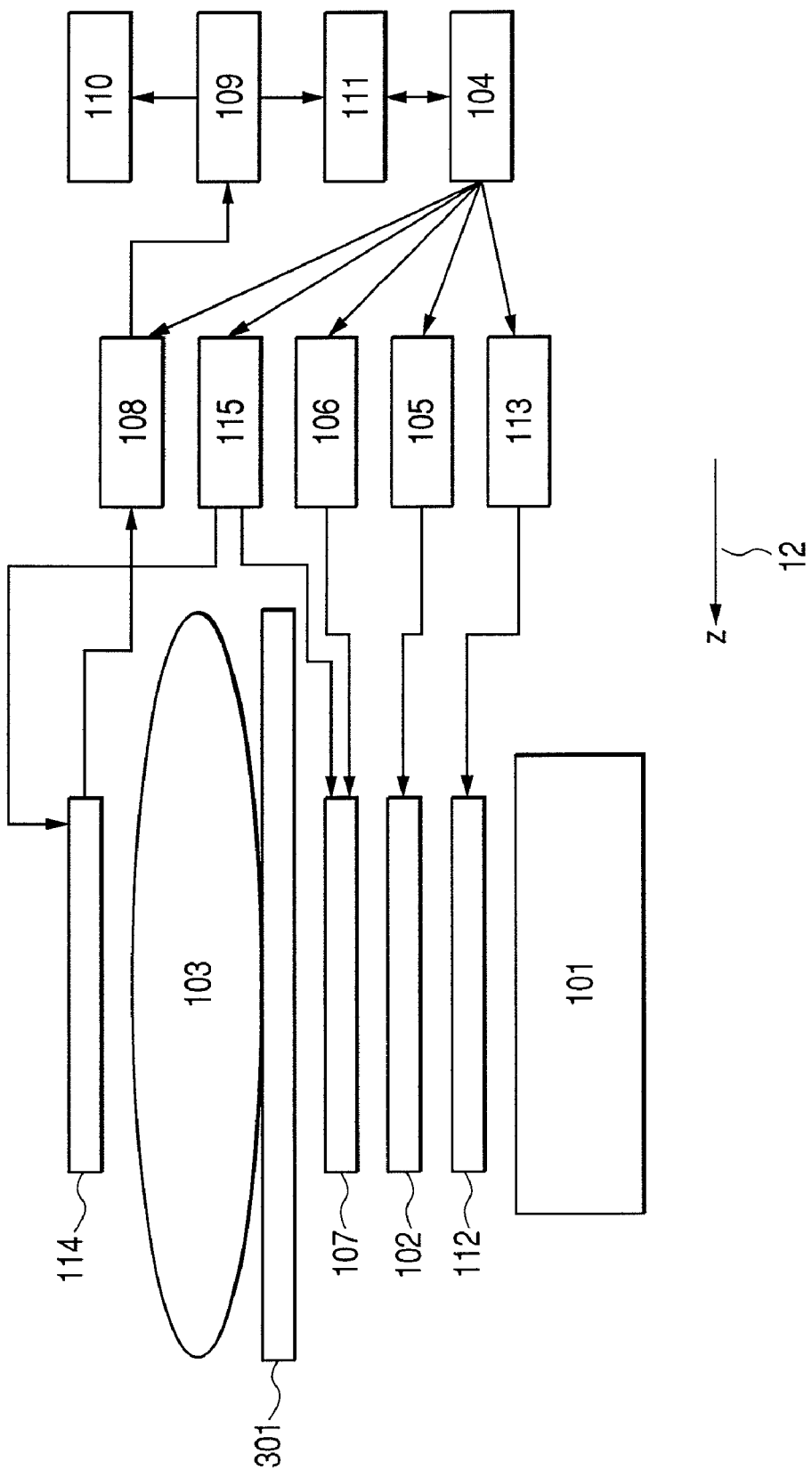
FIG. 2 is a block diagram showing the schematic construction of a magnetic resonance imaging apparatus according to a first embodiment.

A magnetic resonance imaging apparatus according to the first embodiment will now be described. FIG. 2 is a block diagram showing the main features of the construction. Identical elements to those in FIG. 1 are denoted by identical symbols. The magnetic resonance imaging apparatus shown in the diagram includes the magnet 101, a gradient coil 102, a shim coil 112 for adjusting the uniformity of the static magnetic field, a sequencer 104 which controls the field application sequence, a transmit RF coil 107 which generates a RF magnetic field, and a receive RF coil 114 which detects a magnetic resonance signal. The gradient coil 102 and shim coil 112 are connected to a gradient coil power supply 105 and shim coil power supply 113, respectively. The transmit RF coil 107 is connected to a RF magnetic field generator 106 and magnetic decoupling driver 115, and the receive RF coil 114 is connected to a receiver 108 and the magnetic decoupling driver 115. The transmit RF coil 107 and receive RF coil 114 are changed over by a magnetic decoupling signal from the magnetic decoupling driver 115. The sequencer 104 sends a command which relates to the magnetic field application sequence to the RF magnetic field generator 106, gradient coil power supply 105, magnetic decoupling driver 115, shim coil power supply 113 and receiver 108, and generates a gradient magnetic field and a RF magnetic field, respectively. The RF magnetic field is applied to the test subject 103 via the transmit RF coil 107. At this time, a magnetic decoupling signal is sent to the receive RF coil 114 from the magnetic decoupling driver 115 by a command sent from the sequencer 104, the receive RF coil 114 enters an open state, and prevents magnetic coupling with the transmit RF coil 107. The RF signal generated from the test subject 103 by applying a RF magnetic field is detected by the receive RF coil 114. At this time, a magnetic decoupling signal is sent to the transmit RF coil 107 from the magnetic decoupling driver 115 by a command sent from the sequencer 104, the transmit RF coil 107 enters an open state, and prevents magnetic coupling with the receive RF coil 114. The signal detected by the receive RF coil 114 is sent to the receiver 108, and detection is performed. The magnetic resonance frequency which is the reference for signal detection in the receiver 108, is set by the sequencer 104. The detected signal is sent to a computer 109 via an A/D conversion circuit, and signal processing such as image reconstruction is performed here. The result is displayed on a display 110. The signal which was detected and measurement conditions are saved on storage media 111 if needed. The sequencer 104 normally performs control so that the device functions with a preprogrammed timing and intensity.

The magnetic resonance imaging apparatus into this embodiment includes a circularly-polarized RF coil which can transceive a circularly-polarized magnetic field having a high Signal-To-Noise ratio and uniformity at one feeding port, for at least one of the transmit RF coil 107 and receive RF coil 114. Hereafter, one embodiment of the circularly-polarized RF coil used as the transmit RF coil 107 or receive RF coil 114, will be described.

Figure 3A:
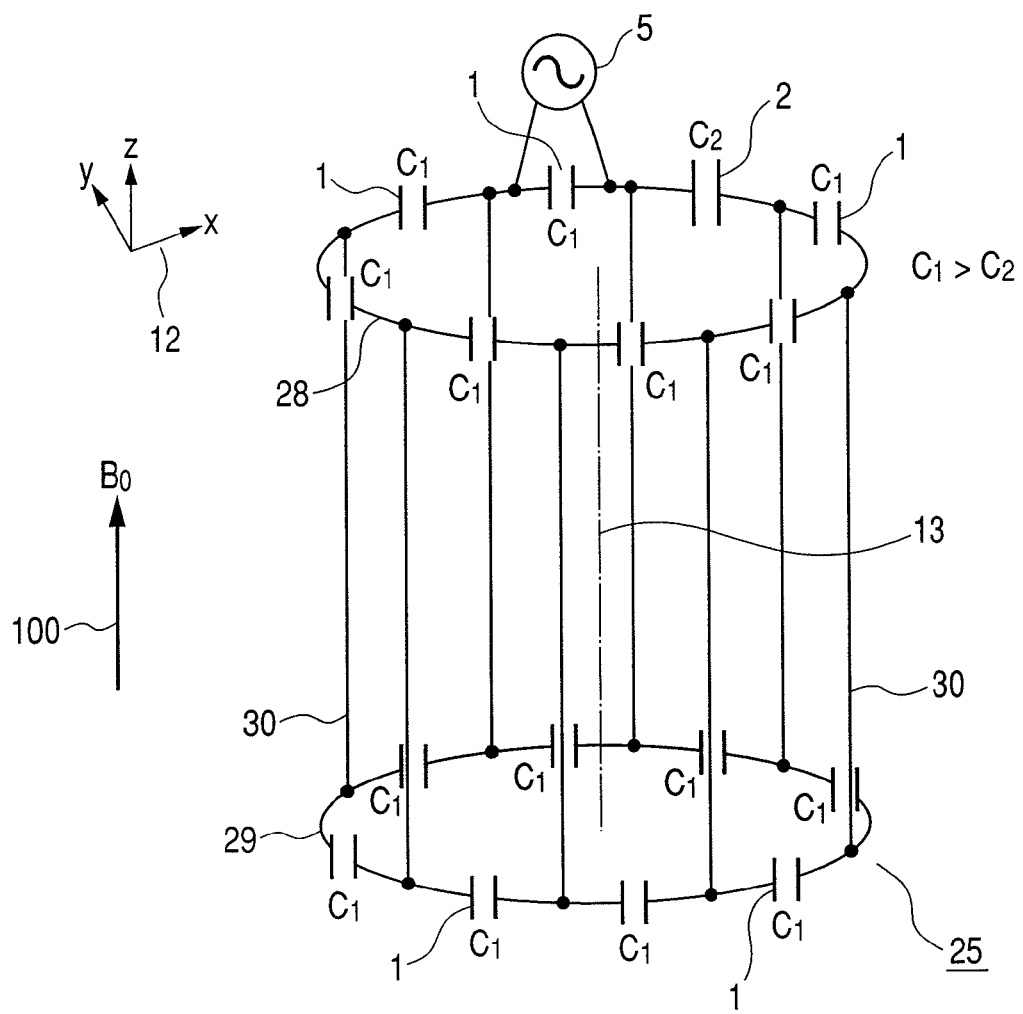
FIG. 3 is a schematic view of a birdcage-type circularly-polarized RF coil according to the first embodiment.
Figure 3B:
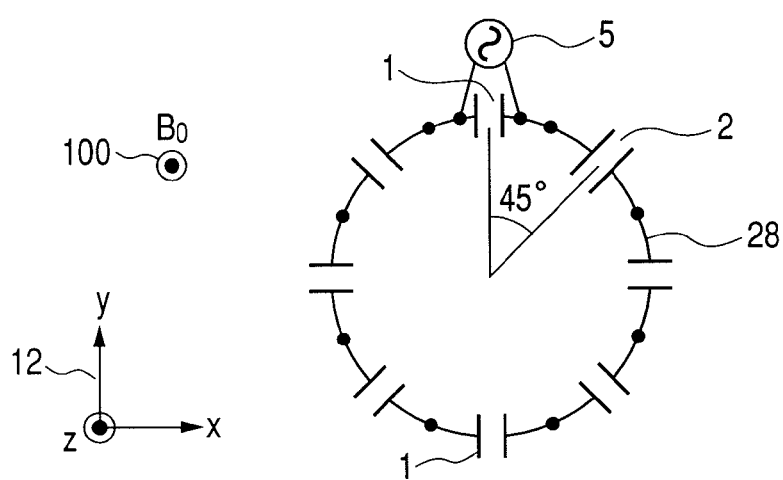
Figure 4:
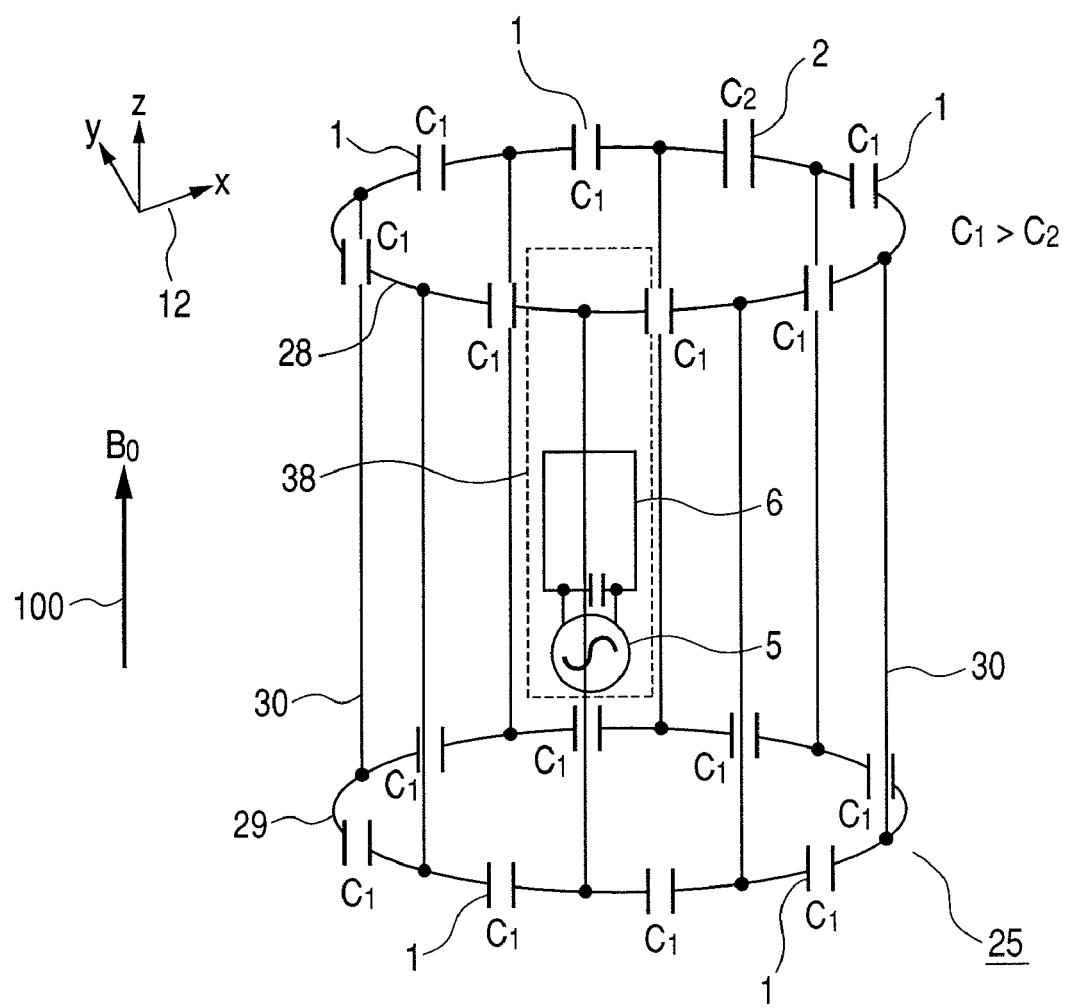
FIG. 4 is a schematic view of a modification of the birdcage-type circularly-polarized RF coil according to the first embodiment.

FIG. 3 shows the construction of a birdcage-type circularly-polarized RF coil 25 showing a first embodiment. In the birdcage-type circularly-polarized RF coil 25, as shown in FIG. 3A, two loop conductors 28, 29 are disposed facing each other so that the center axes of the loops are common, and substantially parallel to the z axis of the axes 12. Plural (in FIG. 3A, 8) linear conductors 30, which are substantially linear and which are substantially parallel to the z axis of the axes 12, are also connected. At this time, the plural linear conductors 30 are arranged at equidistant intervals. It is assumed that the z axis direction of the axes 12 and the orientation of the static magnetic field 100 generated by the magnet 101 of the magnetic resonance imaging apparatus, are identical. In other words, it is assumed that the central axis of the loops is essentially the same direction as the orientation of the static magnetic field generated by the magnet of the magnetic resonance imaging apparatus. Plural first capacitors 1 and a second capacitor 2 are disposed between the connection points between the plural linear conductors 30 and loop conductors 28, 29, and the feeding port 5 is connected in parallel to one of the first capacitors 1. The feeding port 5, as shown in FIG. 4, may be connected also to a pickup coil 6 disposed on a loop surface 38 formed by the first capacitors 1, two linear conductors 30 adjacent thereto and part of the loop conductors 28, 29. The second capacitor 2, as shown in FIG. 3B, is disposed in the loop at a position 450 in the clockwise direction with respect to the central axis of the birdcage-type circularly-polarized RF coil 25 from the feeding port 5 in a cross-section viewed from a direction passing through the static magnetic field 100.

In FIG. 3, the inductances of the loop conductors 28, 29 and the linear conductors 30 themselves are not shown. When used as the transmit coil 107 or receive coil 114, a circuit in which a PIN diode and inductor are connected in series, is connected in parallel to the capacitors of this coil, and a magnetic decoupling controlled by a magnetic decoupling signal is also added but not shown in the diagram.

Since this coil resonates at the magnetic resonance frequency of a given element, the values ($C_1$, $C_2$) of the first capacitor 1 and second capacitor 2 in the coil of this embodiment are adjusted to respectively suitable values. Hereafter, an example will be described where the resonance frequency $f_c$ of the RF coil is the magnetic resonance frequency $f_H$=64 MHz of the proton at a field strength of 1.5 Tesla. The value ($C_2$) of the second capacitor 2 is adjusted so that the value ($C_1$) of the first capacitor 1 and following expression are satisfied.

$$\frac{C_2}{C_1} = \left(\frac{Q_{RF}}{Q_{RF} + 150}\right)^{\frac{1}{8}} \qquad \text{(Equation 1)}$$

$Q_{RF}$ is the Q value at the resonance frequency $f_c$ of the birdcage-type circularly-polarized RF coil 25. The Q value depends on the coil resistance and inductor component, and RF losses due to the test subject inside the coil. $Q_{RF}$ can be obtained by adjusting the value of the first capacitor so that the birdcage RF coil, in which the second capacitor of the coil shown in FIG. 3A has been replaced by the first capacitor, resonates at the resonance frequency $f_c$, then positioning the test subject, and measuring the resonance properties of the coil. The electrical properties of the coil and test subject can also be modeled and found by an electromagnetic field simulation. Since the Q value is positive, $C_1 > C_2$.

The size of the birdcage-type circularly-polarized RF coil 25 shown in FIG. 3 may be for example 30 cm, length 30 cm, and the diameter of the conductors of the loop conductors 28, 29 and linear conductors 30 is 5 mm. If the Q value of the coil is 50 when the resonance frequency $f_c$=64 MHz, the values ($C_1$, $C_2$) of the first capacitor 1 and second capacitor 2 are 33 pF and 27.7 pF, respectively.

Next, an example will be described where the birdcage-type circularly-polarized RF coil 25 shown in FIG. 3, functions as a transmit coil.

A radiofrequency voltage having the resonance frequency $f_c$ transmitted from the RF magnetic field generator 106 as its center frequency, is applied to the birdcage-type circularly-polarized RF coil 25 via the feeding port 5. The birdcage-type circularly-polarized RF coil 25 is such that among the plural capacitors disposed in the loop conductors 28, 29, only the value of the second capacitor is less than that of the first capacitor.

Figure 5A:
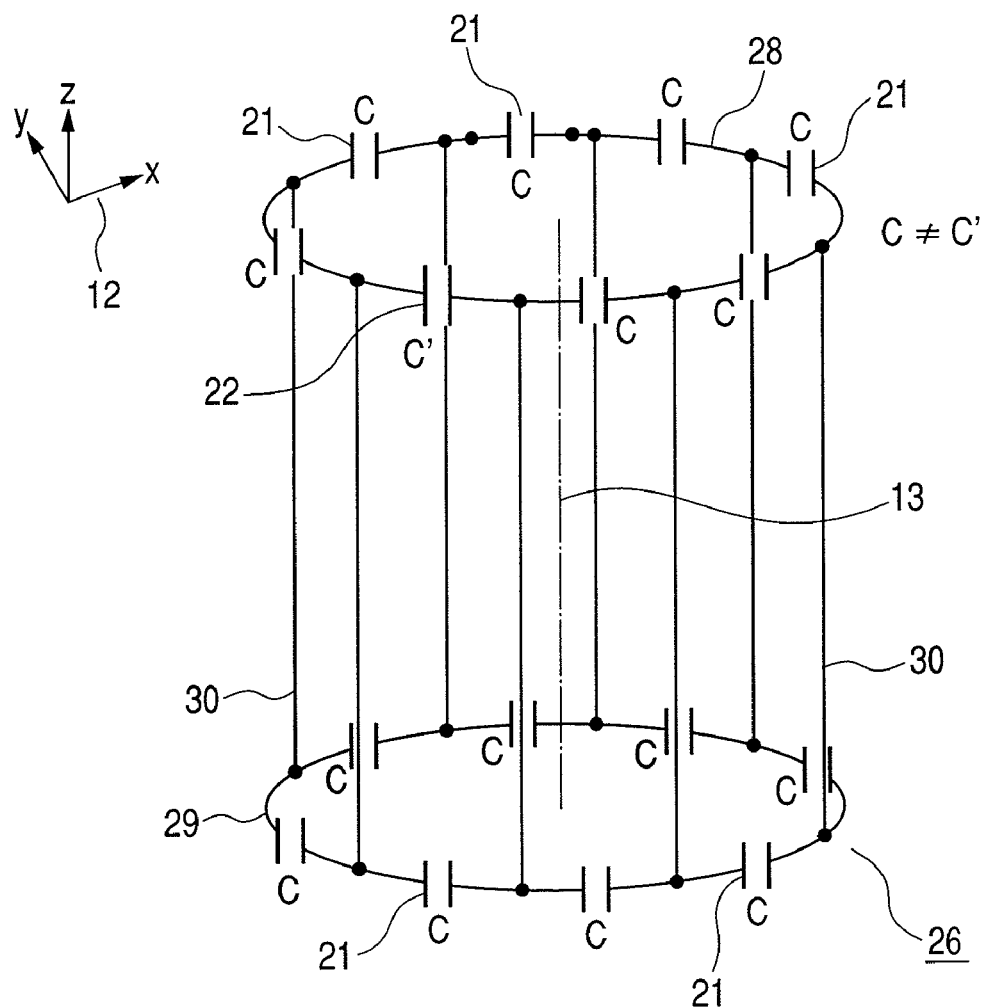
FIG. 5 is a schematic view of a birdcage RF coil in which the value of only one capacitor is different from that of the other capacitors.
Figure 5B:
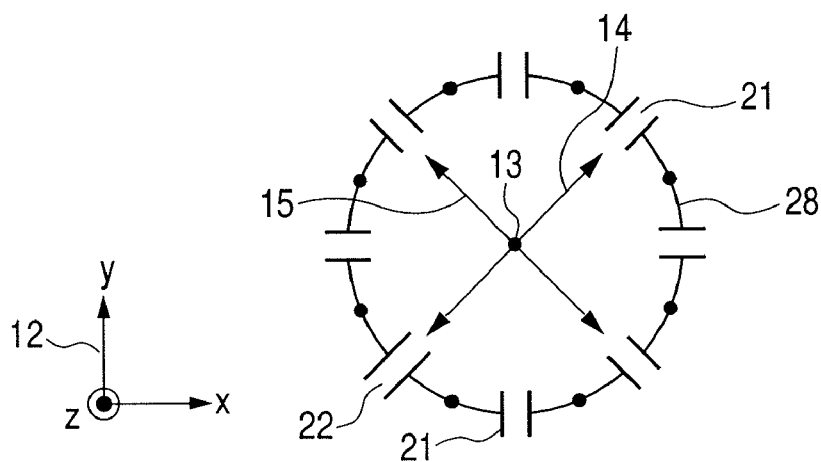

It is shown in the documents, James Tropp et al., "The Theory of the Bird-Cage Resonator," Journal of Magnetic Resonance, Vol. 82 and pp. 51-62 (1989), and Peter M. Joseph et al., "A Technique for Double Resonance Operation of Birdcage Imaging Coils," IEEE Transactions on Medical Imaging, 1989, 8, pp. 286-294 that in a birdcage RF coil 26, if the values of a capacitor 22 with nonsymmetrical value is different in only one position, then as shown in FIG. 5, in a birdcage RF coil 26, two linearly-polarized magnetic fields of different frequencies are generated in a first direction 14 parallel to a plane orthogonal to the central axis 13 of the coil joining the capacitor 22 with nonsymmetrical value to the central axis 13 of the coil, and a second direction 15 parallel to a plane orthogonal to the central axis 13 of the coil and orthogonal to the first direction. Also, it is shown that, if a value C' of the capacitor 22 with nonsymmetrical value is smaller than the value C of a capacitor 21, a first resonance frequency $f_1$ of a first linearly-polarized magnetic field generated in the first direction 14 is higher than a second resonance frequency $f_2$ of the second linearly-polarized magnetic field generated in the second direction 15, and the second resonance frequency $f_2$ is identical to the resonance frequency of the coil when the value of the capacitor 22 is the same as the value of the capacitor 21. Therefore, also in the birdcage-type circularly-polarized RF coil 25, two linearly-polarized magnetic fields of different frequency are generated as in the case of the birdcage RF coil 26 as shown in FIG. 5.

Here, it was newly discovered that by adjusting the spatial relationship between the feeding port 5 and the second capacitor 2, and the values of the first capacitor 1 and second capacitor 2, a circularly-polarized magnetic field is generated by the birdcage-type circularly-polarized RF coil 25. This operation will now be described.

Figure 6A:
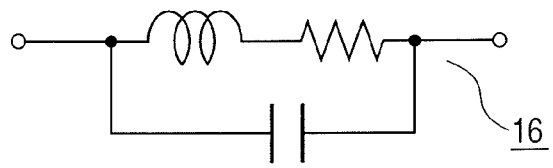
FIG. 6 is a diagram showing frequency characteristics of plural impedances in a parallel resonance circuit having a resistance.
Figure 6B:
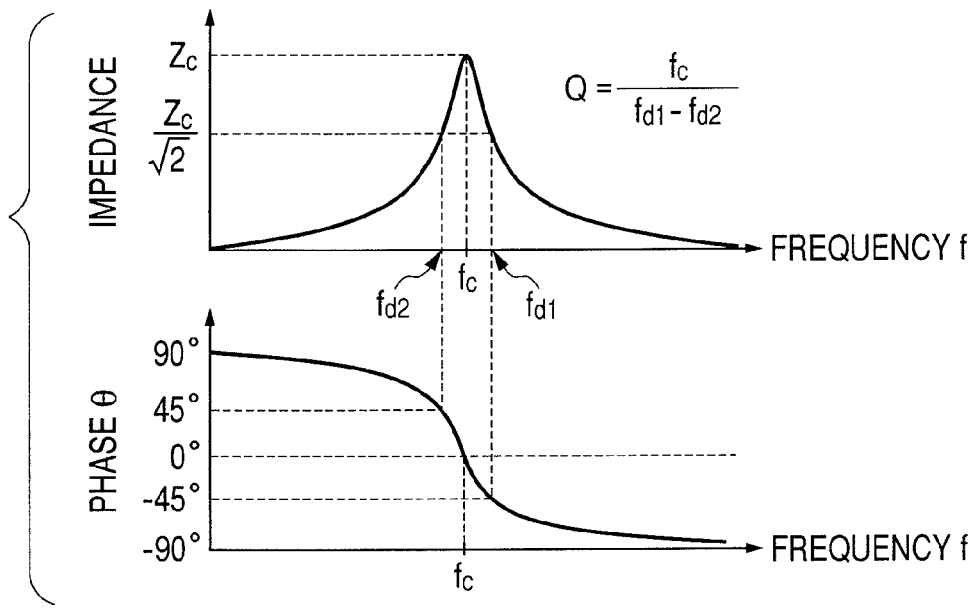
Figure 6C:
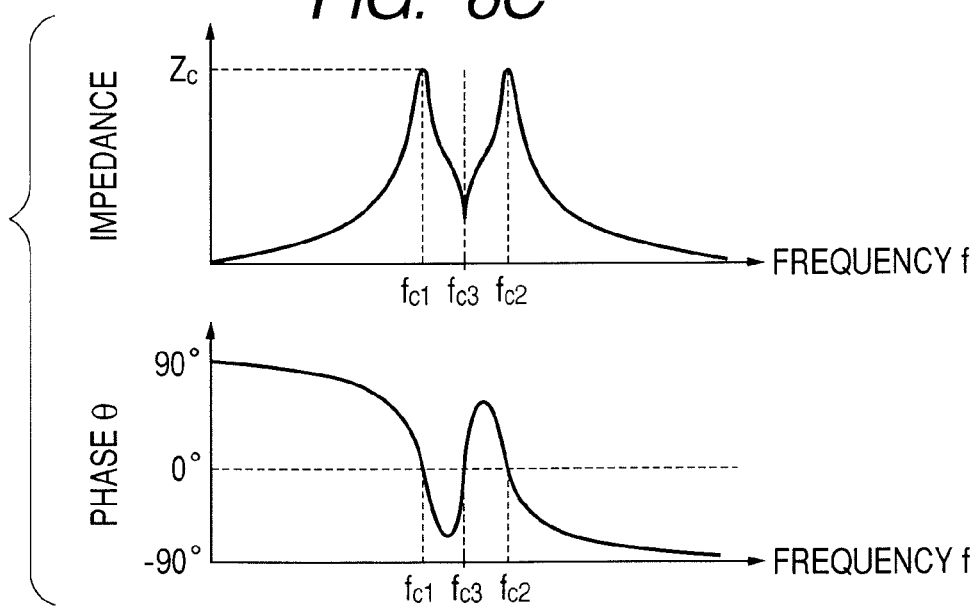
Figure 7A:
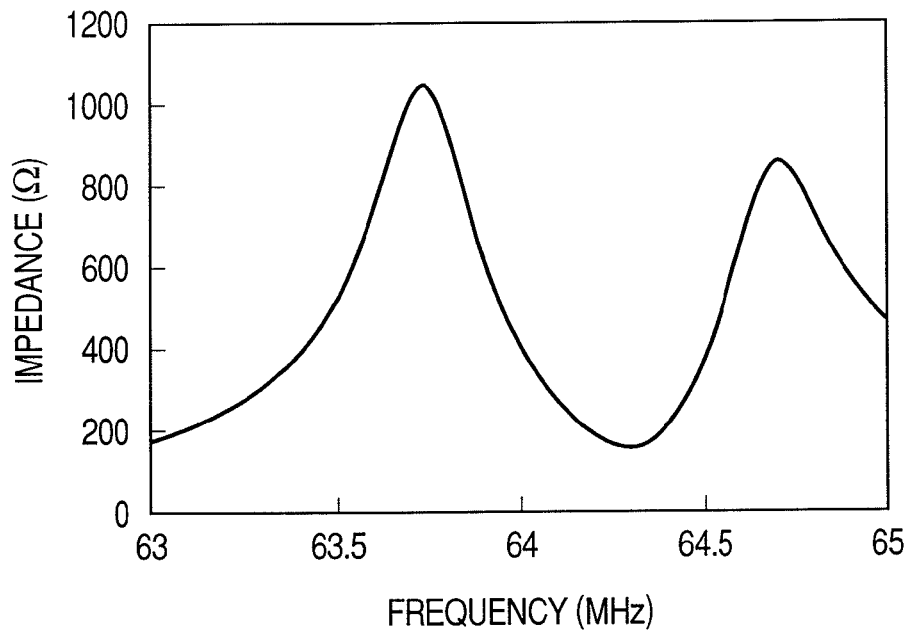
FIG. 7 is a diagram showing the frequency characteristics of the impedance and phase of a birdcage-type circularly-polarized RF coil 25.
Figure 7B:
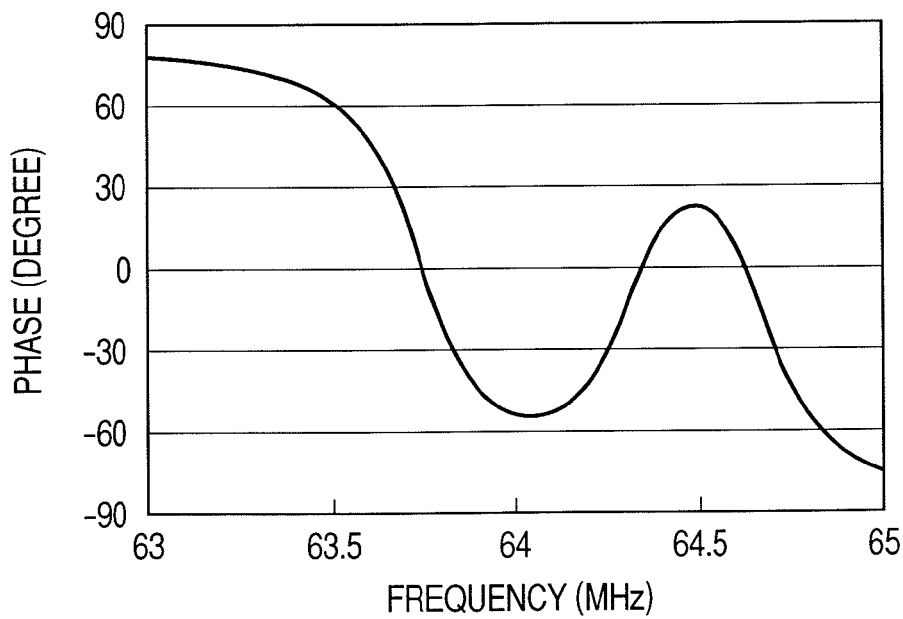

Taking a parallel resonance circuit 16 having a resistance shown in FIG. 6A as an example of a complex impedance of a resonance coil, as shown in FIG. 6B, the phase of the complex impedance shows a positive angle at a lower frequency than the resonance frequency $f_c$, and a negative angle at a higher frequency than the resonance frequency $f_c$. In the case of a resonance circuit with two resonance frequencies as shown in FIG. 6C, the phases mutually cancel each other out and a third resonance having a phase of 0° is newly generated between two resonance frequencies $f_{c1}$, $f_{c2}$. Let the resonance frequency at this time be a third resonance frequency $f_3$. FIG. 7 shows impedance and phase frequency characteristics of the birdcage-type circularly-polarized RF coil 25 when, in the case where the diameter is 30 cm, length is 30 cm and diameter of the loop conductors 28, 29 and linear conductors 30 is 5 mm, and the Q value is 50 at a resonance frequency $f_c$=64 MHz, the values ($C_1$, $C_2$) of the first capacitor 1 and second capacitor 2 are respectively 33.5 pF and 27 pF. The frequency characteristic of the phase shown in FIG. 7B has the same trend as the frequency characteristic of the phase shown in FIG. 6B, and also in the birdcage-type circularly-polarized RF coil 25, a third resonance frequency $f_3$ is generated between the first resonance frequency $f_1$ and second resonance frequency $f_2$.

Since the third resonance frequency $f_3$ lies between the first resonance frequency $f_1$ and second resonance frequency $f_2$, and the Radiofrequency voltage applied from the feeding port 5 is converted into a current to produce a magnetic field, the RF magnetic field generated by the coil at the third resonance frequency $f_3$ is superimposed on the first linearly-polarized magnetic field retarded by a phase $\theta_1$, and the second linearly-polarized magnetic field advanced by a phase $\theta_2$.

Figure 8A:
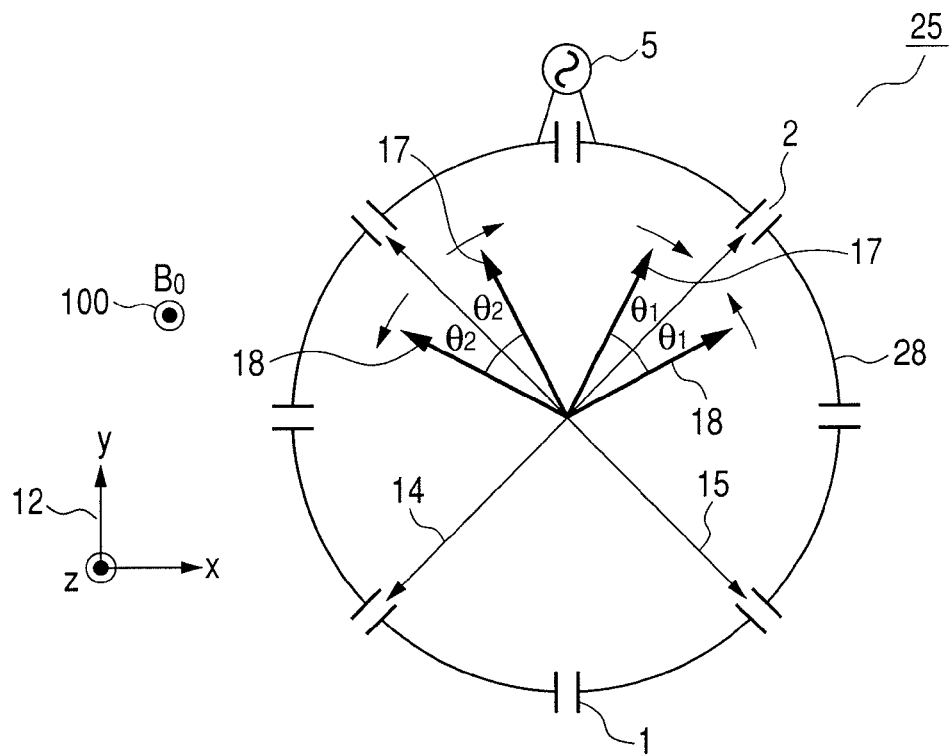
FIG. 8 is a vector diagram of a circularly-polarized magnetic field generated by the birdcage-type circularly-polarized RF coil shown in the first embodiment, and a diagram showing phase characteristics of intensity.

Since the linearly-polarized magnetic field has the same strength, and can be considered as a combination of two circularly-polarized magnetic fields in the clockwise and counterclockwise directions with respect to the central axis 13 of the coil, the first linearly-polarized magnetic field whereof the phase is retarded by $\theta_1$ and second linearly-polarized magnetic field whereof the phase is advanced by $\theta_2$ can be represented as shown in FIG. 8A using vectors in a plane orthogonal to the central axis 13 of the coil. If the amplitude of the first linearly-polarized magnetic field is $B_1$, and the amplitude of the second linearly-polarized magnetic field is $B_2$, a magnitude $B_{cw}$ of the circularly-polarized magnetic field vector in the clockwise direction and a magnitude $B_{ccw}$ of the vector of circularly-polarized magnetic field in the counterclockwise direction may be expressed by the following equations:

$$B_{cw} = \left| \frac{B_1 \sin\theta_1 + B_2 \sin\theta_2}{\sqrt{2}} \right| \quad \text{(Equation 2)}$$

$$B_{ccw} = \left| \frac{B_1 \sin\theta_1 - B_2 \sin\theta_2}{\sqrt{2}} \right| \quad \text{(Equation 3)}$$

Figure 8B:
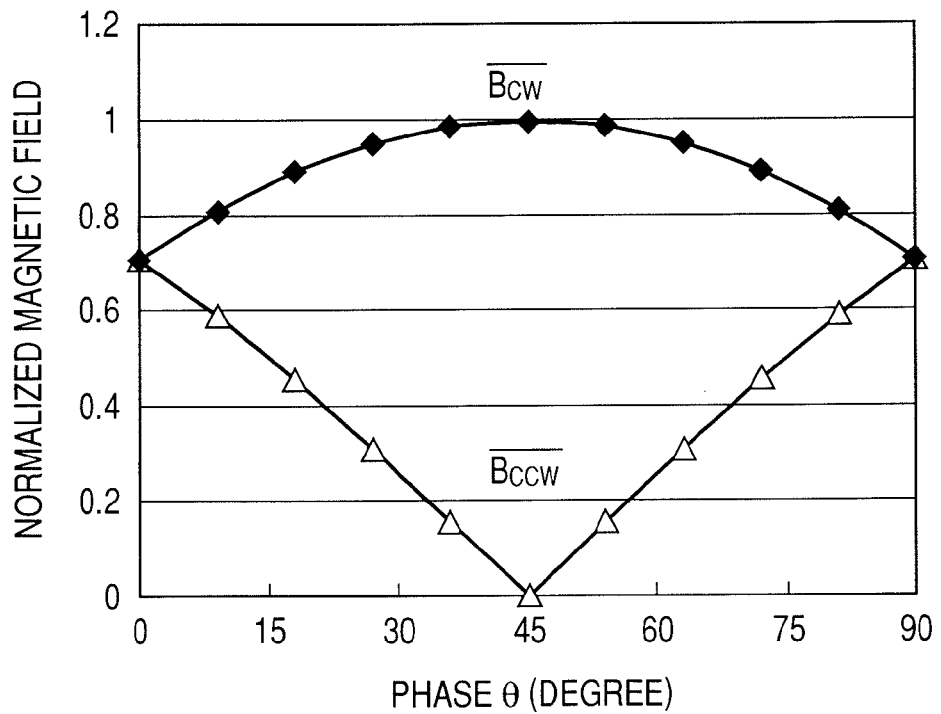

FIG. 8B shows the relation between the circularly-polarized magnetic field vector $B_{cw}$ in the clockwise direction, the circularly-polarized magnetic field vector $B_{ccw}$ in the counterclockwise direction and the phase 9 when normalization is performed by $B_1 = B_2$ and $\theta = \theta_1 = \theta_2$. It is clear that when the phase $\theta = 45°$, there is only the circularly-polarized magnetic field in the clockwise direction, and the birdcage-type circularly-polarized RF coil 25 generates a circularly-polarized magnetic field as in the case where a circularly-polarized magnetic field is generated by a birdcage RF coil using the QD method. Therefore, by disposing the feeder point 5 and second capacitor 2 with the spatial relationship shown in FIG. 3, and adjusting the values of the first capacitor 1 and second capacitor 2 so that the phase $\theta = 45°$ at the resonance frequency $f_c$, the birdcage-type circularly-polarized RF coil 25 can generate a clockwise circularly-polarized magnetic field most efficiently.

Figure 9A:
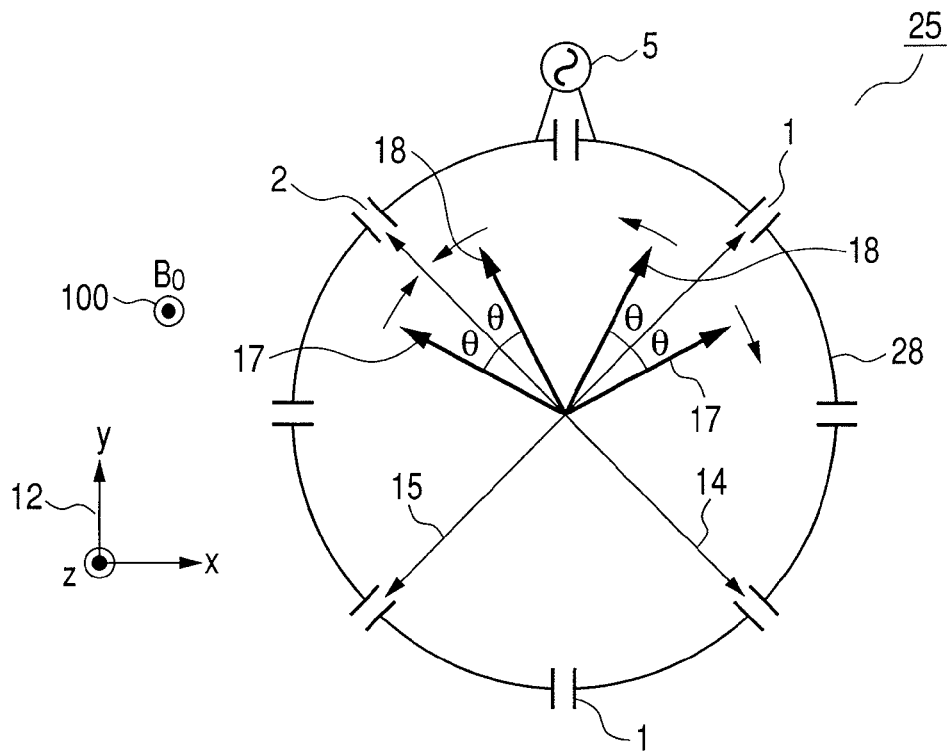
FIG. 9 is a vector diagram of a circularly-polarized magnetic field generated by a birdcage-type circularly-polarized RF coil which does not satisfy the spatial relationship between the feeding port and second capacitor shown in the first embodiment, and a diagram showing phase characteristics of intensity.
Figure 9B:
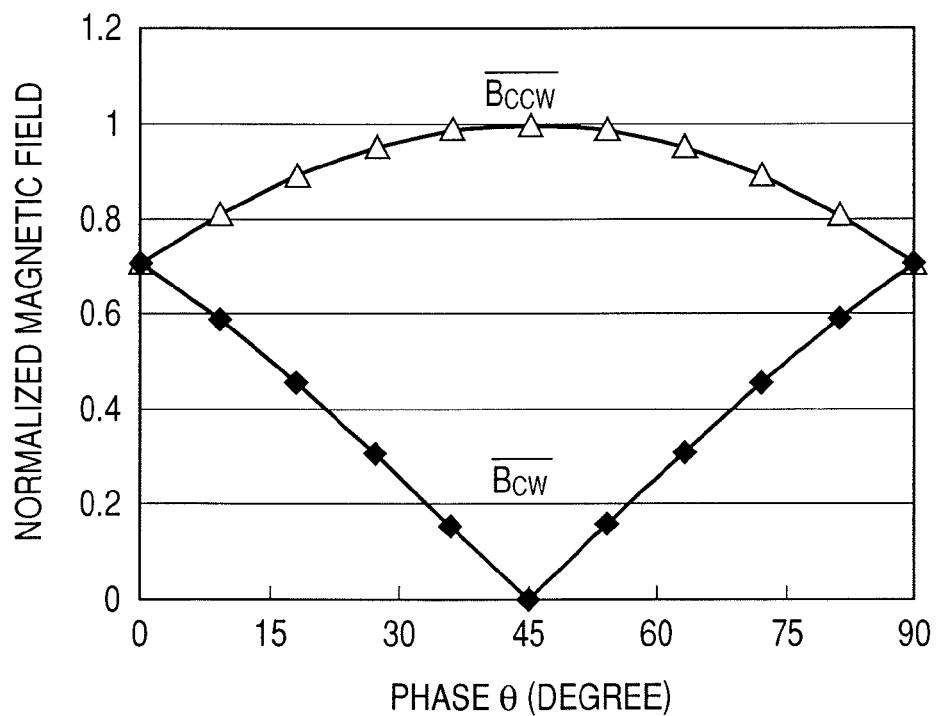

When the second capacitor is disposed at an angle of 45° in the counterclockwise direction with respect to the feeding port 5, as shown in FIG. 9, when the phase $\theta = 45°$, a circularly-polarized magnetic field is generated in the counterclockwise direction. Since the nuclear magnetization due to magnetic resonance rotates in the clockwise direction viewed from the direction passing through the static magnetic field 100, nuclear magnetization is not excited even if a RF magnetic field which rotates in the counterclockwise direction is applied, and a magnetic resonance signal is not detected. Therefore, in the arrangement as shown in FIG. 9A, the coil cannot function as a transmit coil of a magnetic resonance imaging apparatus.

As shown in FIG. 8B, when the phase $\theta = 45°$, a circularly-polarized magnetic field can be generated most efficiently. Since, ideally, the Q value of the resonance circuit can be expressed as a ratio of the difference between two frequencies at which the phase is ±45° and the resonance frequency of the resonance circuit, the Q value of the resonance circuit is an important parameter which determines the value of the first capacitor 1 and second capacitor 2 satisfying $\theta = 45°$.

Figure 10A:
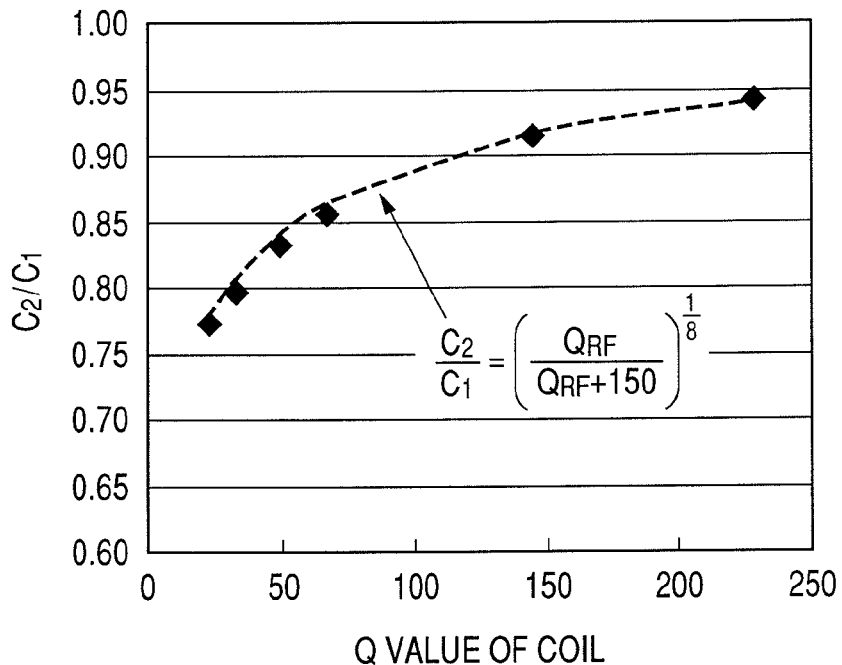
FIG. 10 is a diagram showing the relation between a ratio ($C_2/C_1$) of the first capacitor and second capacitor and the Q value of the coil found by an electromagnetic field simulation.

At the resonance frequency $f_c$=64 MHz, the values ($C_1$, $C_2$) of the first capacitor 1 and second capacitor 2 were found by an electromagnetic field simulation when the birdcage-type circularly-polarized RF coil 25 generates a circularly-polarized magnetic field in a clockwise direction most efficiently, while varying the Q value $Q_{RF}$ of the coil. FIG. 10A shows the relation between the ratio ($C_2/C_1$) of the values of the first capacitor 1 and second capacitor 2 and the Q value $Q_{RF}$ of the coil. The ratio ($C_2/C_1$) of the values of the first capacitor 1 and second capacitor 2 tends to increase, asymptotically approaching $C_2/C_1$=1 as the Q value $Q_{RF}$ becomes large. Then, when fitting was performed using a function which takes $Q_{RF}$ as a variable which satisfies $C_2/C_1$=0 when $Q_{RF}$->0 and $C_2/C_1$=1 when $Q_{RF}$->∞, the relation expressed by equation (1) shows the closest value to the value found by simulation. Also for the capacitor value found from an electromagnetic field simulation when the resonance frequency $f_c$=128 MHz, as a result of applying equation (1), good agreement was found as in the case of the resonance frequency $f_c$=64 MHz. Therefore, by using equation (1), the ratio of the values of the first capacitor 1 and second capacitor 2 can be found at which the birdcage-type circularly-polarized RF coil 25, in which the value of the second capacitor 2 is less than the value of the first capacitor 1, generates a circularly-polarized magnetic field most efficiently.

Figure 10B:
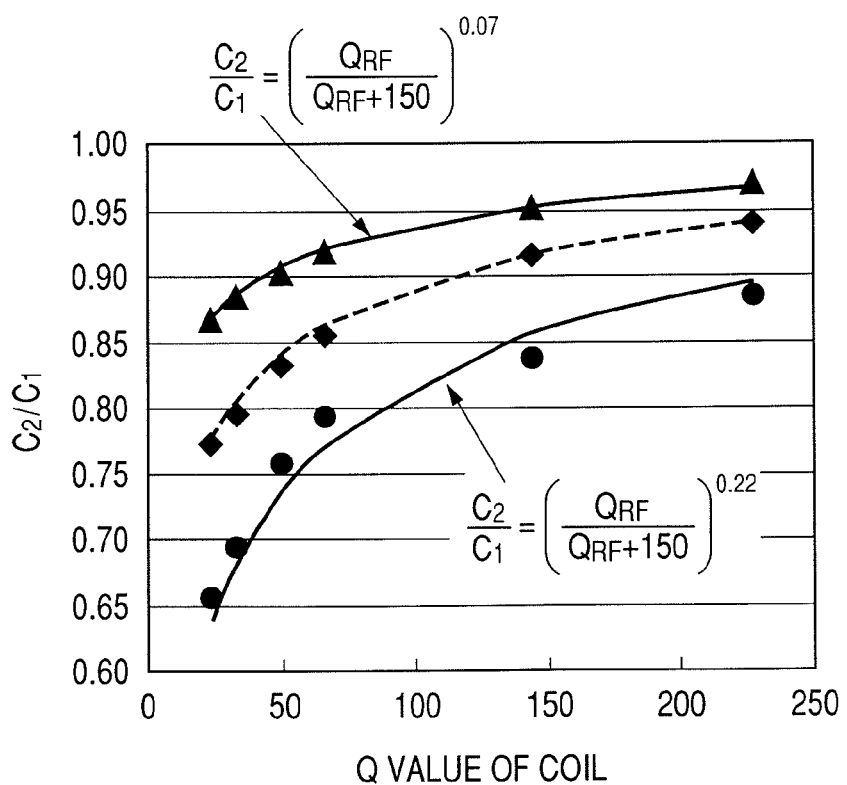

When the values ($C_1$, $C_2$) of the first capacitor 1 and second capacitor 2 for which the strength of the circularly-polarized magnetic field generated by the birdcage-type circularly-polarized RF coil 25 was 95% or more of the maximum value, were found from an electromagnetic field simulation, it was found that, as shown in FIG. 10B, the values ($C_1$, $C_2$) of the first capacitor 1 and second capacitor 2 should satisfy the following equation.

$$\left(\frac{Q_{RF}}{Q_{RF}+150}\right)^{0.22} \le \frac{C_2}{C_1} \le \left(\frac{Q_{RF}}{Q_{RF}+150}\right)^{0.07} \quad \text{(Equation 4)}$$

From the above, by disposing the second capacitor 2 at an angle of 45° in the clockwise direction with respect to the feeding port 5, selecting the values ($C_1$, $C_2$) of the first capacitor 1 and second capacitor 2 so that their ratio ($C_2/C_1$) satisfies equation (4), and adjusting the value $C_1$ of the first capacitor 1 to resonate at the resonance frequency $f_c$, the birdcage-type circularly-polarized RF coil 25 in this embodiment generates a circularly-polarized magnetic field efficiently, and by preferably selecting the values ($C_1$, $C_2$) of the first capacitor 1 and second capacitor 2 to satisfy equation (1), it generates a circularly-polarized magnetic field most efficiently.

As mentioned above, according to this embodiment, a circularly-polarized magnetic field can be generated with only one feeding port, as in the case where a circularly-polarized magnetic field is generated in a birdcage RF coil using the QD method. Therefore, since there is one less feeding port compared to the QD method, the divider and phase shifter which were required in the prior art for a transmit coil using the QD method are now not required, and the number of parts in the transmit system can be reduced to less than half. For this reason, manufacturing costs can be lowered while adjustment of the transmit system is easier. Further, since there is only one feeding port to the coil and a divider and phase shifter are not used, decrease in orthogonality due to mechanical distortion of the coil, and decrease of Signal-To-Noise ratio of the coil due to phase shift resulting from the divider and phase shifter, can be suppressed, while transmit efficiency and sensitivity of the RF coil are enhanced in comparison to the prior art.

Figure 11A:
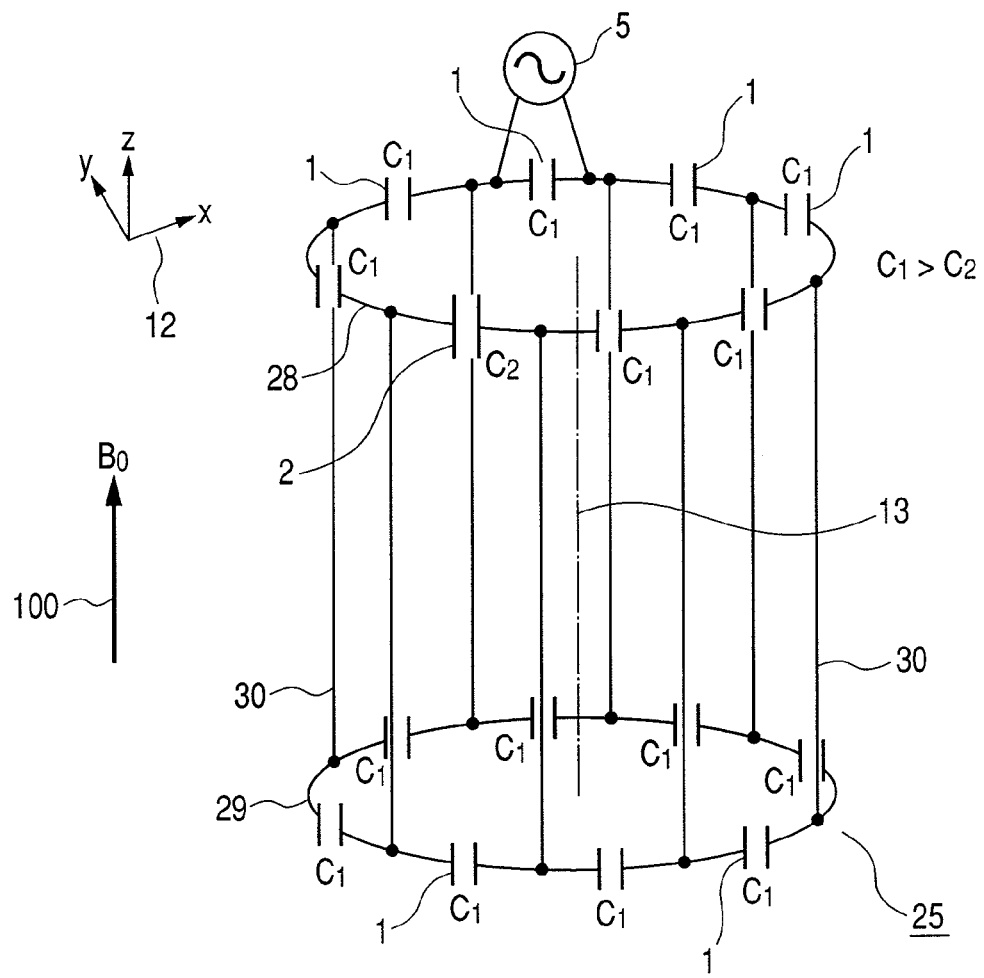
FIG. 11 is a diagram showing a modification of the birdcage-type circularly-polarized RF coil according to the first embodiment.
Figure 11B:
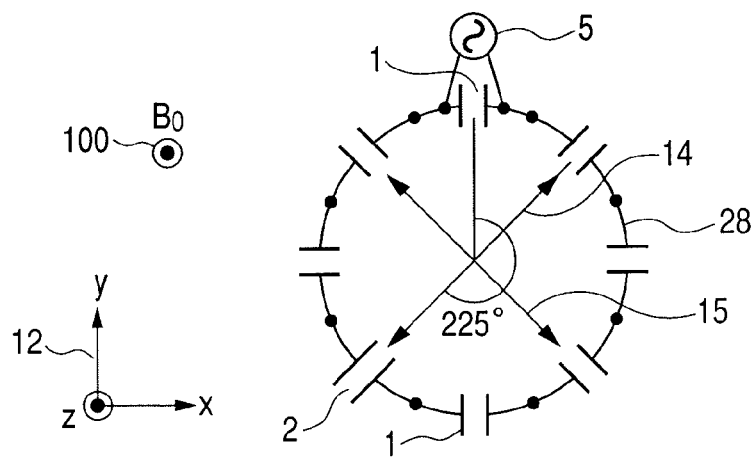

In this embodiment, the case was described where the second capacitor 2 was disposed at an angle of 45° in a clockwise direction with respect to the feeding port 5, but in addition to this embodiment, as shown in FIG. 11, if the value of the second capacitor 2 is less than the value of the first capacitor 1 and it is disposed at an angle of 225° in the clockwise direction with respect to the feeding port 5, then as shown in FIG. 11B, two linearly-polarized magnetic fields of different frequencies are generated in the first direction 14 parallel to a plane orthogonal to the central axis 13 of the coil joining the second capacitor 2 to the central axis of the coil, and the second direction 15 parallel to a plane orthogonal to the central axis 13 of the coil and orthogonal to the first direction 14, and the first resonance frequency $f_1$ of the first linearly-polarized magnetic field generated in the first direction 14 is higher than the second resonance frequency $f_2$ of the second linearly-polarized magnetic field generated in the second direction 15. The spatial relationship of the linearly-polarized magnetic field shown in FIG. 11B is the same as that of FIG. 8A, and a circularly-polarized magnetic field can be generated as in this embodiment.

Figure 12:
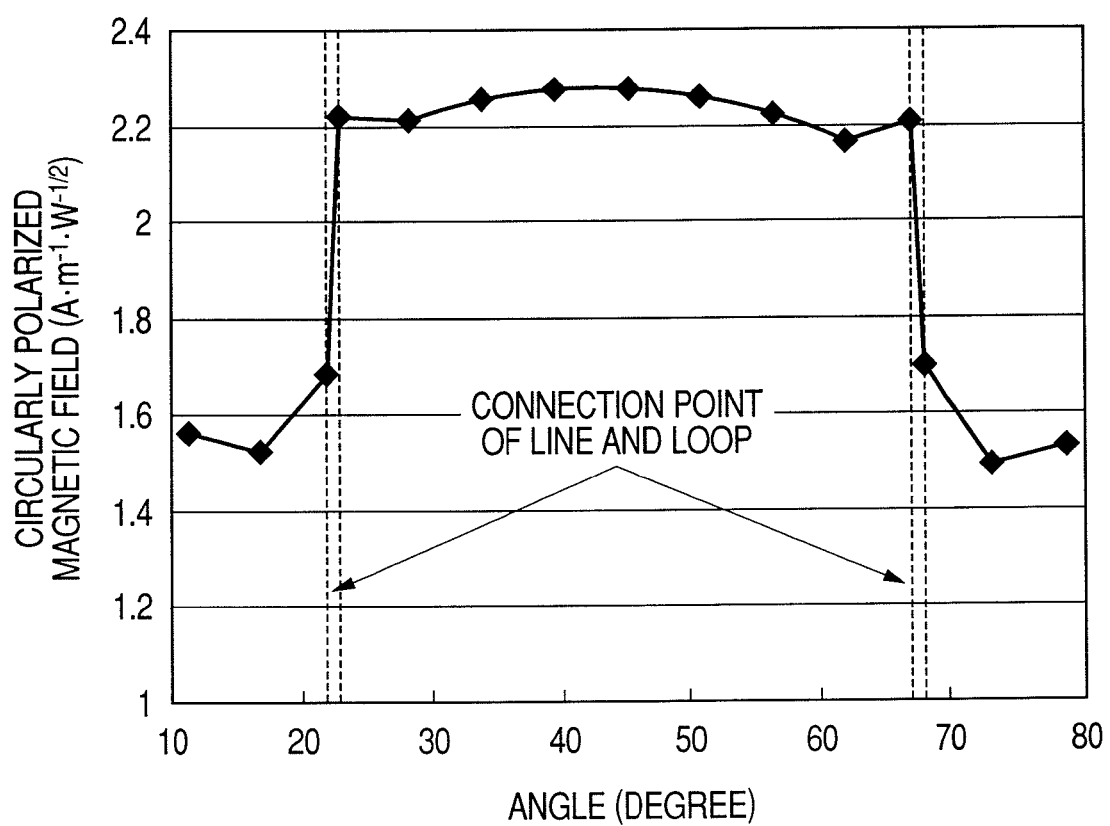
FIG. 12 is a diagram showing the relation between the angle between the feeding port and second capacitor, and the circularly-polarized magnetic field strength emitted by the coil, in the birdcage-type circularly-polarized RF coil according to the first embodiment.

As for the position of the second capacitor 2 in this embodiment, it can be moved along the loop conductor 28. Hence, in the birdcage-type circularly-polarized RF coil 25 shown in FIG. 3, the position of the second capacitor 2 was changed and the strength of the circularly-polarized magnetic field generated by the coil was found by an electromagnetic field simulation. As a result, as shown in FIG. 12, within the region between the loop conductor 28 and the linear conductor 30 including the 45° position, i.e., in a position 22.5° to 67.5° in the clockwise direction with respect to the central axis of the birdcage-type circularly-polarized RF coil 25 from the feeding port 5 in a cross-section viewed from a direction passing through the static magnetic field 100, it shows a value which is 95% or more of the circularly-polarized magnetic field strength at 45°. Also, within the region between the loop conductor 28 and the linear conductor 30 including the 225° position, i.e., in a position 202.5° to 247.5° in the clockwise direction with respect to the central axis of the birdcage-type circularly-polarized RF coil 25 from the feeding port 5 in a cross-section viewed from a direction passing through the static magnetic field 100, it shows a value which is 95% or more of the circularly-polarized magnetic field strength at 45°. Therefore, the position of the second capacitor 2 in this embodiment is preferably such that it makes an angle of 22.5° to 67.5° or 202.5° to 247.5° in the clockwise direction with respect to the feeding port 5, more preferably about 45° in the clockwise direction with respect to the feeding port 5, and most preferably about 225° in the clockwise direction with respect to the feeding port 5. Here, "about" means the tolerance in the angle due to coil manufacturing errors.

In this embodiment, although the number of linear conductors 30 is 8, the spatial relationship of the feeding port 5 and second capacitor 2 can be extended to 8 or more linear conductors 30. If the birdcage-type circularly-polarized RF coil 25 shown in FIG. 3 is represented by a lumped element circuit formed by an inductor and capacitor, the part between the loop conductor 28 and linear conductor 30 including the second capacitor 2 can be represented by a serial circuit of the capacitor and inductor. If the spatial relationship between the capacitor and the inductor in the serial circuit is changed, electrical properties of the serial circuit do not change, so provided the position of the second capacitor 2 lies between the connection points of the loop conductor 28 and linear conductors 30, there is no major impact on coil properties even if the position of the second capacitor 2 is changed. Therefore, in a birdcage-type circularly-polarized RF coil 25 which has N linear conductors 30, provided that the position of the second capacitor 2 lies between the loop conductor 28 and linear conductor 30 including the 45° position in the clockwise direction with respect to the feeding port 5, a circularly-polarized magnetic field can be generated in the same way as for the birdcage-type circularly-polarized RF coil 25 shown in FIG. 3. This is the same even when the position of the second capacitor 2 is 225° in the clockwise direction with respect to the feeding port 5.

Further, it is preferably disposed so that it makes an angle of about 45° in the clockwise direction or about 225° in the clockwise direction with respect to the feeding port 5. Here, "about" means the tolerance in the angle due to coil manufacturing errors.

Figure 13A:
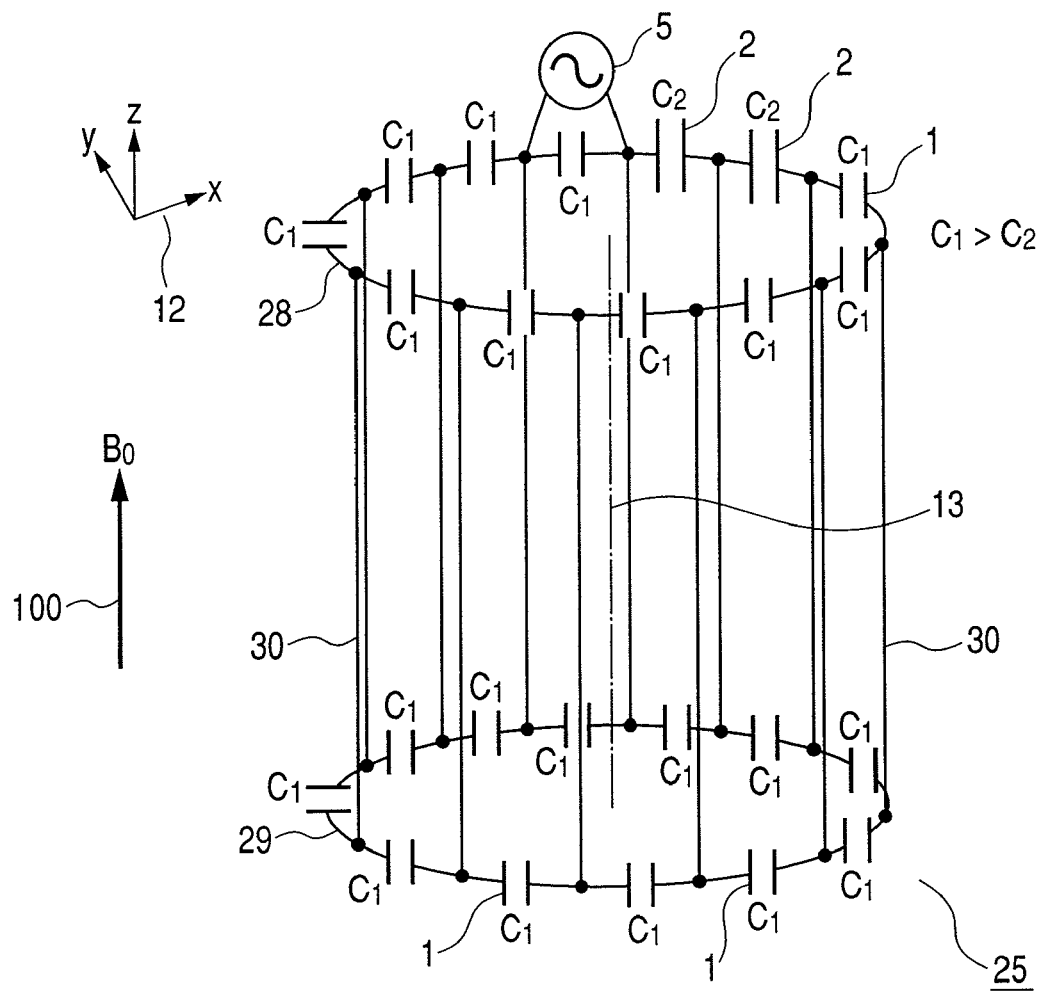
FIG. 13 is a diagram showing a modification of the birdcage-type circularly-polarized RF coil shown in FIG. 3.
Figure 13B:
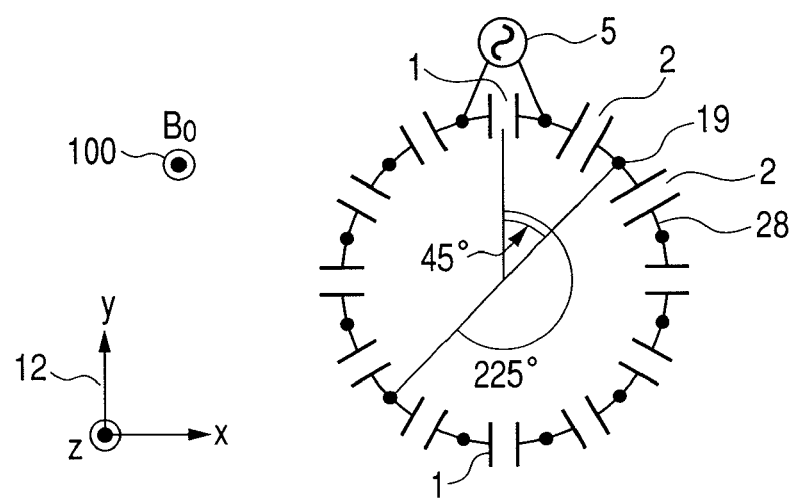

FIG. 13 shows a modification of the birdcage-type circularly-polarized RF coil 25 shown in FIG. 3. This RF coil differs from the embodiment of FIG. 3 in that there are 12 linear conductors 30, 22 first capacitors 1 and 2 second capacitors 2.

Since, when there are 12 of the linear conductors 30, there is a connection point 19 between the linear conductors 30 and loop 28 at the 45° or 225° angle position in the clockwise direction with respect to the feeding port 5, the second capacitor 2 cannot be placed there. However, by disposing two second capacitors 2 on the conducting loop 28 on both sides of the connection point 19, and adjusting the capacity of the second capacitor 2, a circularly-polarized magnetic field can effectively be generated in the same way as when the second capacitor 2 was disposed at an angle of 45° or 225° with respect to the feeding port 5. Here, the second capacitors are positioned at an angle of 45° or 225° in the clockwise direction with respect to the central axis of the birdcage-type circularly-polarized RF coil 25 in a cross-section viewed from a direction passing through the static magnetic field 100, and are disposed so as to enclose the connection point 19 between the loop 28 and linear conductors 30.

Therefore, even in the case where there is a multiple of 12 of the linear conductors 30 of the birdcage-type circularly-polarized RF coil 25, the circularly-polarized magnetic field can be generated efficiently by disposing plural second capacitors 2.

Figure 14A:
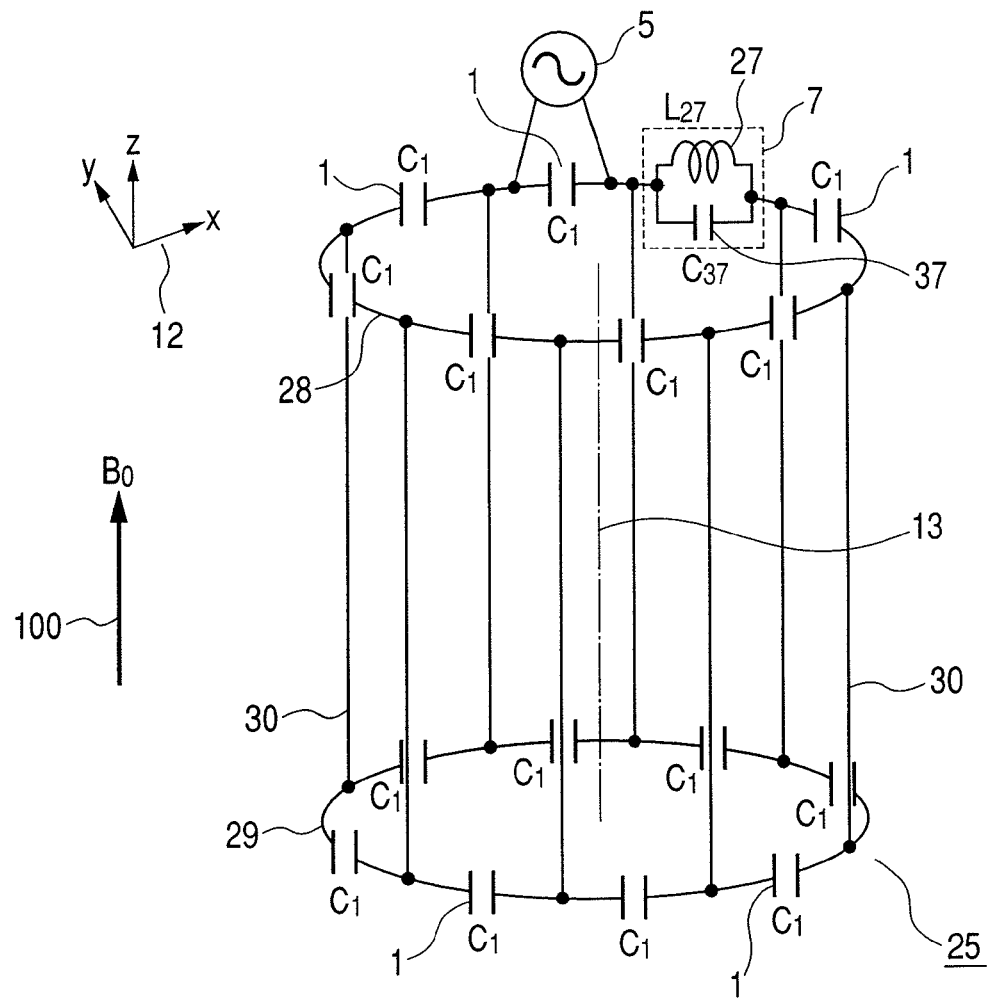
FIG. 14 is a diagram showing another modification of the birdcage-type circularly-polarized RF coil shown in FIG. 3.
Figure 14B:
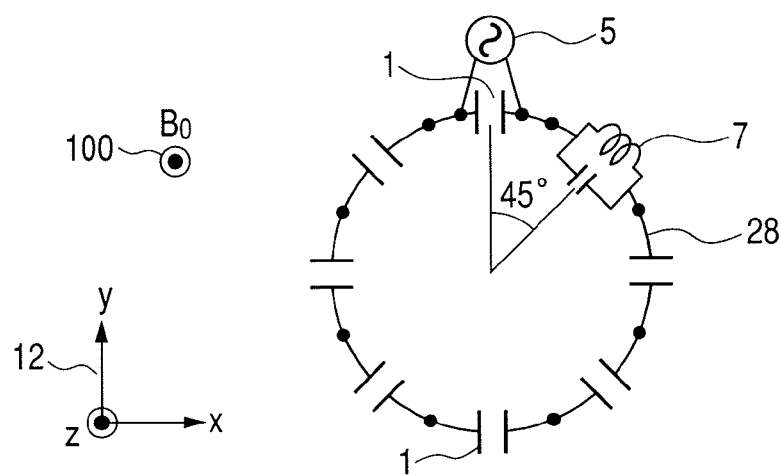

FIG. 14 shows a modification of the birdcage-type circularly-polarized RF coil 25 shown in FIG. 3. This RF coil differs from the embodiment of FIG. 3 in that a parallel circuit 7 in which an inductor 27 and capacitor 37 are connected in parallel, is disposed at the position of the second capacitor 2.

The impedance $Z_7$ of the parallel circuit 7 is given by the following equation.

$$Z_7 = \frac{j\omega L_{27}}{1 - \omega^2 L_{27} C_{37}} \quad \text{(Equation 5)}$$

$\omega$ is the angular frequency. At this time, if the value $L_{27}$ of the inductor 27 is adjusted so that $C_{37}=C_1$, $1-\omega^2 L_{27} C_{37}<0$ at the resonance frequency $f_c$, the impedance $Z_7$ of the parallel circuit 7 is given by the following equation, and the parallel circuit 7 functions as a capacitor having a value C' less than the value $C_1$ at the resonance frequency $f_c$.

$$Z_7 = \frac{1}{j\omega_c C_1} \cdot \frac{1}{1 - \frac{1}{\omega_c^2 L_{27} C_1}} = \frac{1}{j\omega_c C'} \quad \text{(Equation 6)}$$

Therefore, by adjusting the value $L_{27}$ of the inductor 27 so that C' is the same value as the value $C_2$ of the second capacitor 2 shown in FIG. 3, the coil shown in FIG. 14 generates a circularly-polarized magnetic field in the same way as the coil shown in FIG. 3. From equation (6), compared with the case where the value $C_2$ of the second capacitor 2 is changed directly, by adjusting the value $L_{27}$ of the inductor 27, the value of the capacitor can be adjusted more finely, and the degree of freedom of adjustment is enhanced.

Figure 15A:
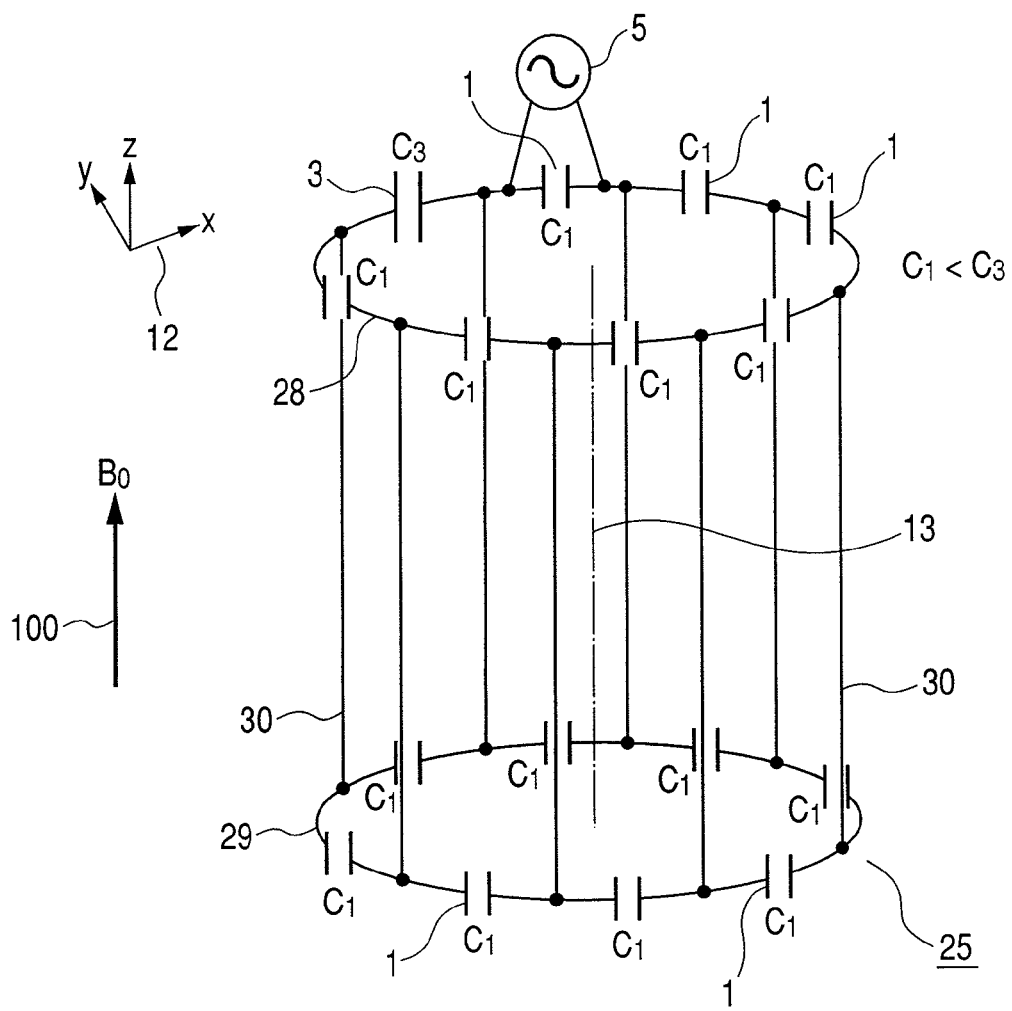
FIG. 15 is a diagram showing another modification of the birdcage-type circularly-polarized RF coil shown in FIG. 3.
Figure 15B:
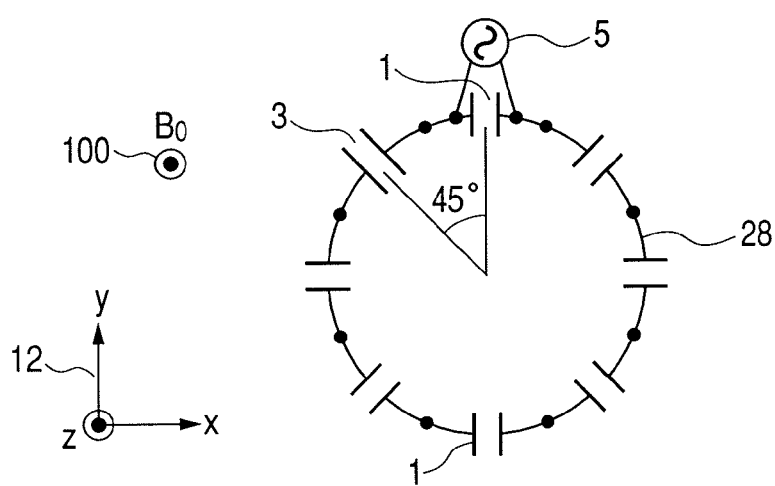

FIG. 15 shows a modification of the birdcage-type circularly-polarized RF coil 25 shown in FIG. 3. This RF coil is different from the embodiment of FIG. 3 in that, instead of the second capacitor 2 shown in FIG. 3, it has a third capacitor 3 whose capacity is larger than the value $C_1$ of the first capacitor 1, and as shown in 15B, the third capacitor 3 is disposed at a position 45° in the counterclockwise direction with respect to the central axis of the birdcage-type circularly-polarized RF coil 25 from the feeding port 5 in a cross-section viewed from a direction passing through the static magnetic field 100.

The value ($C_3$) of the third capacitor 3 of this coil is adjusted so that the value ($C_1$) of the first capacitor 1 satisfies the following equation.

$$\frac{C_3}{C_1} = \left(\frac{Q_{RF} + 15}{Q_{RF}}\right) \quad \text{(Equation 7)}$$

$Q_{RF}$ is the Q value of the birdcage-type circularly-polarized RF coil 25 at the resonance frequency $f_c$. Since the Q value takes a positive value, $C_1<C_3$.

The dimensions of the birdcage-type circularly-polarized RF coil 25 shown in FIG. 15 are for example diameter 30 cm, length 30 cm, the diameters of the loop conductors 28, 29 and linear conductor 30 are 5 mm, and if the Q value of the coil is 50 at a resonance frequency $f_c$=64 MHz, the values ($C_1$, $C_3$) of the first capacitor 1 and capacitor 3 are respectively 32 pF and 40.8 pF.

Next, an example will be described where the birdcage-type circularly-polarized RF coil 25 shown in FIG. 15 functions as a transmit coil.

Figure 16:
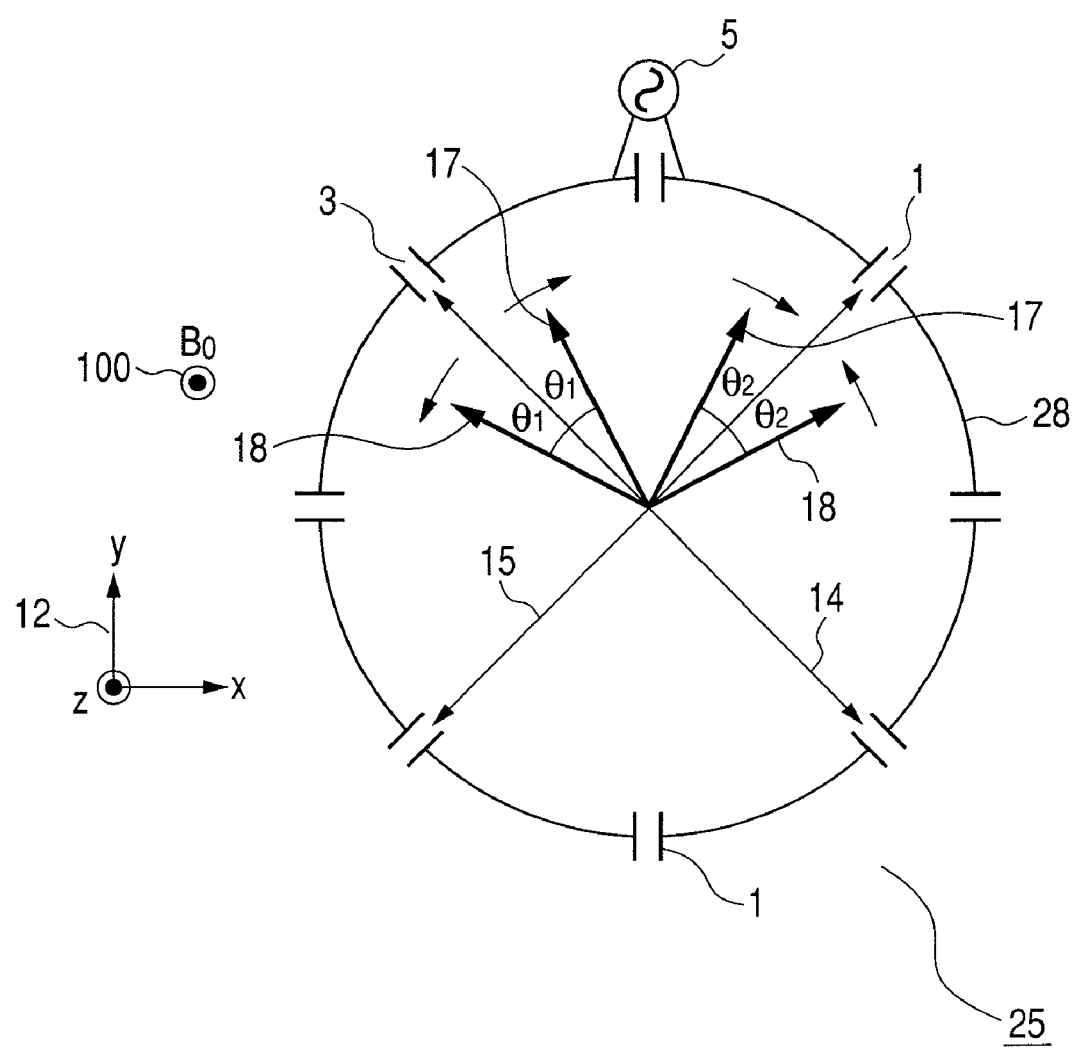
FIG. 16 is a vector diagram of the circularly-polarized magnetic field emitted by the birdcage-type circularly-polarized RF coil shown in FIG. 14.

A radiofrequency voltage having the resonance frequency $f_c$ transmitted from the RF magnetic field generator 106 as center frequency, is applied to the birdcage-type circularly-polarized RF coil 25 via the feeding port 5. In the birdcage-type circularly-polarized RF coil 25, among plural capacitors disposed in the loop conductors 28, 29, only the value of the third capacitor 3 is larger than the value of the first capacitor 1. At this time, in the birdcage-type circularly-polarized RF coil 25, two linearly-polarized magnetic fields of different frequency are generated in the first direction 14 parallel to a plane orthogonal to the central axis 13 of the coil which joins the third capacitor 3 and the central axis of the coil, and the second direction 15 parallel to a plane orthogonal to the central axis of the coil orthogonal to the first direction, and the resonance frequency $f_1$ of the first linearly-polarized magnetic field generated in the first direction 14, is lower than the resonance frequency $f_2$ of the second linearly-polarized magnetic field generated in the second direction 15. At this time, a third resonance frequency $f_3$ is generated between the first resonance frequency $f_1$ and second resonance frequency $f_2$ in the same way as for the birdcage-type circularly-polarized RF coil 25 shown in FIG. 3. In the case of the coil shown in FIG. 15, since the first resonance frequency $f_1$ of the first linearly-polarized magnetic field is lower than the second resonance frequency $f_2$ of the second linearly-polarized magnetic field generated in the second direction 15, the RF magnetic field generated by the coil at the third resonance frequency $f_3$ is a combination of a first linearly-polarized magnetic field whereof the phase is advanced by $\theta_1$, and a second linearly-polarized magnetic field whereof the phase is retarded by $\theta_2$. As a result, the first linearly-polarized magnetic field and the second linearly-polarized magnetic field which are generated in the birdcage-type circularly-polarized RF coil 25 can be expressed as shown in FIG. 16 using vectors. Focusing only on the vectors, FIG. 16 and FIG. 8A have the same vector arrangement. Similarly to the case of the birdcage-type circularly-polarized RF coil 25 shown in FIG. 3, when the phase of $\theta_1$ and $\theta_2$ is 45°, there is only a circularly-polarized vector in the clockwise direction, and similarly to the case where a circularly-polarized magnetic field is generated by a birdcage RF coil using the QD method, a circularly-polarized magnetic field is generated in the clockwise direction by the birdcage-type circularly-polarized RF coil 25.

Figure 17A:
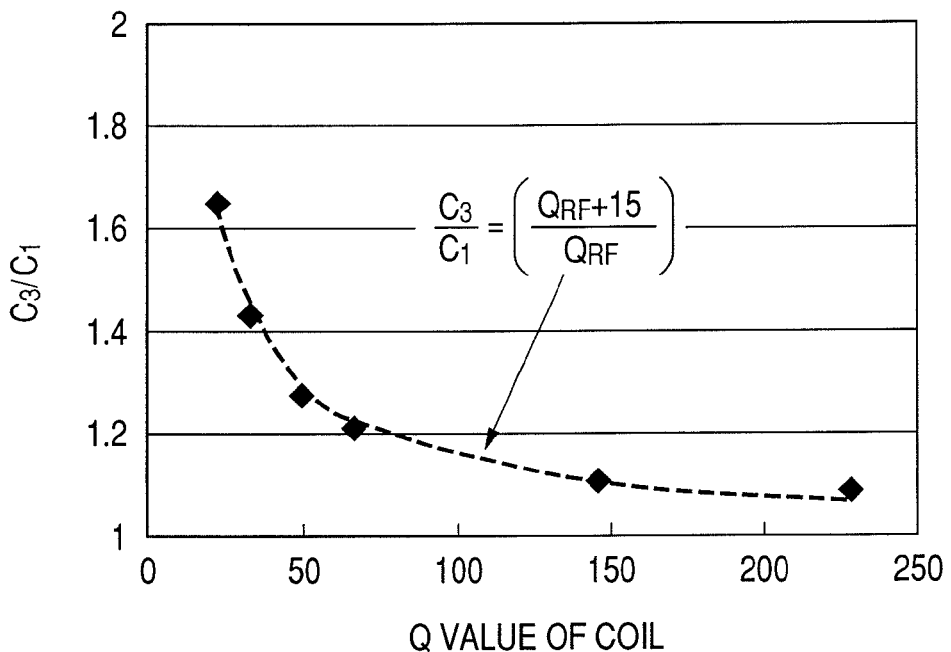
FIG. 17 is a diagram showing the relation between a ratio ($C_3/C_1$) of the first capacitor and third capacitor, and the Q value of the coil, found by an electromagnetic field simulation.

At a resonance frequency $f_c$=64 MHz, the relation between the values ($C_1$, $C_3$) of the first capacitor 1 and third capacitor 3 when the birdcage-type circularly-polarized RF coil 25 generates a circularly-polarized magnetic field in a clockwise direction most efficiently was found from an electromagnetic field simulation. FIG. 17A shows the relation between the ratio ($C_3/C_1$) of the value of the first capacitor 1 and the third capacitor 3 and the Q value $Q_{RF}$ of the coil. The ratio ($C_3/C_1$) of the value of the first capacitor 1 and the third capacitor 3 tended to increase as the Q value $Q_{RF}$ becomes larger, and asymptotically approaches $C_3/C_1$=1. Then, when fitting was performed using a function which takes $Q_{RF}$ as a variable satisfying $C_3/C_1$=∞ when $Q_{RF}$->0 and $C_3/C_1$=1 when $Q_{RF}$->∞, the relation expressed by equation (7) shows the closest value to the value found by simulation. Also for the capacitor value found from an electromagnetic field simulation when the resonance frequency $f_c$=128 MHz, as a result of applying equation (7), good agreement was found as in the case of the resonance frequency $f_c$=64 MHz. Therefore, by using equation (7), the ratio of the values of the first capacitor 1 and third capacitor 3 can be found at which the birdcage-type circularly-polarized RF coil 25, in which the value of the third capacitor 3 is larger than the value of the first capacitor 1, generates a circularly-polarized magnetic field most efficiently.

Figure 17B:
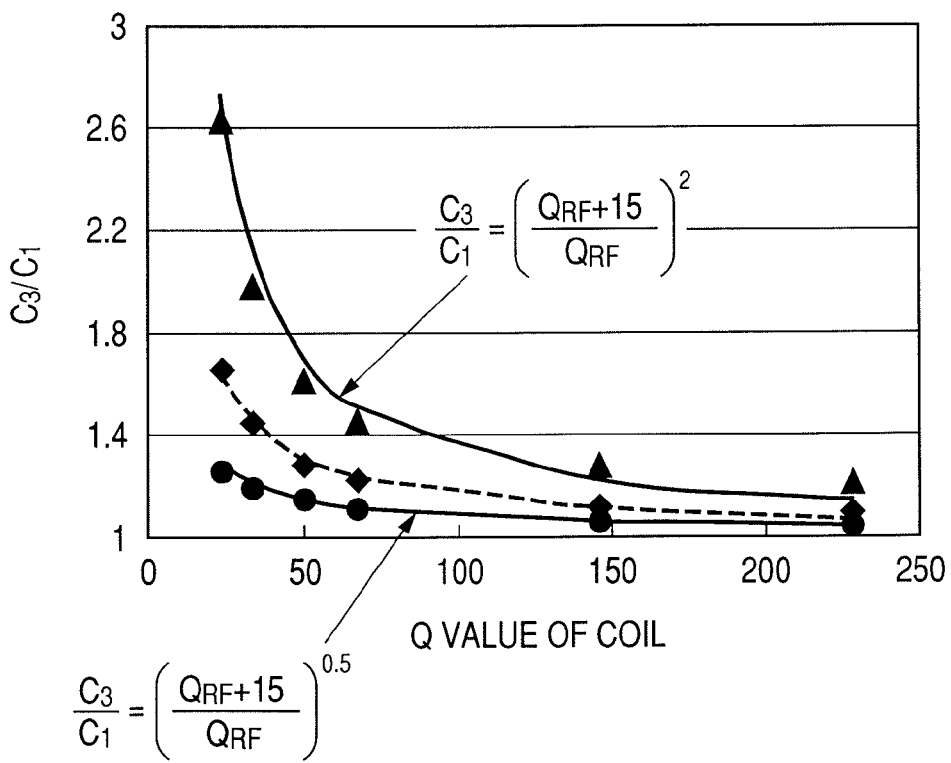

When the values ($C_1$, $C_3$) of the first capacitor 1 and third capacitor 3 for which the strength of the circularly-polarized magnetic field generated by the birdcage-type circularly-polarized RF coil 25 was 95% or more of the maximum value, were found from an electromagnetic field simulation, it was found that, as shown in FIG. 17B, the values ($C_3$, $C_1$) of the first capacitor 1 and third capacitor 3 should satisfy the following equation.

$$\left(\frac{Q_{RF}+15}{Q_{RF}}\right)^{0.5} \leq \frac{C_3}{C_1} \leq \left(\frac{Q_{RF}+15}{Q_{RF}}\right)^2 \quad \text{(Equation 8)}$$

From the above, by disposing the third capacitor 3 at an angle of 45° in the counterclockwise direction with respect to the feeding port 5, selecting the values ($C_1$, $C_3$) of the first capacitor 1 and third capacitor 3 so that their ratio ($C_3/C_1$) satisfies equation (8), and adjusting the value $C_1$ of the first capacitor 1 to resonate at the resonance frequency $f_c$, the birdcage-type circularly-polarized RF coil 25 in this embodiment generates a circularly-polarized magnetic field efficiently, and by preferably selecting the values ($C_1$, $C_3$) of the first capacitor 1 and third capacitor 3 to satisfy equation (7), it generates a circularly-polarized magnetic field most efficiently.

Figure 18A:
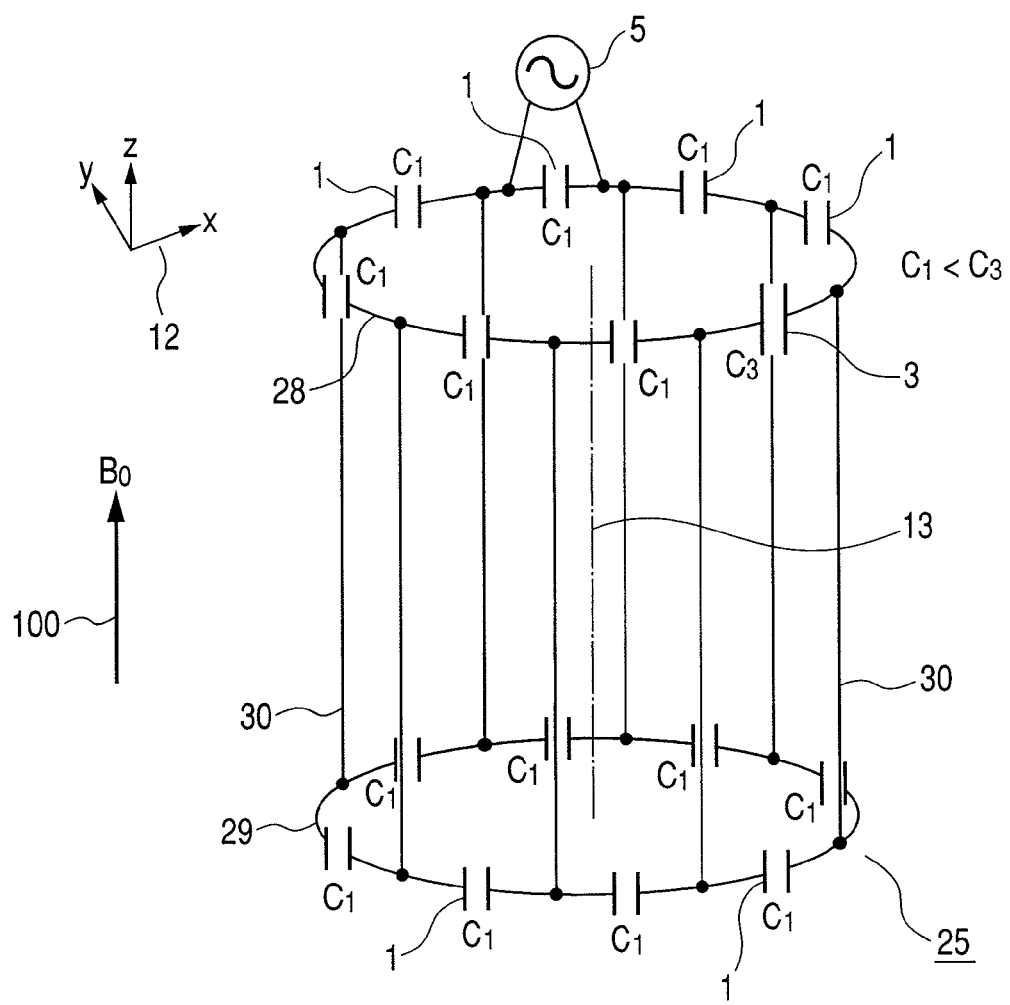
FIG. 18 is a diagram showing a modification of the birdcage-type circularly-polarized RF coil shown in FIG. 14.
Figure 18B:
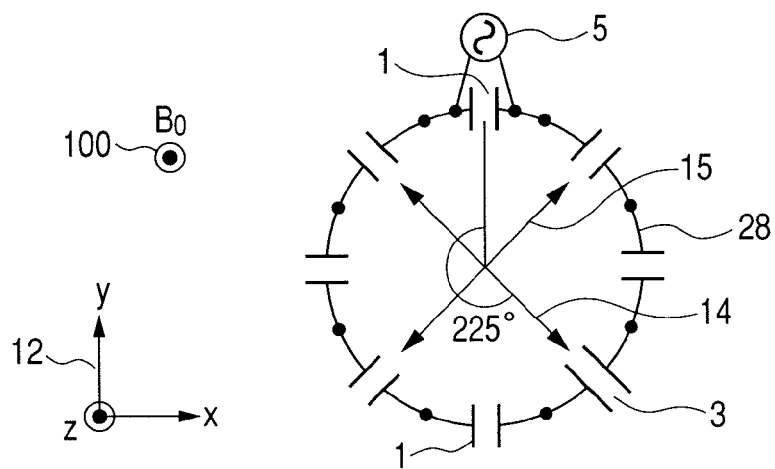

In the birdcage-type circularly-polarized RF coil 25 shown in FIG. 15, the case was described where the third capacitor 3 was disposed at an angle of 45° in an anti clockwise direction with respect to the feeding port 5, but in addition to this embodiment, as shown in FIG. 18, if the value of the third capacitor 3 is larger than the value of the first capacitor 1 and it is disposed at an angle of 225° in the counterclockwise direction with respect to the feeding port 5, then as shown in FIG. 18B, two linearly-polarized magnetic fields of different frequencies are generated in the first direction 14 parallel to a plane orthogonal to the central axis 13 of the coil joining the third capacitor 3 to the central axis of the coil, and the second direction 15 parallel to a plane orthogonal to the central axis 13 of the coil and orthogonal to the first direction 14, and the first resonance frequency $f_1$ of the first linearly-polarized magnetic field generated in the first direction 14 is lower than the second resonance frequency $f_2$ of the second linearly-polarized magnetic field generated in the second direction 15. The spatial relationship of the linearly-polarized magnetic fields shown in FIG. 18B is the same as that of FIG. 16, and a circularly-polarized magnetic field can be generated as in this embodiment.

In the birdcage-type circularly-polarized RF coil 25 shown in FIG. 15, as in the birdcage-type circularly-polarized RF coil 25 shown in FIG. 3, the position of the third capacitor 3 can be moved along the loop conductor 28. Within a region between the loop 28 and the linear conductors 30 in the counterclockwise direction including the 45° position, i.e., in a position 22.5° to 67.5° in the counterclockwise direction with respect to the central axis of the birdcage-type circularly-polarized RF coil 25 from the feeding port 5 in a cross-section viewed from a direction passing through the static magnetic field 100, it shows a value which is 95% or more of the circularly-polarized magnetic field strength at 45°. Also, within a region in the counterclockwise direction between the loop conductor 28 and the linear conductors 30 including the 225° position, i.e., in a position 202.5° to 247.5° in the counterclockwise direction with respect to the central axis of the birdcage-type circularly-polarized RF coil 25 from the feeding port 5 in a cross-section viewed from a direction passing through the static magnetic field 100, it shows a value which is 95% or more of the circularly-polarized magnetic field strength at 45°. Therefore, the position of the third capacitor 3 in this embodiment is preferably such that it makes an angle of 22.5° to 67.5° or 202.5° to 247.5° in the counterclockwise direction with respect to the feeding port 5, more preferably about 45° in the counterclockwise direction with respect to the feeding port 5, and most preferably about 225° in the counterclockwise direction with respect to the feeding port 5. Here, "about" means the error in the angle due to coil manufacturing errors.

In the birdcage-type circularly-polarized RF coil 25 shown in FIG. 15, the number of linear conductors 30 was 8, but the spatial relationship between the feeding port 5 and third capacitor 3 can be extended to 8 or more linear conductors 30. If the birdcage-type circularly-polarized RF coil 25 shown in FIG. 15 is represented by a lumped element circuit formed by an inductor and capacitor, the part between the loop conductor 28 and linear conductors 30 including the third capacitor 3 can be represented by a serial circuit of the capacitor and inductor. If the spatial relationship between the capacitor and inductor is changed, electrical properties do not change, so provided the position of the third capacitor 3 lies between the connection points of the loop 28 and linear conductors 30, there is no major impact on coil properties even if the position of the third capacitor 3 is changed. Therefore, in a birdcage-type circularly-polarized RF coil 25 having N linear conductors 30 and the spatial relationship between the feeding port 5 and third capacitor 3 shown in FIG. 15, provided that the position of the third capacitor 3 lies between the loop conductor 28 and linear conductors 30 including the 45° position in the counterclockwise direction with respect to the feeding port 5, a circularly-polarized magnetic field can be generated in the same way as for the birdcage-type circularly-polarized RF coil 25 shown in FIG. 3. This is the same even when the position of the third capacitor 3 is 225° in the counterclockwise direction with respect to the feeding port 5.

Further, it is preferably disposed so that it makes an angle of about 45° in the counterclockwise direction or about 225° in the counterclockwise direction with respect to the feeding port 5. Here, "about" means the error in the angle due to coil manufacturing errors.

Figure 19A:
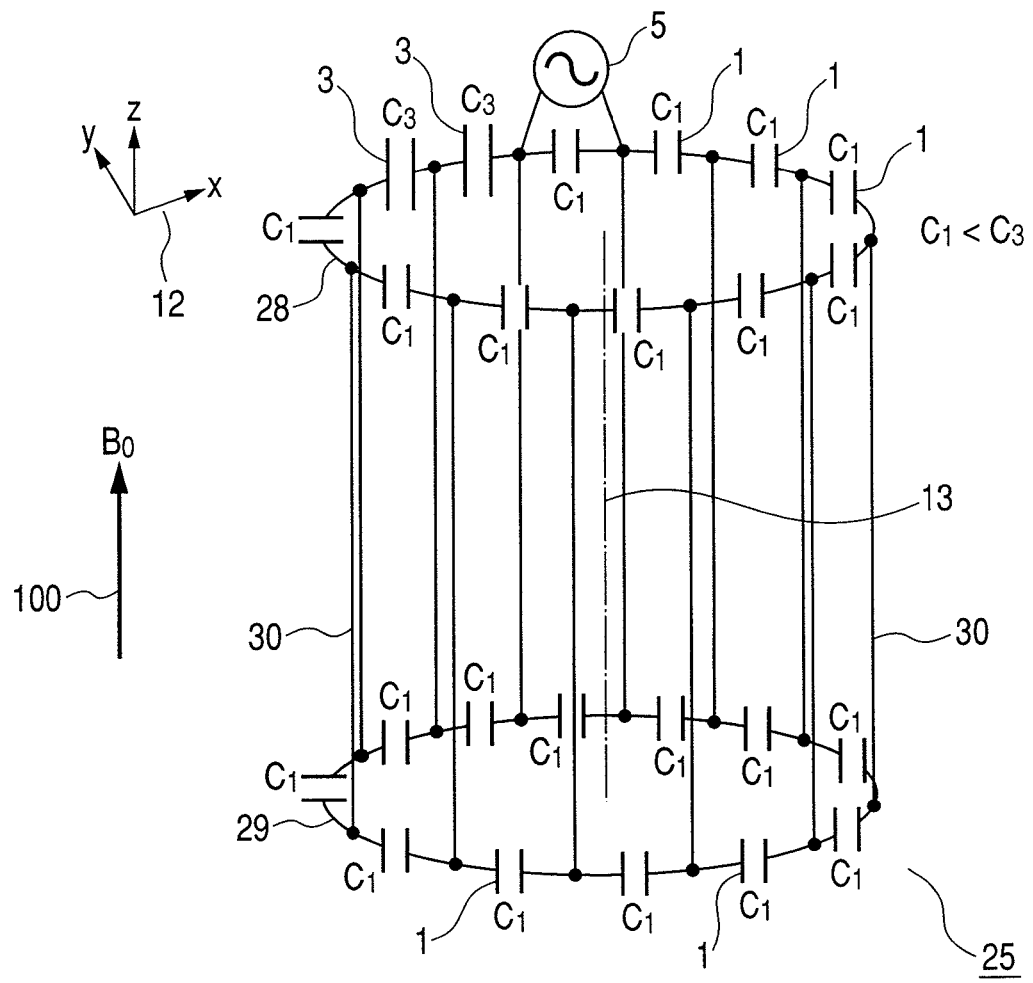
FIG. 19 is a diagram showing another modification of the birdcage-type circularly-polarized RF coil shown in FIG. 12.
Figure 19B:
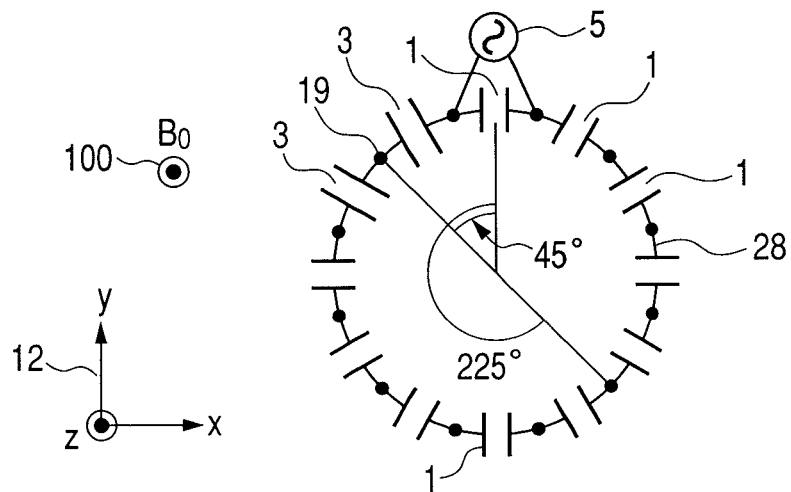

FIG. 19 shows a modification of the birdcage-type circularly-polarized RF coil 25 shown in FIG. 15. This RF coil differs from that shown in FIG. 15 in that there are 12 linear conductors, 22 first capacitors 1 and two third capacitors 3.

Since, when there are a multiple of 12 of the linear conductors 30, there is a connection point 19 between the linear conductors 30 and loop conductor 28 at the 45° or 225° angle position in the counterclockwise direction with respect to the feeding port 5, the third capacitor 3 cannot be placed there. However, by disposing two third capacitors 3 on the conducting loop 28 on both sides of the connection point 19, and adjusting the capacity of the third capacitor 3, a circularly-polarized magnetic field can effectively be generated in the same way as when the third capacitor 3 was positioned at an angle of 45° or 225° with respect to the feeding port 5. Here, the third capacitors 3 are positioned at an angle of 45° or 225° in the counterclockwise direction with respect to the central axis of the birdcage-type circularly-polarized RF coil 25 in a cross-section viewed from a direction passing through the static magnetic field 100, and are disposed so as to enclose the connection point 19 between the loop 28 and linear conductors 30.

Figure 20A:
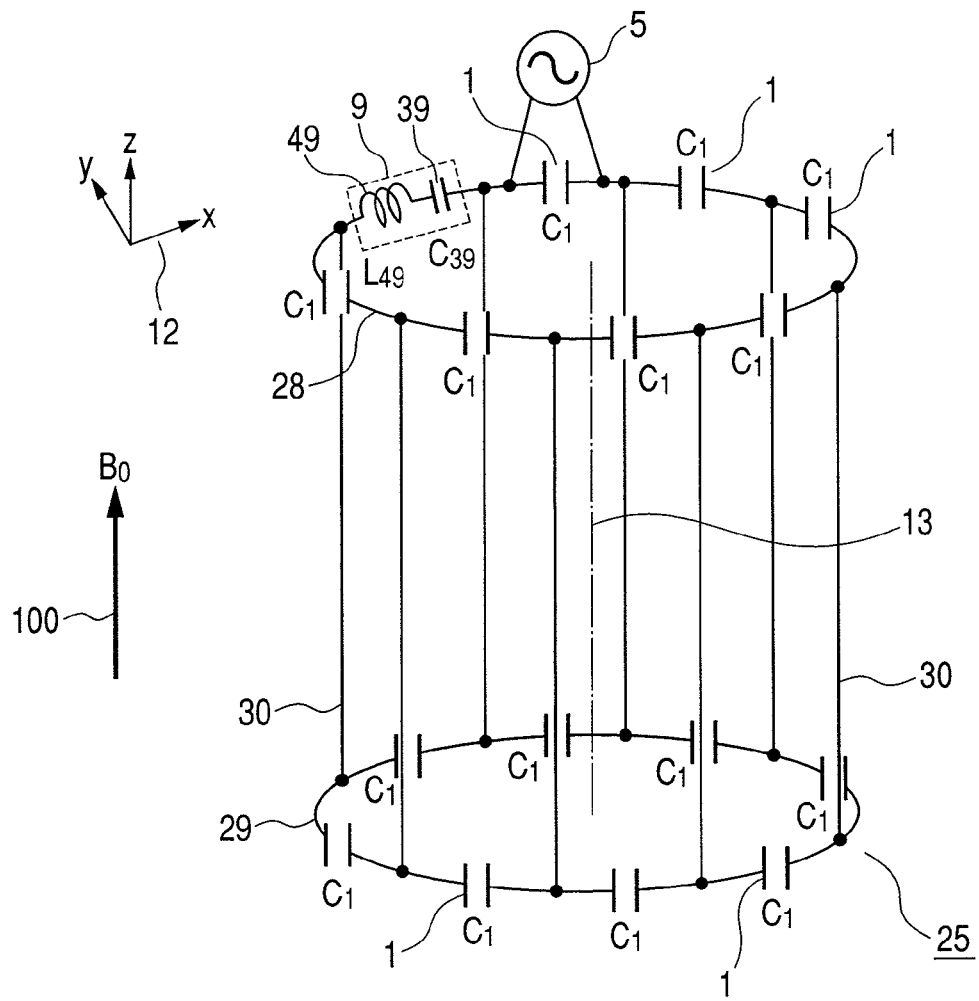
FIG. 20 is a diagram showing another modification of the birdcage-type circularly-polarized RF coil shown in FIG. 12.
Figure 20B:
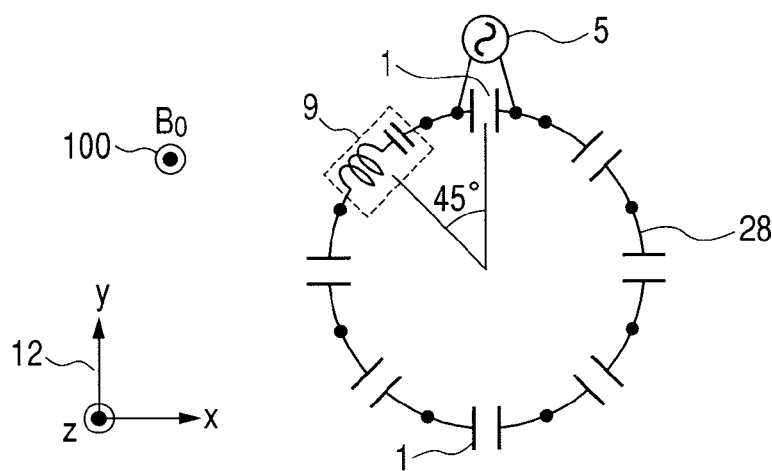

FIG. 20 shows a modification of the birdcage-type circularly-polarized RF coil 25 shown in FIG. 15. This RF coil differs from the coil of FIG. 15 in that a serial circuit 9 in which an inductor 49 and capacitor 39 are connected in series, is disposed at the position of the third capacitor 3.

The impedance $Z_9$ of the serial circuit 9 is given by the following equation.

$$Z_9 = \frac{1 - \omega^2 L_{49} C_{39}}{j\omega C_{39}} \quad \text{(Equation 9)}$$

ω is the angular frequency. At this time, if the value $L_{49}$ of the inductor 49 is adjusted so that $C_{39} = C_1$, $1 - \omega^2 L_{49} C_{39} > 0$ at the resonance frequency $f_c$, the impedance $Z_9$ of the serial circuit 9 is given by the following equation, and the serial circuit 9 functions as a capacitor having a value C" less than the value $C_1$ at the resonance frequency fax $$Z_9 = \frac{1}{j\omega_c C_1} \cdot (1 - \omega_c^2 L_{49} C_1) = \frac{1}{j\omega_c C''} \quad \text{(Equation 10)}$$

Therefore, by adjusting the value $L_{49}$ of the inductor 49 so that C" is the same value as the value $C_3$ of the third capacitor 3 shown in FIG. 15, the coil shown in FIG. 20 generates a circularly-polarized magnetic field in the same way as the coil shown in FIG. 15. From equation (10), compared with the case where the value $C_3$ of the third capacitor 3 is changed directly, by adjusting the value $L_{49}$ of the inductor 49, the value of the capacitor can be adjusted more finely, and the degree of freedom of adjustment is enhanced.

Figure 21A:
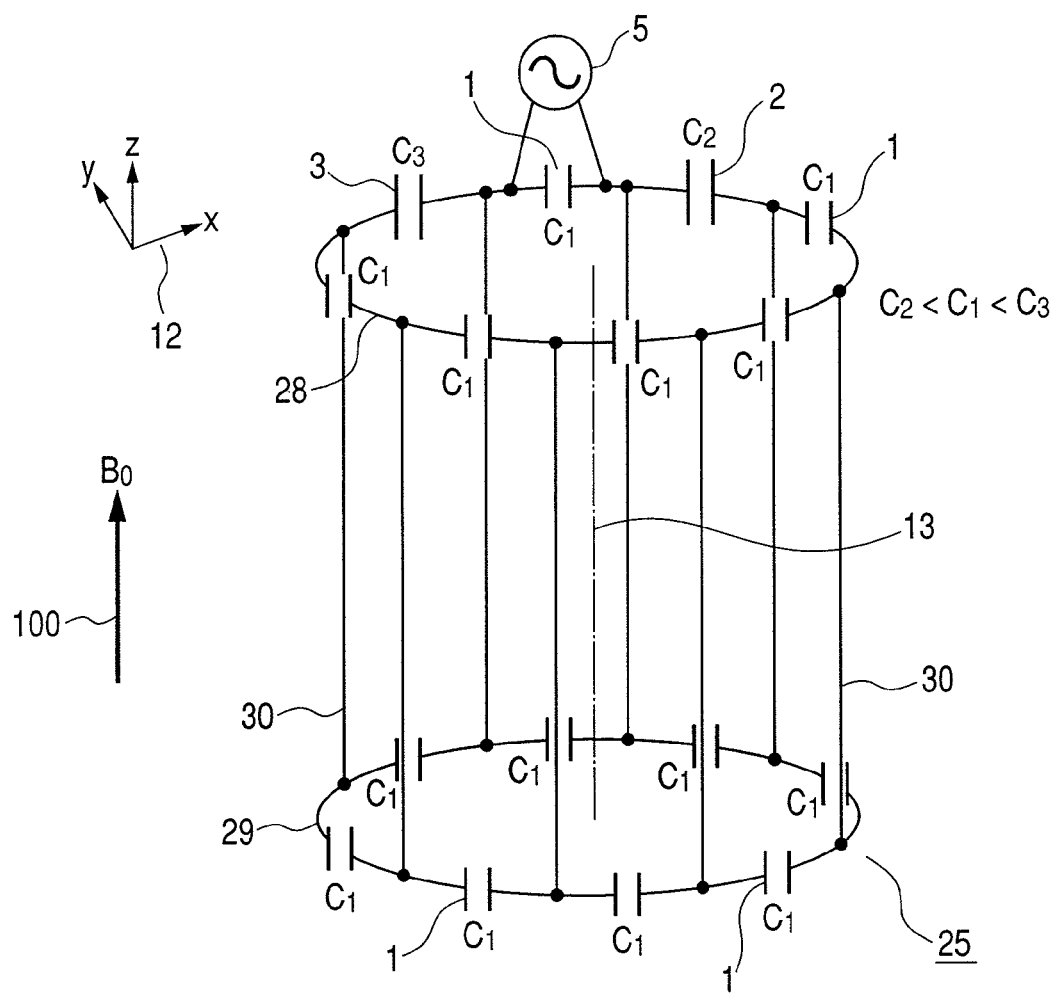
FIG. 21 is a diagram showing a modification of the birdcage RF coil shown in FIG. 3.
Figure 21B:
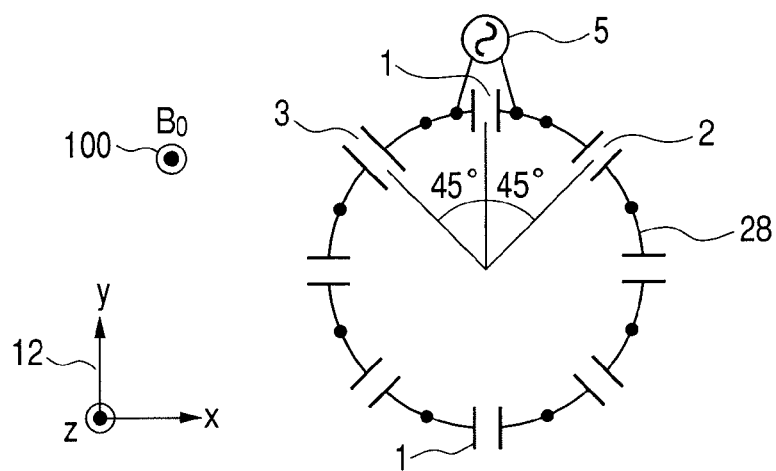

FIG. 21 shows a modification of the birdcage-type circularly-polarized RF coil 25 shown in FIG. 3. This RF coil is different from the embodiment of FIG. 3 in that in addition to the coil shown in FIG. 3, as shown in FIG. 21B, there is a third capacitor 3 disposed at a position 450 in the counterclockwise direction with respect to the central axis of the birdcage-type circularly-polarized RF coil 25 from the feeding port 5 in a cross-section viewed from a direction passing through the static magnetic field 100.

The value ($C_1$) of the first capacitor 1 of this coil is adjusted so that the birdcage RF coil, in which the second capacitor 2 and third capacitor 3 shown in FIG. 21 are replaced by the first capacitor 1, resonates at the resonance frequency $f_c$.

The value ($C_2$) of the second capacitor 2 and the value ($C_3$) of the third capacitor 3 are adjusted to satisfy the following equation.

$$C_3 > C_1 > C_2 \quad \text{(Equation 11)}$$

The dimensions of the birdcage-type circularly-polarized RF coil 25 shown in FIG. 21 are for example diameter 30 cm, length 30 cm, the diameters of the loop conductors 28, 29 and linear conductor 30 are 5 mm, and if the Q value of the coil is 50 at a resonance frequency $f_c = 64$ MHz, the values ($C_1$, $C_2$, $C_3$) of the first capacitor 1, second capacitor 2 and third capacitor 3 are respectively 32.6 pF, 29.1 pF, 36.1 pF.

Next, an example will be described where the birdcage-type circularly-polarized RF coil 25 shown in FIG. 21 functions as a transmit coil.

Figure 22:
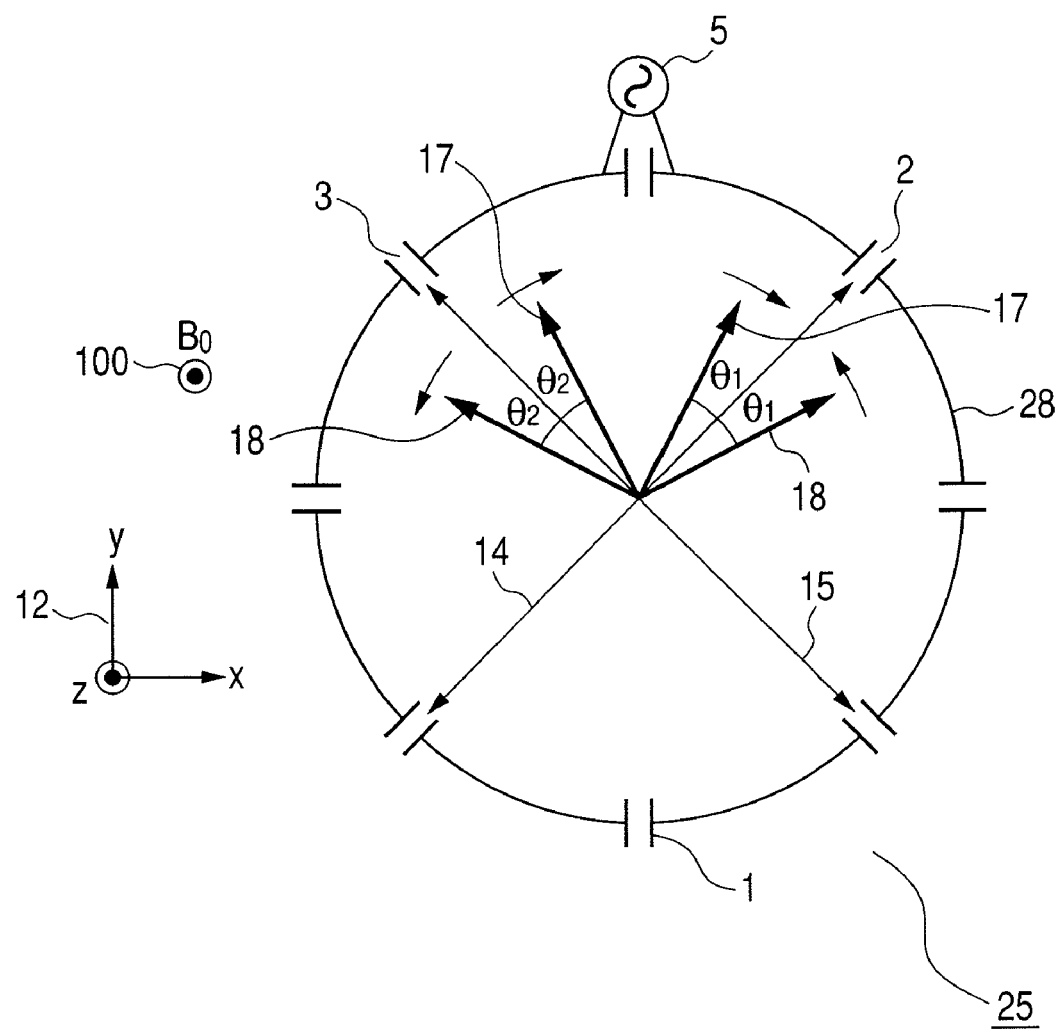
FIG. 22 is a vector diagram of the circularly-polarized magnetic field emitted by the birdcage-type circularly-polarized RF coil shown in FIG. 17.

A radiofrequency voltage having the resonance frequency $f_c$ transmitted from the RF magnetic field generator 106 as center frequency, is applied to the birdcage-type circularly-polarized RF coil 25 via the feeding port 5. In the birdcage-type circularly-polarized RF coil 25, among plural capacitors disposed in the loop conductors 28, 29, the value of the second capacitor 2 is smaller than the value of the first capacitor 1, and the value of the third capacitor 3 is larger than the value of the first capacitor 1. At this time, in the birdcage-type circularly-polarized RF coil 25, two linearly-polarized magnetic fields of different frequency are generated in the first direction 14 parallel to a plane orthogonal to the central axis 13 of the coil joining the second capacitor 2 to the central axis of the coil, and the second direction 15 parallel to the plane orthogonal to the central axis of the coil joining the third capacitor 3 to the central axis of the coil, and the first resonance frequency $f_1$ of the first linearly-polarized magnetic field generated in the first direction 14, is higher than the second resonance frequency $f_2$ of the second linearly-polarized magnetic field generated in the second direction 15. At this time, a third resonance frequency $f_3$ is generated between the first resonance frequency $f_1$ and second resonance frequency $f_2$ in the same way as for the birdcage-type circularly-polarized RF coil 25 shown in FIG. 3. In the case of the coil shown in FIG. 21, since the first resonance frequency $f_1$ of the first linearly-polarized magnetic field is higher than the second resonance frequency $f_2$ of the second linearly-polarized magnetic field generated in the second direction 15, the RF magnetic field generated by the coil at the third resonance frequency $f_3$ is a combination of a first linearly-polarized magnetic field whereof the phase is retarded by $\theta_1$, and a second linearly-polarized magnetic field whereof the phase is advanced by $\theta_2$. As a result, the first linearly-polarized magnetic field and the second linearly-polarized magnetic field generated in the birdcage-type circularly-polarized RF coil 25 can be expressed as shown in FIG. 22 using vectors. Focusing only on the vectors, FIG. 22 and FIG. 8A have the same vector arrangement. Similarly to the case of the birdcage-type circularly-polarized RF coil 25 shown in FIG. 3, when the phase of $\theta_1$ and $\theta_2$ is 45°, there is only a circularly-polarized vector in the clockwise direction, and similarly to the case where a circularly-polarized magnetic field is generated by a birdcage RF coil using the QD method, a circularly-polarized magnetic field is generated in the clockwise direction by the birdcage-type circularly-polarized RF coil 25.

From the above, by adjusting the values of the first capacitor 1, second capacitor 2 and third capacitor 3, the birdcage-type circularly-polarized RF coil 25 shown in FIG. 21 generates a circularly-polarized magnetic field in the clockwise direction, and the same effect as in the case of the birdcage-type circularly-polarized RF coil 25 shown in FIG. 3 is obtained. Also, in the case of this coil, the values of the second capacitor 2 and third capacitor 3 can be adjusted while the value $C_1$ of the first capacitor 1 is fixed, so coil adjustment is easy.

In the birdcage-type circularly-polarized RF coil 25 shown in FIG. 21, the second capacitor 2 may be disposed at an angle of 225° in the clockwise direction with respect to the feeding port 5, and even if the third capacitor 3 is also disposed at an angle of 225° in the counterclockwise direction with respect to the feeding port 5, the spatial relationship of the two linearly-polarized magnetic fields is identical to the case of FIG. 22, so the coil shown in FIG. 21 can perform identical functions.

As shown in FIG. 12, provided that the second capacitor 2 lies between the connection points of the loop conductor 28 and linear conductors 30 including the 45° position, it has 95% or more of the circularly-polarized magnetic field strength in the 45° position, so the position of the second capacitor 2 may be 22.5° to 67.5° with respect to the feeding port 5 in the same way as in the coil shown in FIG. 3. Further, since the second capacitor 2 may be disposed at an angle of 225° in the clockwise direction with respect to the feeding port 5, it may be disposed also from 202.5° to 247.5°. Regarding the position of the third capacitor 3, it may be disposed from 22.5° to 67.5°, or from 202.5° to 247.5°, with respect to the feeding port 5 in the same way as in the coil shown in FIG. 15.

As for the linear conductors, a parallel circuit in which an inductor and capacitor are connected in parallel may be disposed instead of the second capacitor 2 in the same way as in the case of the coil shown in FIG. 14, and a serial circuit in which an inductor and capacitor are connected in series may be disposed instead of the third capacitor 3 as in the case of the coil shown in FIG. 20.

Also, even in the case where there is a multiple of 12 of the linear conductors 30 of the birdcage-type circularly-polarized RF coil 25 shown in FIG. 21, the circularly-polarized magnetic field can be generated efficiently by disposing plural second capacitors 2 and third capacitors 3.

In the present embodiment, capacitors are disposed only on the loop conductors 28, 29, but a fourth capacitor 4 may be disposed also on the linear conductors 30. At this time, the values of the first capacitor 1, second capacitor 2 and third capacitor 3 change, but the operating principle is the same. Therefore, a coil in which the fourth capacitor 4 is disposed on the linear conductors 30 of the birdcage-type circularly-polarized RF coil 25 shown in FIG. 3 or FIG. 15, can generate a circularly-polarized magnetic field.

Second Embodiment

Figure 23A:
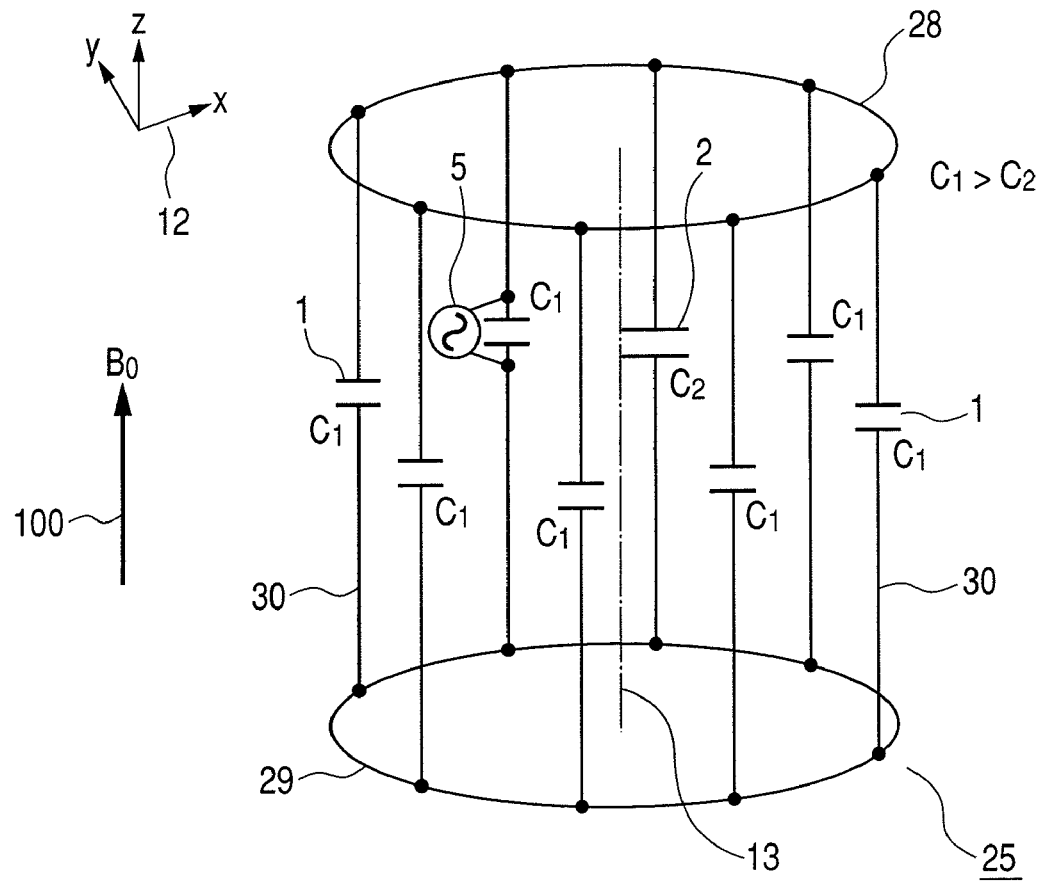
FIG. 23 is a schematic view of a birdcage-type circularly-polarized RF coil according to a second embodiment.

FIG. 23 shows the construction of a birdcage-type circularly-polarized RF coil 25 according to a second embodiment of the invention. In the birdcage-type circularly-polarized RF coil 25, as shown in FIG. 23A, the 2 loop conductors 28, 29 are disposed so that the center axes of the loops are parallel and substantially parallel to the z axis of the axes 12, and plural (in FIG. 23A, 8) linear conductors 30 which are substantially linear and substantially parallel to the z axis of the axes 12, are connected thereto. At this time, the plural linear conductors 30 are disposed at equidistant intervals. It is assumed that the direction of the z axis of the axes 12 is identical to the orientation of the static magnetic field 100 generated by the magnet 101 of the magnetic resonance imaging apparatus. In other words, the central axis of the loops is substantially identical to the orientation of the static magnetic field generated by the magnet of the magnetic resonance imaging apparatus.

Figure 23B:
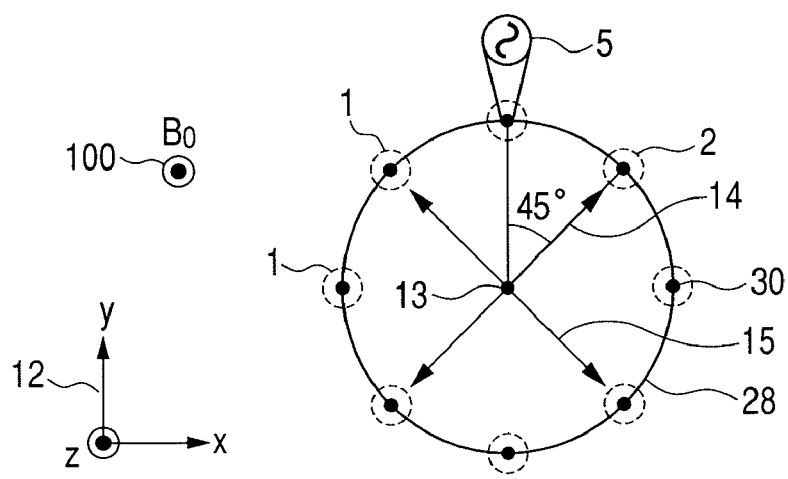

In the plural linear conductors 30, plural first capacitors 1 and second capacitor 2 are disposed, and the feeding port 5 is connected in parallel to one of the first capacitors 1. In the linear conductors, the second capacitor 2, as shown in FIG. 23B, is disposed at a position about 45° in the clockwise direction with respect to the central axis of the birdcage-type circularly-polarized RF coil 25 from the feeding port 5 in a cross-section viewed from a direction passing through the static magnetic field 100. Here, "about" means the error in the angle due to manufacturing error.

In FIG. 23, the inductances of the loop conductors 28, 29 and linear conductors 30 are not shown. Also, when they are used as the transmit RF coil 107 and receive RF coil 114, a circuit in which a PIN diode and inductor are connected in series, is connected in parallel to the capacitor of this coil to form a magnetic decoupling controlled by a magnetic decoupling signal, not shown.

Since this coil resonates at the magnetic resonance frequency of a given element, the values $(C_1, C_2)$ of the first capacitor 1 and second capacitor 2 in the coil of this embodiment are adjusted to respectively suitable values, respectively. Hereafter, an example will be described where the resonance frequency $f_c$ of the coil is the magnetic resonance frequency $f_H$=64 MHz of the proton at a magnetic field strength of 1.5 Tesla.

The value $(C_2)$ of the second capacitor 2 is adjusted so that the value $(C_1)$ of the first capacitor 1 and following equation are satisfied.

$$\frac{C_2}{C_1} = \left(\frac{Q_{RF}}{Q_{RF}+5}\right)^2 \quad \text{(Equation 12)}$$

$Q_{RF}$ is the Q value at the resonance frequency $f_c$ of the birdcage-type circularly-polarized RF coil 25. The Q value depends on the coil resistance and inductor component, and RF losses due to the test subject inside the coil. $Q_{RF}$ can be obtained by adjusting the value of the first capacitor so that the birdcage RF coil in which the second capacitor of the coil shown in FIG. 23A has been replaced by the first capacitor, resonates at the resonance frequency $f_c$, then positioning the test subject, and measuring the resonance properties of the coil. The electrical properties of the coil and test subject can also be modeled and found by an electromagnetic field simulation. Since the Q value is positive, $C_1 > C_2$.

The dimensions of the birdcage-type circularly-polarized RF coil 25 shown in FIG. 23 may be for example diameter 30 cm, length 30 cm, and the diameters of the loop conductors 28, 29 and linear conductors 30 is 5 mm. If the Q value of the coil is 50 when the resonance frequency $f_c$=64 MHz, the values $(C_1, C_2)$ of the first capacitor 1 and second capacitor 2 are 9.2 pF and 7.7 pF, respectively.

Next, an example will be described where the birdcage-type circularly-polarized RF coil 25 shown in FIG. 23, functions as a transmit coil.

A radiofrequency voltage having the resonance frequency $f_c$ transmitted from the RF magnetic field generator 106 as its center frequency, is applied to the birdcage-type circularly-polarized RF coil 25 via the feeding port 5. The birdcage-type circularly-polarized RF coil 25 is such that among the plural capacitors disposed in the linear conductors 30, only the value of the second capacitor is less than that of the first capacitor.

Figure 24:
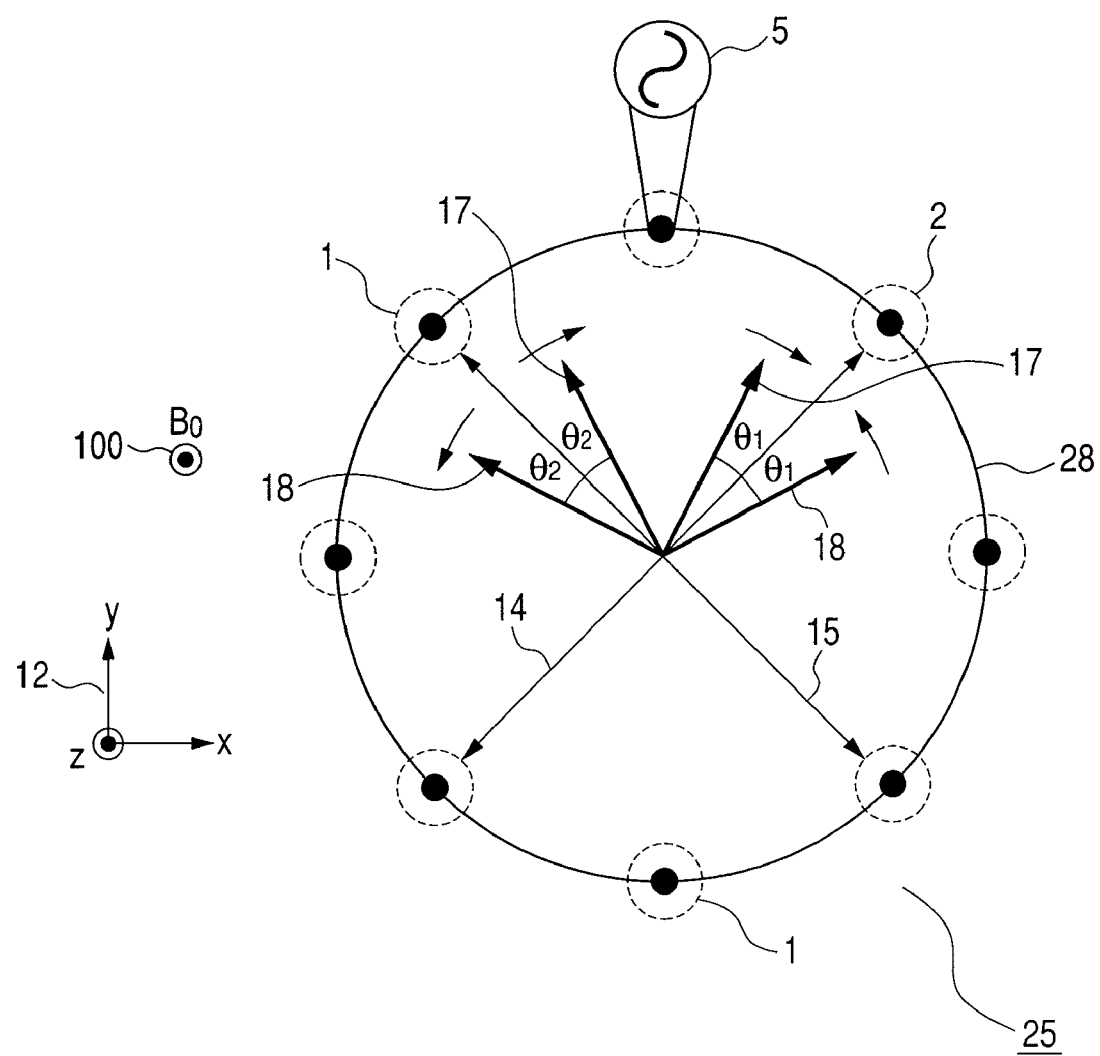
FIG. 24 is a vector diagram of the circularly-polarized magnetic field emitted by the birdcage-type circularly-polarized RF coil shown in FIG. 19.

At this time, in the birdcage-type circularly-polarized RF coil 25, two linearly-polarized magnetic fields of different frequencies are generated in a first direction 14 parallel to a plane orthogonal to the central axis 13 of the coil joining the second capacitor 2 to the central axis 13 of the coil, and a second direction 15 parallel to a plane orthogonal to the central axis 13 of the coil and orthogonal to the first direction, and the first resonance frequency $f_1$ of a first linearly-polarized magnetic field generated in the first direction 14 is higher than the second resonance frequency $f_2$ of the second linearly-polarized magnetic field generated in the second direction 15. At this time, a third resonance frequency $f_3$ is generated between the first resonance frequency $f_1$ and second resonance frequency $f_2$ in the same way as for the birdcage-type circularly-polarized RF coil 25 shown in FIG. 3. In the case of the coil shown in FIG. 23, since the first resonance frequency $f_1$ of the first linearly-polarized magnetic field is higher than the second resonance frequency $f_2$ of the second linearly-polarized magnetic field generated in the second direction 15, the RF magnetic field generated by the coil at the third resonance frequency $f_3$ is a combination of a first linearly-polarized magnetic field whereof the phase is retarded by $\theta_1$, and a second linearly-polarized magnetic field where of the phase is advanced by $\theta_2$. As a result, the first linearly-polarized magnetic field and the second linearly-polarized magnetic field generated in the birdcage-type circularly-polarized RF coil 25 can be expressed as shown in FIG. 24 using vectors. Focusing only on the vectors, FIG. 24 and FIG. 8A have the same vector arrangement. Similarly to the case of the birdcage-type circularly-polarized RF coil 25 shown in FIG. 3, when the phase of $\theta_1$ and $\theta_2$ is 45°, there is only a circularly-polarized vector in the clockwise direction, and similarly to the case where a circularly-polarized magnetic field is generated by a birdcage RF coil using the QD method, a circularly-polarized magnetic field is generated in the clockwise direction by the birdcage-type circularly-polarized RF coil 25.

Figure 25A:
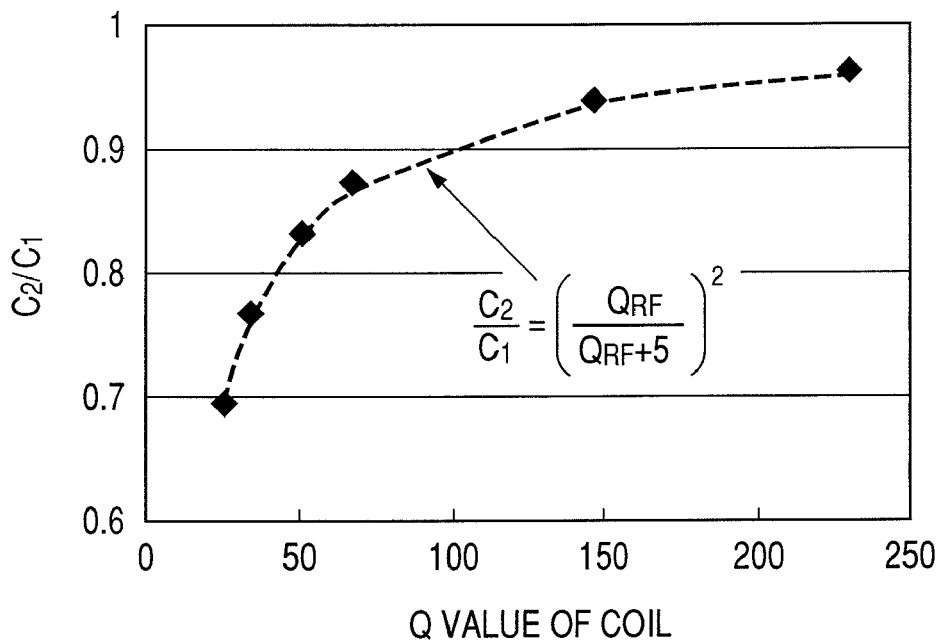
FIG. 25 is a diagram showing the relation between a ratio ($C_2/C_1$) of the first capacitor and second capacitor, and the Q value of the coil, in a birdcage-type circularly-polarized RF coil shown in FIG. 19.

At the resonance frequency $f_c$=64 MHz, the values $(C_1, C_2)$ of the first capacitor 1 and second capacitor 2 were found by an electromagnetic field simulation when the birdcage-type circularly-polarized RF coil 25 generates a circularly-polarized magnetic field in a clockwise direction most efficiently, while varying the Q value $Q_{RF}$ of the coil. FIG. 25A shows the relation between the ratio $(C_2/C_1)$ of the values of the first capacitor 1 and second capacitor 2 and the Q value $Q_{RF}$ of the coil. The ratio $(C_2/C_1)$ of the values of the first capacitor 1 and second capacitor 2 tends to increase, asymptotically approaching $C_2/C_1=1$ as the Q value $Q_{RF}$ becomes large. Then, when fitting was performed using a function which takes $Q_{RF}$ as a variable which satisfies $C_2/C_1=0$ when $Q_{RF}->0$ and $C_2/C_1=1$ when $Q_{RF}->\infty$, the relation expressed by equation (12) shows the closest value to the value found by simulation. Also for the capacitor value found from an electromagnetic field simulation when the resonance frequency $f_c$=128 MHz, as a result of applying equation (12), good agreement was found as in the case of the resonance frequency $f_c$=64 MHz. Therefore, by using equation (12), the ratio of the values of the first capacitor 1 and second capacitor 2 can be found at which the birdcage-type circularly-polarized RF coil 25, in which the value of the second capacitor 2 is less than the value of the first capacitor 1, generates a circularly-polarized magnetic field most efficiently.

Figure 25B:
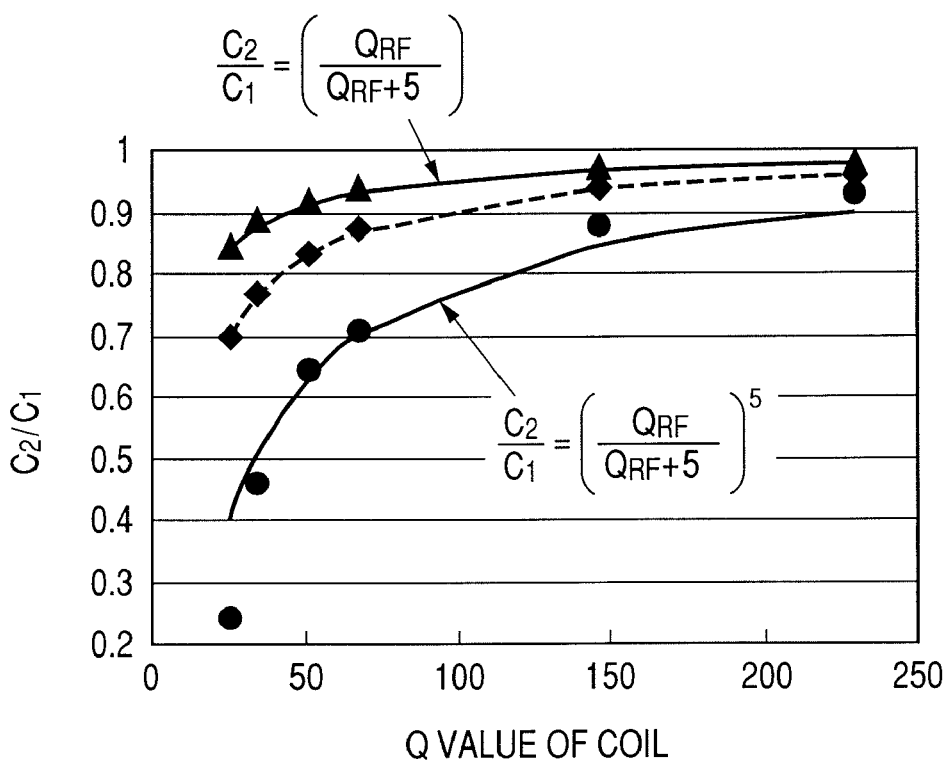

When the values $(C_1, C_2)$ of the first capacitor 1 and second capacitor 2 for which the strength of the circularly-polarized magnetic field generated by the birdcage-type circularly-polarized RF coil 25 was 95% or more of the maximum value, were found from an electromagnetic field simulation, it was found that, as shown in FIG. 25B, the values $(C_1, C_2)$ of the first capacitor 1 and second capacitor 2 should satisfy the following equation.

$$\left(\frac{Q_{RF}}{Q_{RF}+5}\right)^5 \leq \frac{C_2}{C_1} \leq \left(\frac{Q_{RF}}{Q_{RF}+5}\right) \qquad \text{(Equation 13)}$$

From the above, by disposing the second capacitor 2 at an angle of 45° in the clockwise direction with respect to the feeding port 5, selecting the values $(C_1, C_2)$ of the first capacitor 1 and second capacitor 2 so that their ratio $(C_2/C_1)$ satisfies equation (13), and adjusting the value $C_1$ of the first capacitor 1 to resonate at the resonance frequency $f_c$, the birdcage-type circularly-polarized RF coil 25 in this embodiment generates a circularly-polarized magnetic field efficiently, and by preferably selecting the values $(C_1, C_2)$ of the first capacitor 1 and second capacitor 2 to satisfy equation (12), it generates a circularly-polarized magnetic field most efficiently.

As mentioned above, according to this embodiment, a circularly-polarized magnetic field can be generated with only one feeding port, as in the case where a circularly-polarized magnetic field is generated in a birdcage RF coil using the QD method. Therefore, since there is one less feeding port compared to the QD method, the divider and phase shifter which were required in the prior art for a transmit coil using the QD method are now not required, and the number of parts in the transmit system can be reduced to less than half. For this reason, manufacturing costs can be lowered while adjustment of the transmit system is easier. Further, since there is only one feeding port to the coil and a divider and phase shifter are not used, decrease in orthogonality due to mechanical distortion of the coil, and decrease of Signal-To-Noise ratio of the coil due to phase shift resulting from the divider and phase shifter, can be suppressed, while transmit efficiency and sensitivity of the RF coil are enhanced in comparison to the prior art. Further, compared to the first embodiment, since the number of capacitors is halved, decrease of orthogonality due to scatter of parts can be suppressed, and coil adjustment is easier.

In the birdcage-type circularly-polarized RF coil 25 shown in FIG. 23, even when the second capacitor 2 is disposed at an angle of 225° in the clockwise direction with respect to the feeding port 5, the spatial relationship between the two linearly-polarized magnetic fields shown in FIG. 23B does not change, so the same functions as those of the coil shown in FIG. 23 can be performed.

Also, as in the case of the coil shown in FIG. 14, a parallel circuit in which an inductor and capacitor are connected in parallel, may be disposed instead of the second capacitor 2.

Figure 26A:
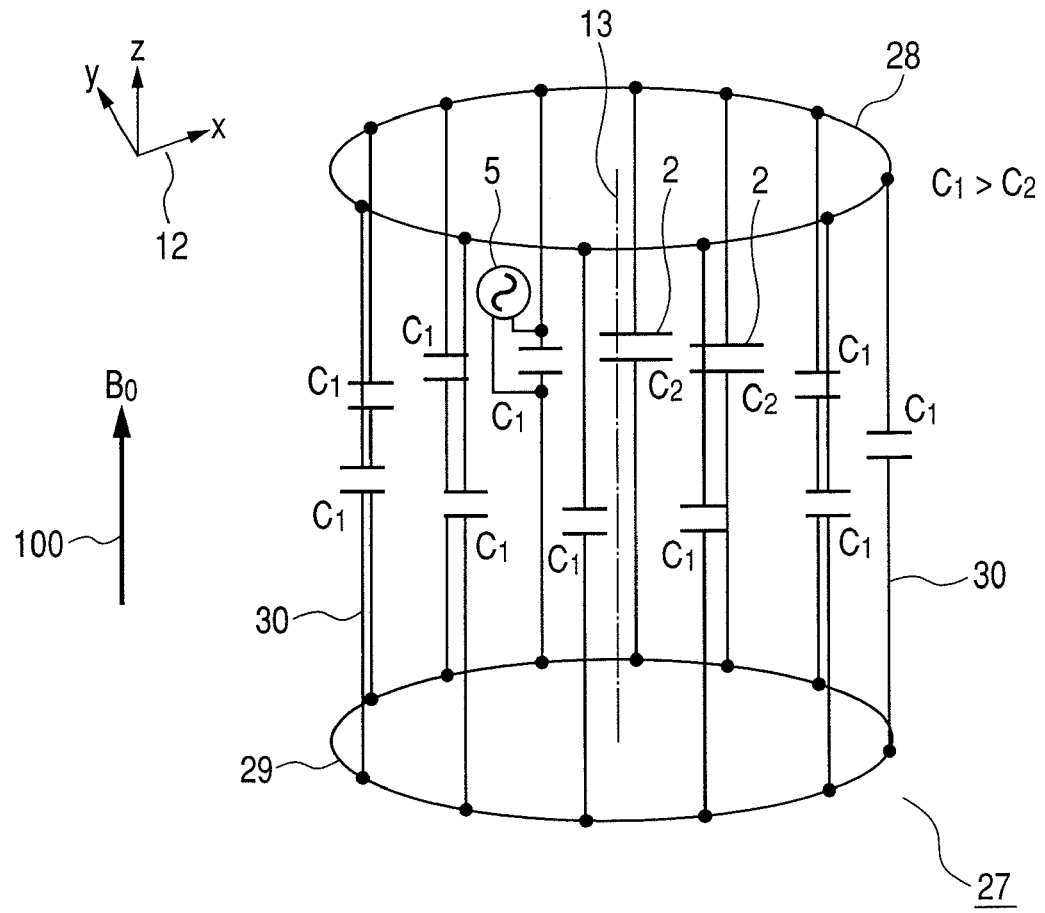
FIG. 26 is a diagram showing a modification of the birdcage-type circularly-polarized RF coil shown in FIG. 19.
Figure 26B:
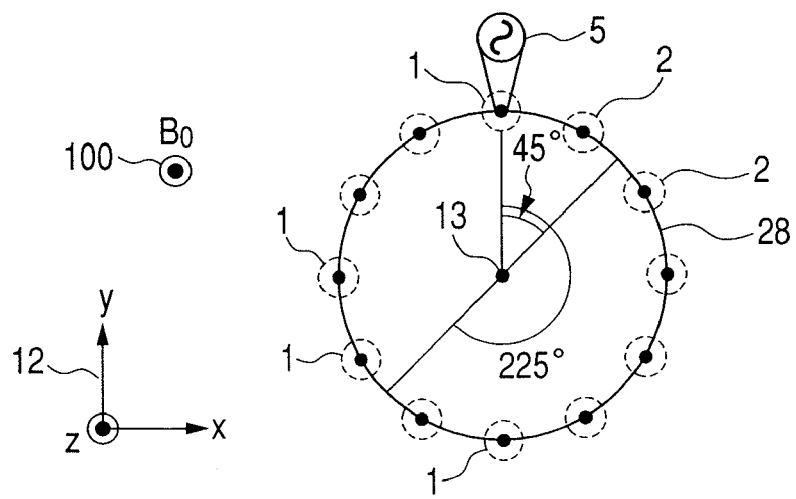

FIG. 26 shows a modification of the birdcage-type circularly-polarized RF coil 25 shown in FIG. 23. This RF coil differs from the embodiment of FIG. 23 in that there are 12 linear conductors 30, ten first capacitors 1 and two second capacitors 2.

Since, when there are 12 linear conductors 30, there are no linear conductors 30 at the 45° or 225° angle position in the clockwise direction with respect to the feeding port 5, the second capacitor 2 cannot be placed there. However, by disposing the second capacitors 2 respectively on two linear conductors 30 on either side of the 45° or 225° angle position in the clockwise direction with respect to the feeding port 5, and adjusting the capacity of the second capacitors 2, a circularly-polarized magnetic field can effectively be generated in the same way as when the second capacitor 2 was disposed at an angle of 45° or 225° in the clockwise direction with respect to the feeding port 5. Therefore, even in the case where there is a multiple of 12 of the linear conductors 30 of the birdcage-type circularly-polarized RF coil 25, the circularly-polarized magnetic field can be generated efficiently by disposing plural second capacitors 2.

Figure 27A:
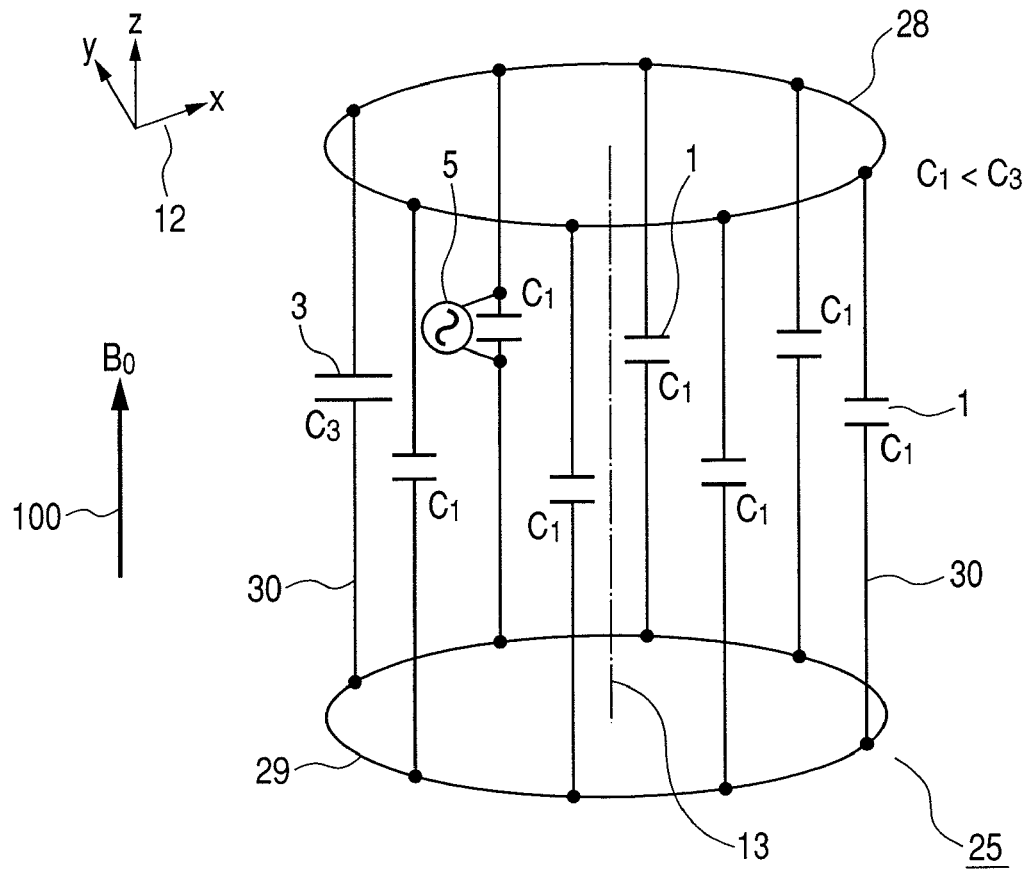
FIG. 27 is a diagram showing another modification of the birdcage-type circularly-polarized RF coil shown in FIG. 19.
Figure 27B:
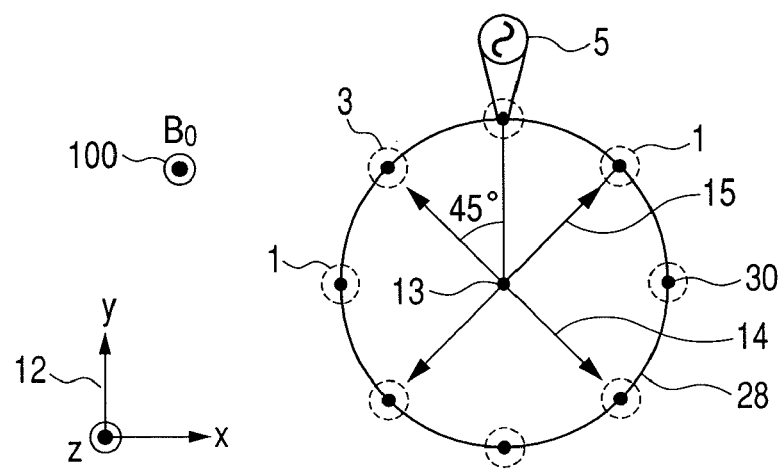

FIG. 27 shows a modification of the birdcage-type circularly-polarized RF coil 25 shown in FIG. 23. This RF coil differs from the embodiment of FIG. 23 in that, instead of the second capacitor 2 shown in FIG. 23, it has a third capacitor 3 whose capacity is larger than the value $C_1$ of the first capacitor 1 and as shown in FIG. 27B, the third capacitor 3 is disposed at a position about 45° in the counterclockwise direction with respect to the central axis of the birdcage-type circularly-polarized RF coil 25 from the feeding port 5 in a cross-section viewed from a direction passing through the static magnetic field 100. Here, "about" means the error in the angle due to manufacturing error.

The value ($C_3$) of the third capacitor 3 of this coil is adjusted so that the value ($C_1$) of the first capacitor 1 satisfies the following equation.

$$\frac{C_3}{C_1} = \left(\frac{Q_{RF}+40}{Q_{RF}}\right)^{\frac{1}{4}} \quad \text{(Equation 14)}$$

$Q_{RF}$ is the Q value of the birdcage-type circularly-polarized RF coil 25 at the resonance frequency $f_c$. Since the Q value takes a positive value, $C_1 < C_3$.

The dimensions of the birdcage-type circularly-polarized RF coil 25 shown in FIG. 27 are for example diameter 30 cm, length 30 cm, the diameters of the loop conductors 28, 29 and linear conductor 30 are 5 mm, and if the Q value of the coil is 50 at a resonance frequency $f_c$=64 MHz, the values ($C_1$, $C_3$) of the first capacitor 1 and third capacitor 3 are respectively 8.8 pF, 10.2 pF.

In the birdcage-type circularly-polarized RF coil 25 shown in FIG. 27, the third capacitor 3 having a larger capacity than the value $C_1$ of the first capacitor 1, is disposed at 45° in the counterclockwise direction with respect to the central axis of the birdcage-type circularly-polarized RF coil 25 from the feeding port 5 in a cross-section viewed from a direction passing through the static magnetic field 100. Therefore, when a RF magnetic field is applied to this coil via the feeding port 5, as shown in FIG. 27B, two linearly-polarized magnetic fields of different frequency are generated in the first direction 14 parallel to a plane orthogonal to the central axis 13 of the coil joining the second capacitor 2 to the central axis of the coil, and the second direction 15 parallel to a plane orthogonal to the central axis of the coil and orthogonal to the first direction, and the first resonance frequency $f_1$ of the first linearly-polarized magnetic field generated in the first direction 14, is lower than the second resonance frequency $f_2$ of the second linearly-polarized magnetic field generated in the second direction 15.

Figure 28:
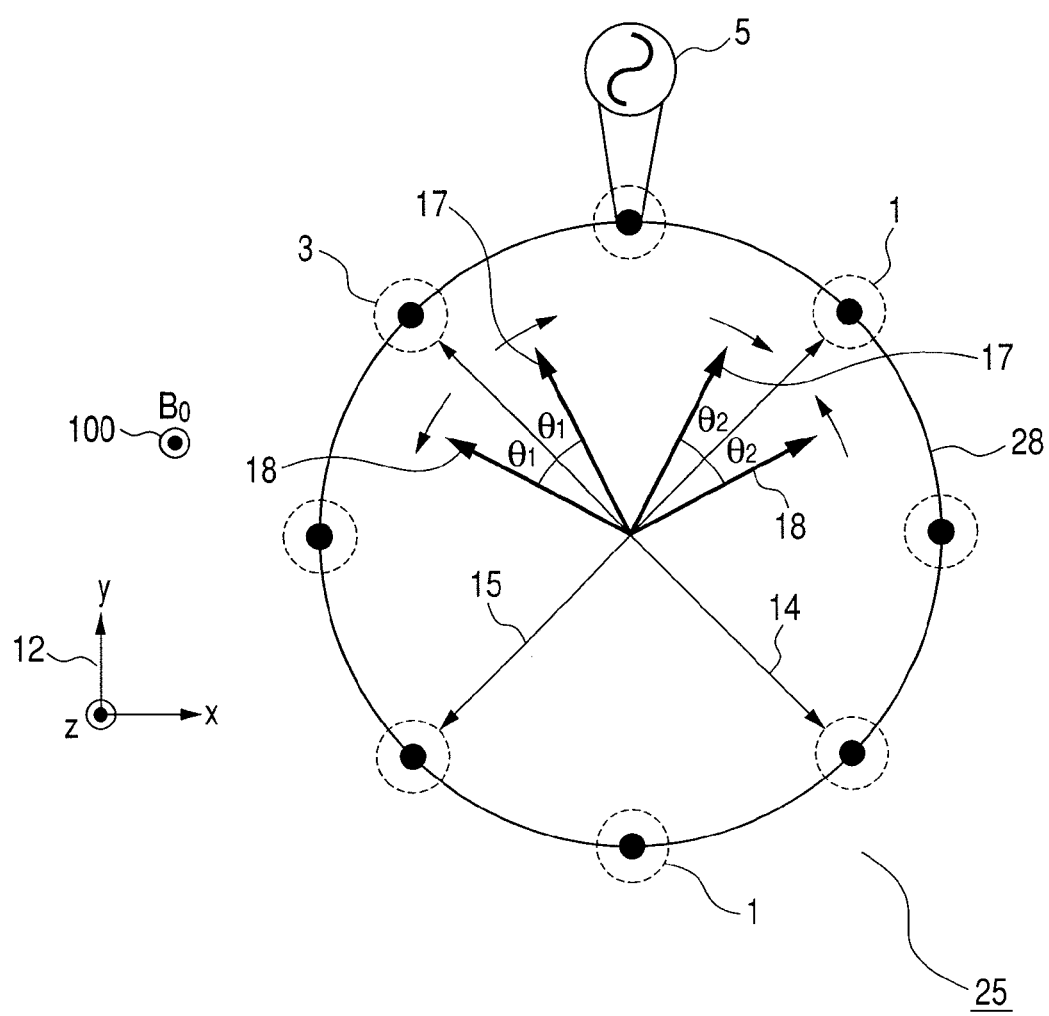
FIG. 28 is a diagram showing another modification of the birdcage-type circularly-polarized RF coil shown in FIG. 23.

At this time, a third resonance frequency $f_3$ is generated between the first resonance frequency $f_1$ and second resonance frequency $f_2$ in the same way as for the birdcage-type circularly-polarized RF coil 25 shown in FIG. 3. In the case of the coil shown in FIG. 27, since the first resonance frequency $f_1$ of the first linearly-polarized magnetic field is lower than the second resonance frequency $f_2$ of the second linearly-polarized magnetic field generated in the second direction 15, the RF magnetic field generated by the coil at the third resonance frequency $f_3$ is a combination of a first linearly-polarized magnetic field whereof the phase is advanced by $\theta_1$, and a second linearly-polarized magnetic field whereof the phase is retarded by $\theta_2$. As a result, the first linearly-polarized magnetic field and the second linearly-polarized magnetic field which are generated in the birdcage-type circularly-polarized RF coil 25 can be expressed as shown in FIG. 28 using vectors. Focusing only on the vectors, FIG. 28 and FIG. 8A have the same vector arrangement. Similarly to the case of the birdcage-type circularly-polarized RF coil 25 shown in FIG. 3, when the phase of $\theta_1$ and $\theta_2$ is 45°, there is only a circularly-polarized vector in the clockwise direction, and similarly to the case where a circularly-polarized magnetic field is generated by a birdcage RF coil using the QD method, a circularly-polarized magnetic field is generated in the clockwise direction by the birdcage-type circularly-polarized RF coil 25.

Figure 29A:
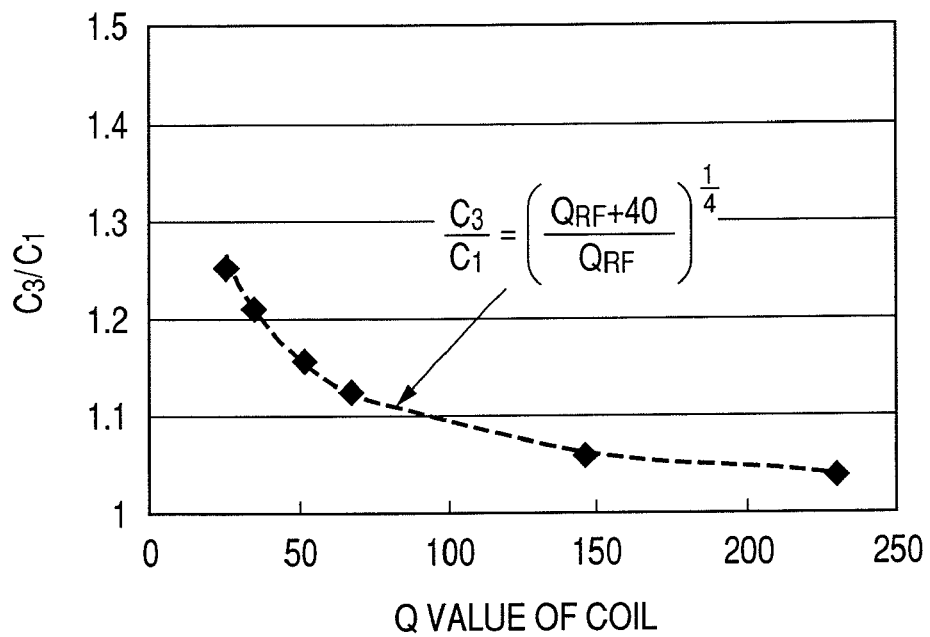
FIG. 29 is a diagram showing the relation between a ratio ($C_3/C_1$) of the first capacitor and second capacitor, and the Q value of the coil, in a birdcage-type circularly-polarized RF coil shown in FIG. 23.

At the resonance frequency $f_c$=64 MHz, the values ($C_1$, $C_3$) of the first capacitor 1 and the third capacitor 3 were found by an electromagnetic field simulation when the birdcage-type circularly-polarized RF coil 25 generates a circularly-polarized magnetic field in a clockwise direction most efficiently. FIG. 29A shows the relation between the ratio ($C_3/C_1$) of the values of the first capacitor 1 and third capacitor 3 and the Q value $Q_{RF}$ of the coil. The ratio ($C_3/C_1$) of the values of the first capacitor 1 and third capacitor 3 tends to increase, asymptotically approaching $C_3/C_1$=1 as the Q value $Q_{RF}$ becomes large. Then, when fitting was performed using a function which takes $Q_{RF}$ as a variable which satisfies $C_3/C_1=\infty$ when $Q_{RF}\to 0$ and $C_3/C_1=1$ when $Q_{RF}\to\infty$, the relation expressed by equation (14) shows the closest value to the value found by simulation. Also for the capacitor value found from an electromagnetic field simulation when the resonance frequency $f_c$=128 MHz, as a result of applying equation (14), good agreement was found as in the case of the resonance frequency $f_c$=64 MHz. Therefore, by using equation (14), the ratio of the values of the first capacitor 1 and third capacitor 3 can be found at which the birdcage-type circularly-polarized RF coil 25, in which the value of the third capacitor 3 is larger than the value of the first capacitor 1, generates a circularly-polarized magnetic field most efficiently.

Figure 29B:
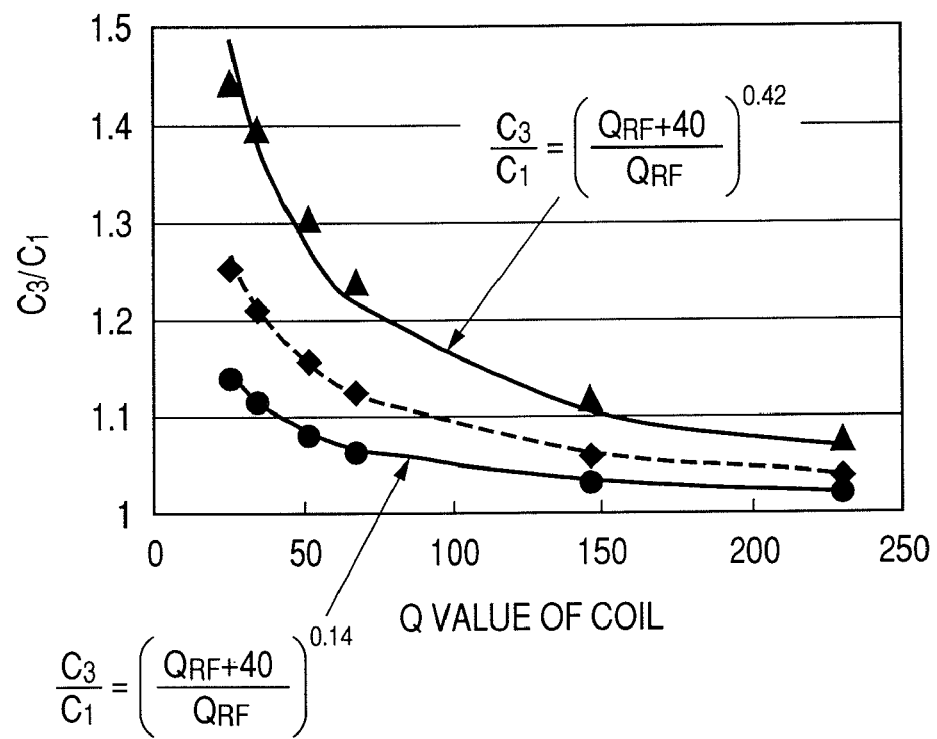

When the values ($C_1$, $C_3$) of the first capacitor 1 and third capacitor 3 for which the strength of the circularly-polarized magnetic field generated by the birdcage-type circularly-polarized RF coil 25 was 95% or more of the maximum value, were found from an electromagnetic field simulation, it was found that, as shown in FIG. 29B, the values ($C_1$, $C_3$) of the first capacitor 1 and third capacitor 3 should satisfy the following equation.

$$\left(\frac{Q_{RF}+40}{Q_{RF}}\right)^{0.14} \leq \frac{C_3}{C_1} \leq \left(\frac{Q_{RF}+40}{Q_{RF}}\right)^{0.42} \quad \text{(Equation 15)}$$

From the above, by disposing the third capacitor 3 at an angle of 45° in the counterclockwise direction with respect to the feeding port 5, selecting the values ($C_1$, $C_3$) of the first capacitor 1 and third capacitor 3 so that their ratio ($C_3/C_1$) satisfies equation (15), and adjusting the value $C_1$ of the first capacitor 1 to resonate at the resonance frequency $f_c$, the birdcage-type circularly-polarized RF coil 25 shown in FIG. 27 generates a circularly-polarized magnetic field efficiently, and by preferably selecting the values ($C_1$, $C_3$) of the first capacitor 1 and third capacitor 3 to satisfy equation (14), it generates a circularly-polarized magnetic field most efficiently. As a result, the same effect is obtained as for the birdcage-type circularly-polarized RF coil 25 shown in FIG. 23.

In the birdcage-type circularly-polarized RF coil 25 shown in FIG. 27, even if the third capacitor 3 is disposed at an angle of 225° in the counterclockwise direction with respect to the feeding port 5, since the spatial relationship between the two linearly-polarized magnetic fields shown in FIG. 27B does not change, the same functions as those of the coil shown in FIG. 27 can be performed.

As in the case of the coil shown in FIG. 20, a serial circuit where in an inductor and capacitor are connected in series may be disposed instead of the third capacitor 3. Also, in the case where there is a multiple of 12 of the linear conductors 30 of the birdcage-type circularly-polarized RF coil 25 shown in FIG. 27, by disposing the third capacitor 3 respectively on two linear conductors 30 adjacent to the 45° or 225° angle position in the counterclockwise direction with respect to the feeding port 5, and adjusting the capacity of the third capacitor 3, a circularly-polarized magnetic field can effectively be generated in the same way as in the case where the third capacitor 3 was disposed in the 45° or 225° angle position in the counterclockwise direction with respect to the feeding port 5.

In the present embodiment, capacitors are disposed only on the linear conductors 30, but a fourth capacitor 4 may also be disposed on the loop conductors 28, 29. At this time, the values of the first capacitor 1, second capacitor 2 and third capacitor 3 change, but the operating principle is the same. Therefore, a coil in which the fourth capacitor 4 is disposed on the loop conductors 28, 29 of the birdcage-type circularly-polarized RF coil 25 shown in FIG. 23 or FIG. 27, can generate a circularly-polarized magnetic field.

Third Embodiment

Figure 30A:
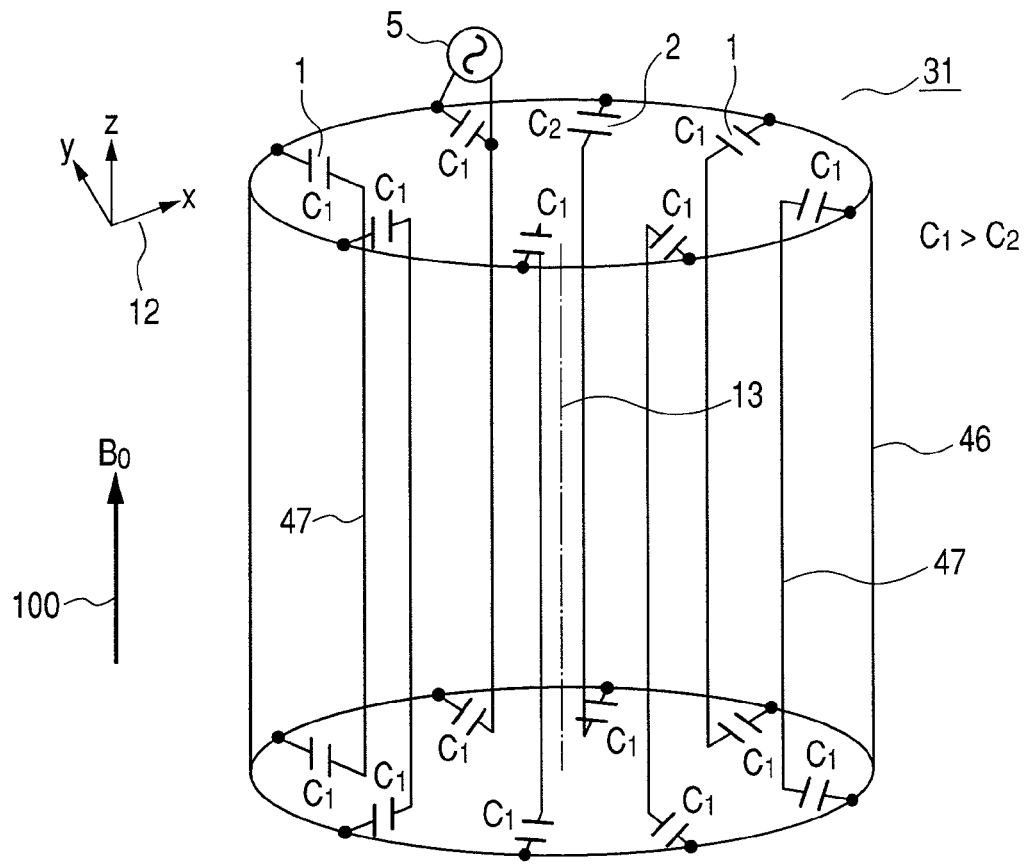
FIG. 30 is a schematic view of a TEM-type circularly-polarized RF coil according to a third embodiment.

A TEM-type circularly-polarized RF coil 31 which is a third embodiment of this invention, will now be described. This RF coil may also be used as a transmit or receive RF coil. FIG. 30 is a diagram showing the construction of this coil. In this TEM-type circularly-polarized RF coil 31, as shown in FIG. 30A, plural (in FIG. 30A, 8) substantially linear conductors 47, which are substantially parallel to the axis of a cylinder conductor 46, are disposed at substantially equidistant intervals in the circumferential direction at a constant distance from the inner surface of the cylinder conductor 46, and their two ends are connected to the inside of the cylinder conductor 46 via connecting conductors. Plural first capacitors 1 and a second capacitor 2 are inserted into the connecting conductors connecting the linear conductors 47 to the cylinder conductor 46, and the feeding port 5 is disposed in one of the first capacitors 1 so that this coil resonates at the magnetic resonance frequency.

Figure 30B:
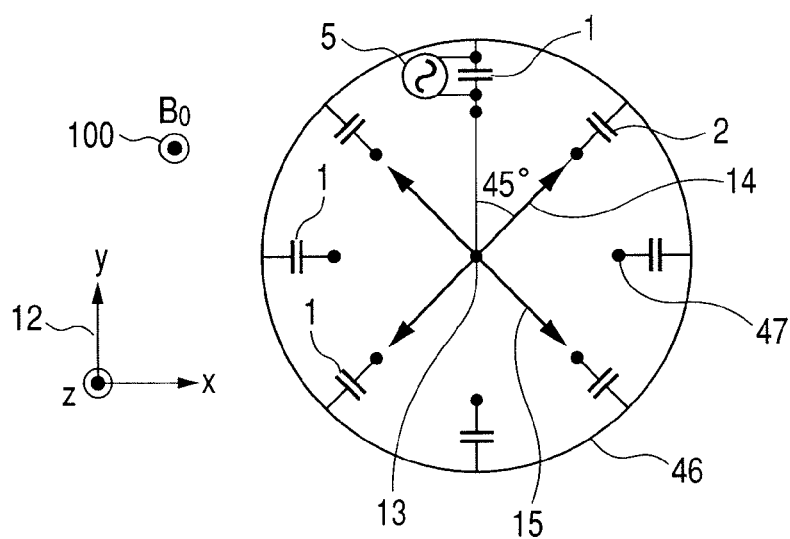

At this time, the second capacitor 2, as shown in FIG. 30B, is disposed at a position about 45° in the clockwise direction with respect to the central axis 13 of the TEM-type circularly-polarized RF coil 31 from the feeding port 5 viewed from a direction passing through the static magnetic field 100. Here, "about" means the error in the angle due to manufacturing error.

The direction of the z axis of the coordinate axes 12 is the same direction as the orientation of the static magnetic field 100 generated by the magnet 101 of the magnetic resonance imaging apparatus. The cylinder conductor 46 shown in FIG. 30A, as can be seen from the spatial relation of the internal plural linear conductors 47, is marked with the lateral surface of the cylinder conductor 46 as being transparent, but the lateral surface of the cylinder conductor 46 is actually covered by a conductor. In FIG. 30A, the inductances of the cylinder conductor 46 and linear conductors 47 themselves are not shown. When used as the transmit RF coil 107 and receive RF coil 114, a circuit in which a PIN diode and inductor are connected in series, is connected in parallel to the capacitor of this coil, and a magnetic decoupling controlled by a magnetic decoupling signal is also added, not shown.

Since this coil resonates at the magnetic resonance frequency of a given element, the values ($C_1$, $C_2$) of the first capacitor 1 and second capacitor 2 in the coil of this embodiment are adjusted to respectively suitable values. Hereafter, an example will be described where the resonance frequency $f_c$ of the coil is the magnetic resonance frequency $f_H$=64 MHz of the proton at a magnetic field strength of 1.5 Tesla.

The value ($C_2$) of the second capacitor 2 is adjusted so that it is less than the value ($C_1$) of the first capacitor 1, and so that the TEM-type circularly-polarized RF coil 31 shown in FIG. 30 resonates at the resonance frequency $f_c$.

Next, the case will be described where the TEM-type circularly-polarized RF coil 31 shown in FIG. 30 functions as a transmit coil.

Figure 31:
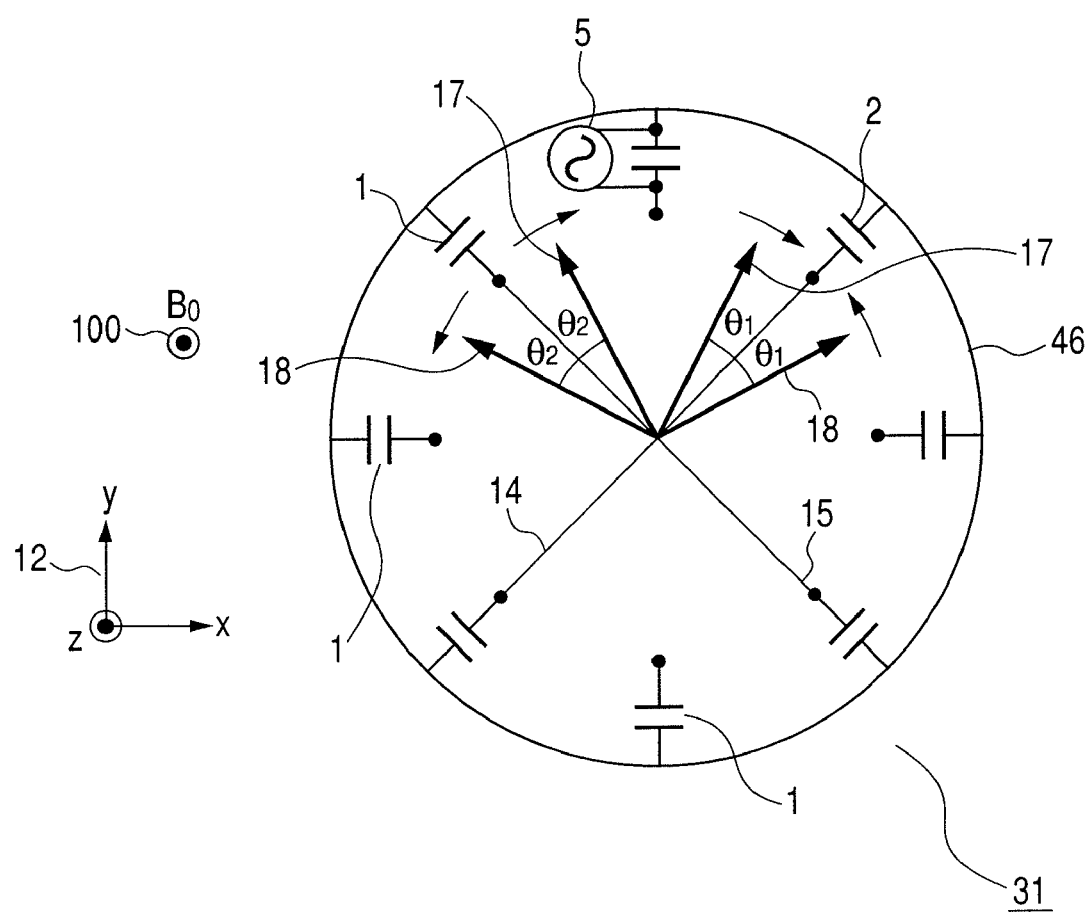
FIG. 31 is a vector diagram of the circularly-polarized magnetic field emitted by the TEM-type circularly-polarized RF coil shown in FIG. 26.

An RF magnetic field, in which the resonance frequency $f_c$ transmitted from the RF magnetic field generator 106 is the center frequency, is applied to the TEM-type circularly-polarized RF coil 31 via the feeding port 5. In the TEM-type circularly-polarized RF coil 31, among the plural capacitors disposed in the linear conductors 47, only the value of the second capacitor 2 is less than that of the first capacitor 1. At this time, in the TEM-type circularly-polarized RF coil 31, two linearly-polarized magnetic fields of different frequency are generated in the first direction 14 parallel to a plane orthogonal to the central axis 13 of the coil joining the second capacitor 2 to the central axis of the coil, and the second direction 15 parallel to a plane orthogonal to the central axis of the coil and orthogonal to the first direction, and the first resonance frequency $f_1$ of the first linearly-polarized magnetic field generated in the first direction 14 is higher than the second resonance frequency $f_2$ of the second linearly-polarized magnetic field generated in the second direction 15. At this time, a third resonance frequency $f_3$ is generated between the first resonance frequency $f_1$ and second resonance frequency $f_2$ in the same way as for the birdcage-type circularly-polarized RF coil 25 shown in FIG. 3. In the case of the coil shown in FIG. 30, since the first resonance frequency $f_1$ of the first linearly-polarized magnetic field is higher than the second resonance frequency $f_2$ of the second linearly-polarized magnetic field generated in the second direction 15, the RF magnetic field generated by the coil at the third resonance frequency $f_3$ is a combination of a first linearly-polarized magnetic field whereof the phase is retarded by $\theta_1$, and a second linearly-polarized magnetic field whereof the phase is advanced by $\theta_2$. As a result, the first linearly-polarized magnetic field and the second linearly-polarized magnetic field generated in the TEM-type circularly-polarized RF coil 31 can be expressed as shown in FIG. 31 using vectors. Focusing only on the vectors, FIG. 31 and FIG. 8A have the same vector arrangement. Similarly to the case of the birdcage-type circularly-polarized RF coil 25 shown in FIG. 3, when the phase of $\theta_1$ and $\theta_2$ is 45°, there is only a circularly-polarized vector in the clockwise direction, and similarly to the case where a circularly-polarized magnetic field is generated by a birdcage RF coil using the QD method, the TEM-type circularly-polarized RF coil 31 generates a circularly-polarized magnetic field in the clockwise direction.

As described above, the TEM-type circularly-polarized RF coil 31 of this embodiment can also function as an RF coil which can generate a circularly-polarized magnetic field with one feeding port, and the same effect is obtained as with the birdcage-type circularly-polarized RF coil 25 shown in the first embodiment. Also, compared to the birdcage RF coil, the TEM coil radiates a RF magnetic field with high efficiency even at a higher frequencies, and detects a magnetic resonance signal with high sensitivity, so even in a high magnetic field strength of 3 Tesla or higher, it can function stably as an RF coil.

In the TEM-type circularly-polarized RF coil 31 shown in FIG. 30, even if the second capacitor 2 is disposed at an angle of 225° in the clockwise direction with respect to the feeding port 5, the spatial relationship of the two linearly-polarized magnetic fields shown in FIG. 30B does not change, so the coil shown in FIG. 30 can perform the same functions.

Also, as in the case of the coil shown in FIG. 14, a parallel circuit in which an inductor and capacitor are connected in parallel, may be disposed instead of the second capacitor 2.

Figure 32A:
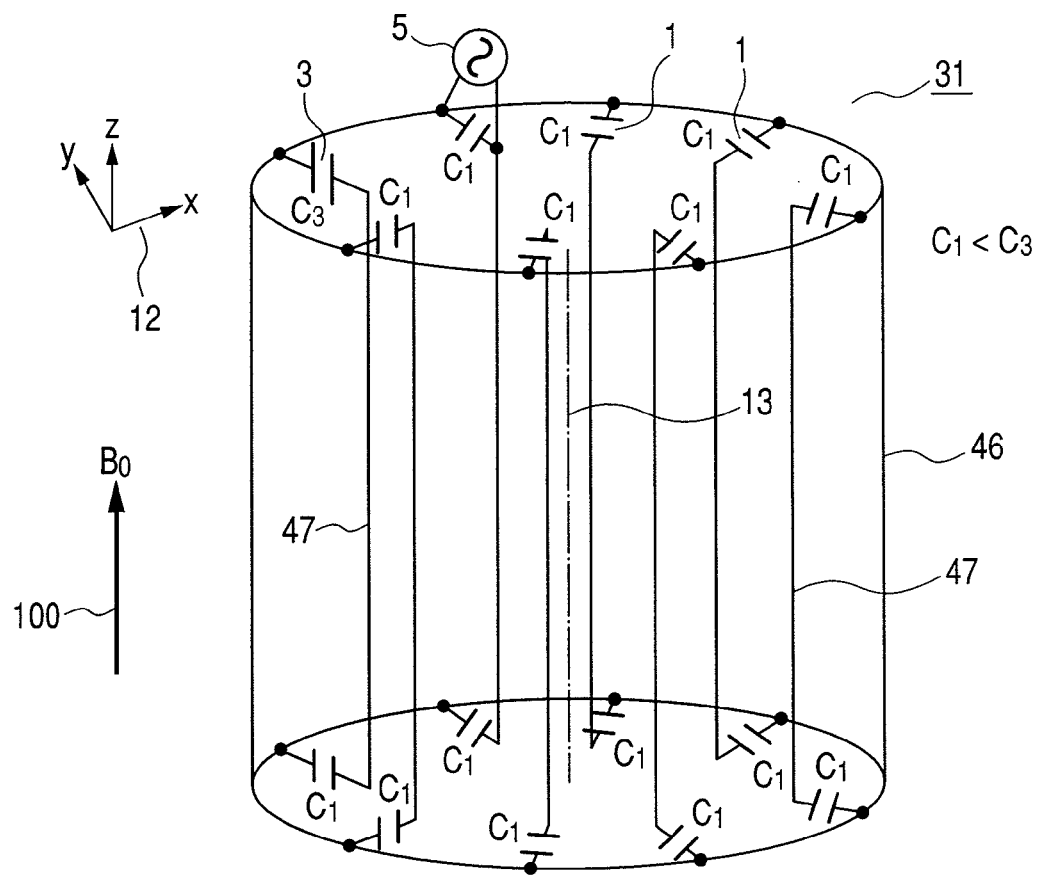
FIG. 32 is a diagram of a modification of the TEM-type circularly-polarized RF coil shown in FIG. 26.

FIG. 32 shows a modification of the TEM-type circularly-polarized RF coil 31 shown in FIG. 30. This RF coil is different from the embodiment of FIG. 30 in that, instead of the second capacitor 2 shown in FIG. 30, it has a third capacitor 3 whose capacity is larger than the value $C_1$ of the first capacitor 1, and as shown in 32B, the third capacitor 3 is disposed at a position 45° in the counterclockwise direction with respect to the central axis of the birdcage-type circularly-polarized RF coil 25 from the feeding port 5 in a cross-section viewed from a direction passing through the static magnetic field 100.

When a radiofrequency voltage having the resonance frequency f, transmitted from the RF magnetic field generator 106 as center frequency, is applied to the TEM-type circularly-polarized RF coil 31 via the feeding port 5, among plural capacitors disposed in the linear conductors 47, only the value of the third capacitor 3 is larger than the value of the first capacitor 1, so in the TEM-type circularly-polarized RF coil 31, two linearly-polarized magnetic fields of different frequency are generated in the first direction 14 parallel to a plane orthogonal to the central axis 13 of the coil joining the third capacitor 3 to the central axis of the coil, and the second direction 15 parallel to a plane orthogonal to the central axis of the coil orthogonal to the first direction, and the first resonance frequency $f_1$ of the first linearly-polarized magnetic field generated in the first direction 14, is lower than the second resonance frequency $f_2$ of the second linearly-polarized magnetic field generated in the second direction 15. At this time, a third resonance frequency $f_3$ is generated between the first resonance frequency $f_1$ and second resonance frequency $f_2$ in the same way as for the TEM-type circularly-polarized RF coil 31 shown in FIG. 30. In the case of the coil shown in FIG. 32, since the first resonance frequency $f_1$ of the first linearly-polarized magnetic field is lower than the second resonance frequency $f_2$ of the second linearly-polarized magnetic field generated in the second direction 15, the RF magnetic field generated by the coil at the third resonance frequency $f_3$ is a combination of a first linearly-polarized magnetic field whereof the phase is advanced by $\theta_1$, and a second linearly-polarized magnetic field where of the phase is retarded by $\theta_2$. Hence, from the spatial relationship between the feeding port 5 and third capacitor 3, similarly to the case of the birdcage-type circularly-polarized RF coil 25 shown in FIG. 3, when the phase of $\theta_1$ and $\theta_2$ is 45°, there is only a circularly-polarized vector in the clockwise direction, and similarly to the case where a circularly-polarized magnetic field is generated by a birdcage RF coil using the QD method, a circularly-polarized magnetic field is generated in the clockwise direction by the TEM-type circularly-polarized RF coil 31. Therefore, the same effect is obtained as with the TEM-type circularly-polarized RF coil 31 shown in FIG. 30.

Figure 32B:
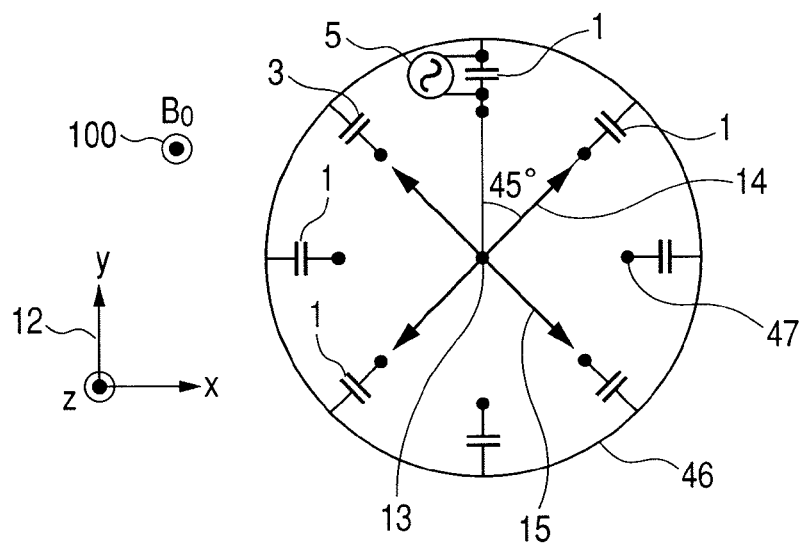

In the TEM-type circularly-polarized RF coil 31 shown in FIG. 32, even when the third capacitor 3 is disposed at an angle of 225° in the counterclockwise direction with respect to the feeding port 5, the spatial relationship of the two linearly-polarized magnetic fields shown in FIG. 32B does not change, so the same functions as those of the coil shown in FIG. 32 can be performed.

Also, in the same way as the coil shown in FIG. 20, a serial circuit 9 including an inductor and a capacitor may be disposed instead of the third capacitor 3.

Fourth Embodiment

Figure 33A:
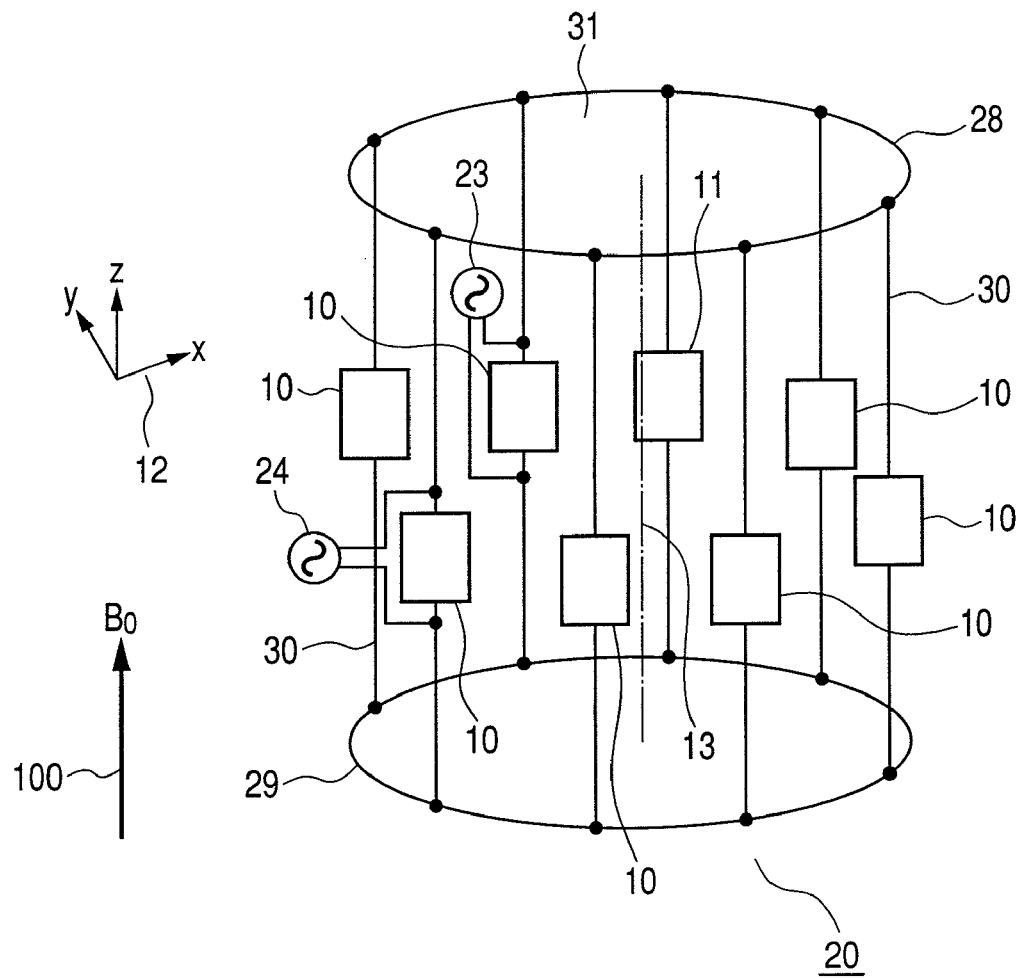
FIG. 33 is a schematic diagram of a double-tuned birdcage-type circularly-polarized RF coil according to a fourth embodiment.
Figure 33B:
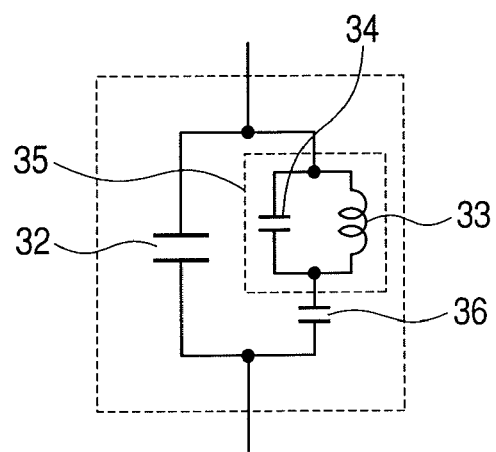

FIG. 33 shows the construction of a double-tuned birdcage-type circularly-polarized RF coil 20 according to a fourth embodiment of the invention. In the double-tuned birdcage-type circularly-polarized RF coil 20, the two loop conductors 28, 29 shown in FIG. 33A are disposed facing each other with an axis orthogonal to the loop plane as a common axis, and plural (in FIG. 33, 8) linear conductors 30 parallel to the axial direction of the loop conductors 28, 29 are connected thereto. Plural first double-tuned circuits and second double-tuned circuits 11 are inserted into these plural linear conductors 30 so that this coil resonates at two magnetic resonance frequencies. The first double-tuned circuit 10 and second double-tuned circuit 11 include a circuit in which a parallel resonance circuit 35 including a capacitor 34 and inductor 33 is connected in series to a capacitor 36, and a capacitor 32, shown in FIG. 33B.

This coil has a first feeding port 23 which supplies the signal of a first resonance frequency $f_{c1}$ and a second feeding port 24 which supplies the signal of a second resonance frequency $f_{c2}$ disposed in the first double-tuned circuit 10, and as shown in FIG. 33A, the second feeding port 24 is disposed at a position 90° in the counterclockwise direction relative to the central axis of the coil from the first feeding port 23 in a cross-section viewed from a direction passing through the static magnetic field 100. Also, the second double-tuned circuit 11 is disposed at a position 45° in the clockwise direction with respect to the central axis 13 of the coil from the first feeding port 23 in a cross-section viewed from a direction passing through the static magnetic field 100.

The capacitors 32, 34, 36 and inductor 33 forming the first double-tuned circuit 10 and second double-tuned circuit 11 in the coil of this embodiment are respectively adjusted to suitable values so that the coil resonates at two magnetic resonance frequencies. Hereafter, an example will be described in which, among the two resonance frequencies, the first resonance frequency $f_{c1}$ which is the higher frequency, is a magnetic resonance frequency of 64 MHz of the proton at a magnetic field strength of 1.5 Tesla, and the second resonance frequency $f_{c2}$ which is the lower frequency, is a magnetic resonance frequency of 60 MHz of the fluorine atom at a magnetic field strength of 1.5 Tesla.

At this time, the first double-tuned circuit 10 is adjusted to have a capacity of $C_{c1}$ at the first resonance frequency $f_{c1}$, and to have a capacity of $C_{c2}$ at the second resonance frequency $f_{c2}$. Also, the second double-tuned circuit 11 is adjusted to have a capacity of $C_{c3}$ at the first resonance frequency $f_{c1}$, and to have a capacity of $C_{c4}$ at the second resonance frequency $f_{c2}$. $C_{c1}$, $C_{c2}$, $C_{c3}$, $C_{c4}$ are adjusted by the inductor 33 and capacitors 32, 34, 36 so that $C_{c1}$, $C_{c2}$, $C_{c3}$, $C_{c4}$ satisfy the relations $C_{c4} > C_{c2} > C_{c1} > C_{c3}$, $C_{c3}/C_{c1}$ satisfies equation (12) when $C_{c3} = C_2$, $C_{c1} = C_1$, and $C_{c4}/C_{c2}$ satisfies equation (14) when $C_{c4} = C_3$, $C_{c2} = C_1$.

In FIG. 33, the inductances of the loop conductors 28, 29 and linear conductors 30 are not shown. Also when the coil is used as the transmit RF coil 107 and receive RF coil 114, a circuit in which a PIN diode and an inductor are connected in series, is connected in parallel to the capacitor of the coil, and a magnetic decoupling controlled by a magnetic decoupling signal is added, not shown.

Next, an example will be described where the double-tuned birdcage-type circularly-polarized RF coil 20 shown in FIG. 33 functions as a transmit coil.

First, when a radiofrequency voltage having the first resonance frequency $f_{c1}$ transmitted from the RF magnetic field generator 106 as center frequency, is applied to the double tuned birdcage-type circularly-polarized RF coil 20 via the first feeding port 23, the first double-tuned circuit 10 functions as a capacitor having the value $C_{c1}$, and the second double-tuned circuit 11 functions as a capacitor having the value $C_{c3}$. At this time, $C_{c3}$ which is a smaller value than $C_{c1}$ is disposed at the 45° position in the clockwise direction with respect to the central axis of the coil from the first feeding port 23, and since $C_{c3}/C_{c1}$ satisfies equation (12), this coil has an identical construction to the birdcage-type circularly-polarized RF coil 25 shown in FIG. 23. Therefore, this coil generates a circularly-polarized at the first resonance frequency $f_{c1}$.

Also, when a radiofrequency voltage having the second resonance frequency $f_{c2}$ transmitted from the RF magnetic field generator 106 as center frequency, is applied to the double-tuned birdcage-type circularly-polarized RF coil 20 via the second feeding port 24, the first double-tuned circuit 10 functions as a capacitor having the value $C_{c2}$, and the second double-tuned circuit 11 functions as a capacitor having the value $C_{c4}$ At this time, $C_{c4}$ which is a larger value than $C_{c2}$ is disposed at the 225° position in the counterclockwise direction with respect to the central axis of the coil from the second feeding port 23, and since $C_{c4}/C_{c2}$ satisfies equation (14), this coil has an identical construction to the birdcage-type circularly-polarized RF coil 25 shown in FIG. 27. Therefore, this coil generates a circularly-polarized magnetic field at the second resonance frequency $f_{c2}$. Therefore, the double-tuned birdcage-type circularly-polarized RF coil 20 shown in FIG. 33 generates a circularly-polarized magnetic field at the first and second resonance frequencies ($f_{c1}$, $f_{c2}$).

In this embodiment, the case was described where the second double-tuned circuit 11 was disposed at a position 45° in the clockwise direction with respect to the central axis 13 of the coil from the first feeding port 23, but even if the second double-tuned circuit 11 is disposed a position 225° in the clockwise direction with respect to the central axis 13 of the coil from the first feeding port 23 in a cross-section viewed from a direction passing through the static magnetic field 100, the spatial relationship of the two linearly-polarized magnetic fields generated by the double tuned birdcage-type circularly-polarized RF coil 20 does not change, so the same functions as those of the double-tuned circularly-polarized RF coil 20 shown in FIG. 33 can be performed.

As described above, according to this embodiment, a circularly-polarized magnetic field is generated at the first and second resonance frequencies ($f_{c1}$, $f_{c2}$) using two feeding ports for one coil. Therefore, the number of feeding ports which was four in the prior art can be reduced to half, and the number of components in the transmit system can be reduced to half or less. Hence, adjustment of the transmit system is easier, and manufacturing costs can be lowered. Further, since there is only one feeding port to the coil, a divider or phase shifter is not used, so decrease of orthogonality due to scatter in components or mechanical distortion of the coil can be reduced, decrease in Signal-To-Noise ratio of the coil due to phase shift of a phase shifter can be suppressed, and the transmit efficiency and sensitivity of the RF coil are enhanced compared to the prior art.

Figure 34A:
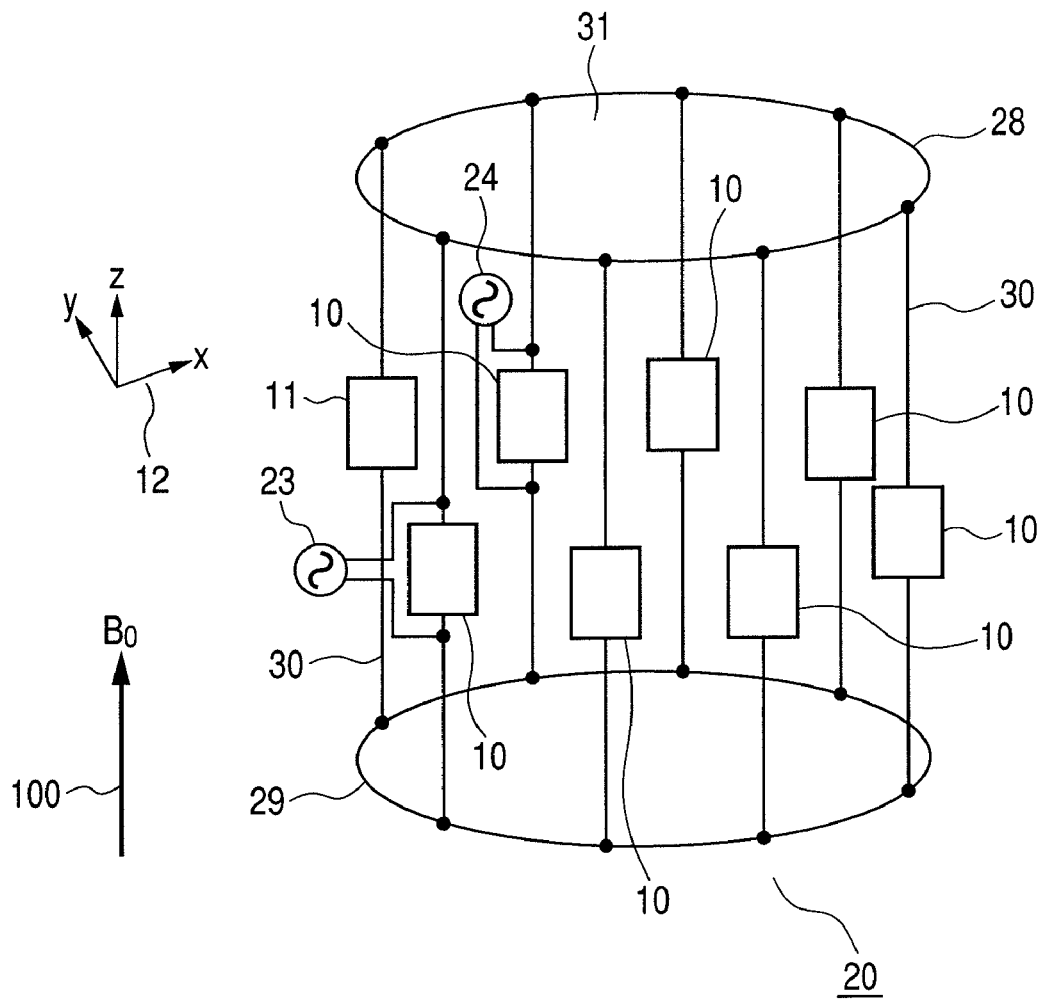
FIG. 34 is a diagram of a modification of the double-tuned birdcage-type circularly-polarized RF coil shown in FIG. 29.
Figure 34B:
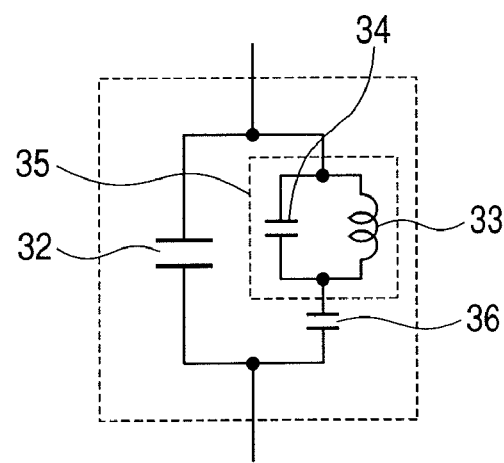
Figure 35:
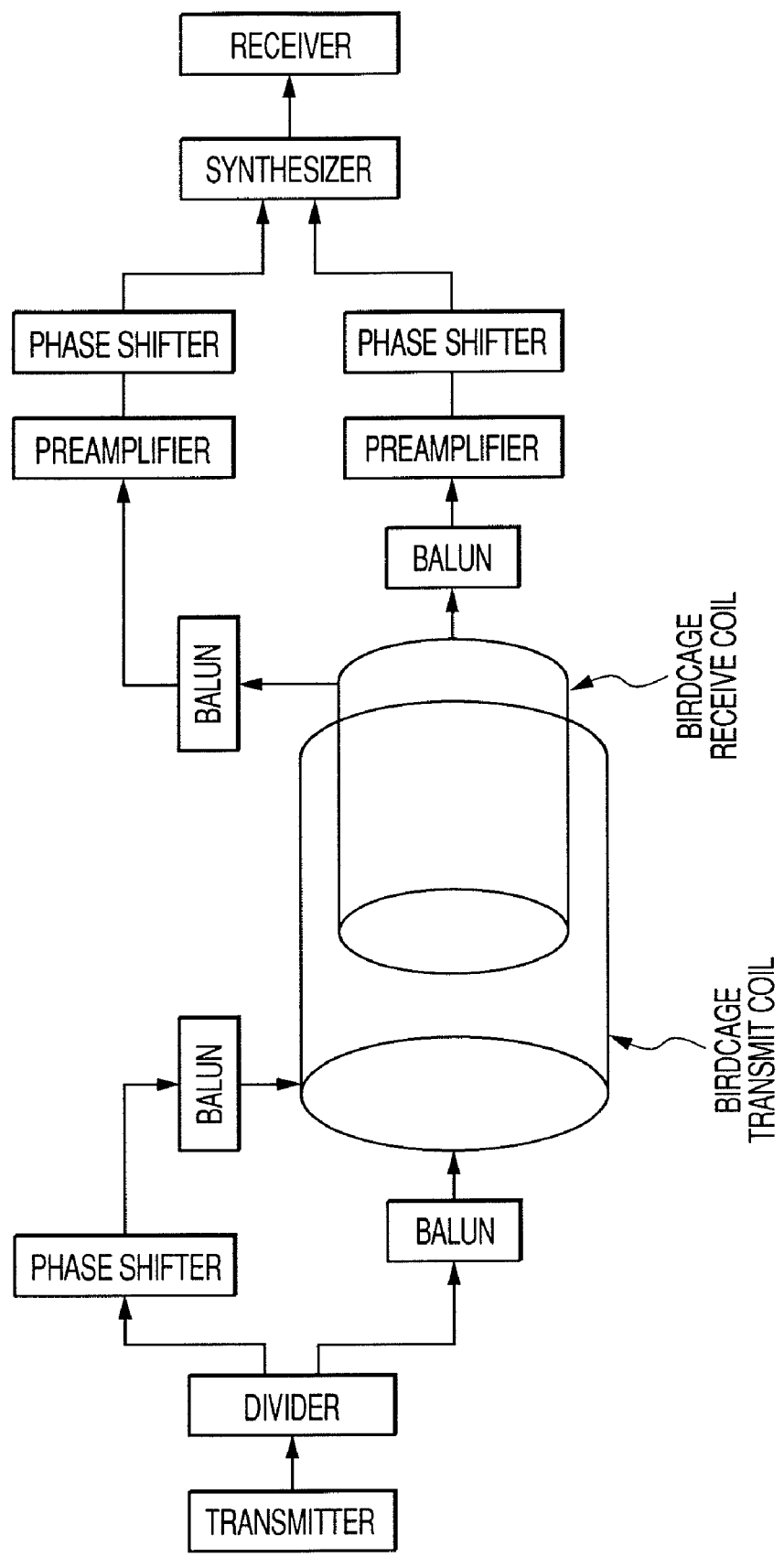
FIG. 35 is a diagram showing a connection relation between a transceive birdcage-type circularly-polarized RF coil according to the prior art, and a transmitter/receiver.

FIG. 34 shows a modification of the double-tuned birdcage-type circularly-polarized RF coil 20 shown in FIG. 33. In this RF coil, the difference from the embodiment of FIG. 33 is that the second feeding port 24 is disposed at a position 90° in the clockwise direction with respect to the central axis of the coil from the first feeding port 23 in a cross-section viewed from a direction passing through the static magnetic field 100.

When the radiofrequency voltage having the first resonance frequency $f_{c1}$ transmitted from the RF magnetic field generator 106 as its center frequency is applied to the double-tuned birdcage-type circularly-polarized RF coil 20 shown in FIG. 34 via the first feeding port 23, the first double-tuned circuit 10 functions as a capacitor having the value $C_{c1}$, and the second double-tuned circuit 11 functions as a capacitor having a value $C_{c3}$.

At this time, since $C_{c3}$ which is lower than $C_{c1}$ is disposed at a position 45° in the clockwise direction with respect to the central axis of the coil from the first feeding port 23, and $C_{c3}/C_{c1}$ satisfies equation (12), this coil has the same construction as the birdcage-type circularly-polarized RF coil 25 shown in FIG. 23. Therefore, this coil generates a circularly-polarized magnetic field at the first resonance frequency $f_{c1}$.

Also, when a radiofrequency voltage having the second resonance frequency $f_{c2}$ transmitted from the RF magnetic field generator 106 as its center frequency is applied to the double-tuned birdcage-type circularly-polarized RF coil 20 shown in FIG. 34 via the second feeding port 24, the first double-tuned circuit 10 functions as a capacitor having the value $C_{c2}$, and the second double-tuned circuit 11 functions as a capacitor having a value $C_{c4}$.

At this time, since $C_{c4}$ which is higher than $C_{c2}$ is disposed at a position 45° in the counterclockwise direction with respect to the central axis of the coil from the second feeding port 24, and $C_{c4}/C_{c2}$ satisfies equation (14), this coil has the same construction as the birdcage-type circularly-polarized RF coil 25 shown in FIG. 27. Therefore, this coil generates a circularly-polarized magnetic field at the second resonance frequency $f_{c2}$. Therefore, the double tuned birdcage-type circularly-polarized RF coil 20 shown in FIG. 34 can generate a circularly-polarized magnetic field at the first and second resonance frequencies ($f_{c1}$, $f_{c2}$), and the same effect as that of the double-tuned birdcage-type circularly-polarized RF coil 20 shown in FIG. 33 can be obtained.

In the example of the double-tuned birdcage-type circularly-polarized RF coil 20 shown in FIG. 34, the case was described where the second double-tuned circuit 11 was disposed at a position 45° in the clockwise direction with respect to the central axis 13 of the coil from the first feeding port 23, but even if the second double-tuned circuit 11 is disposed at a position 225° in the clockwise direction with respect to the central axis 13 of the coil from the first feeding port in a cross-section viewed from a direction passing through the static magnetic field 100, the spatial relationship of the two linearly-polarized magnetic fields generated by the double-tuned birdcage-type circularly-polarized RF coil 20 does not change, so the same functions as those of the double-tuned birdcage-type circularly-polarized RF coil 20 shown in FIG. 34 can be performed.

Further, in this embodiment, the case was described where the first double-tuned circuit 10 and second double-tuned circuit 11 were disposed in the linear conductors 30, but likewise, even if the first double-tuned circuit 10 and second double-tuned circuit 11 are disposed in the loop conductors 28, 29, or the first double-tuned circuit 10 and second double-tuned circuit 11 are disposed in the plural linear conductors 47 of the TEM-type circularly-polarized RF coil shown in FIG. 30, a circularly-polarized magnetic field can be generated at the first and second resonance frequencies ($f_{c1}$, $f_{c2}$) as in the case of FIG. 33.

Above, the invention was described for each embodiment, but the invention may also have the following construction. The RF coil of the invention is typically an RF coil in which a static magnetic field is effectively applied in the direction of the central axis of a cylindrical shape, the RF coil further including plural capacitors disposed at circumferential positions in at least one cross-section effectively orthogonal to the direction of the static magnetic field, in which the plural capacitors may include plural first capacitors, and at least one second capacitor disposed at a position from 22.5° to 67.5° or 202.5° to 247.5° in a clockwise direction with respect to the center of the cylindrical shape from the feeding port in a cross-section viewed from a direction passing through the static magnetic field, the second capacitor having a smaller capacity than the capacity of the first capacitor.

Alternatively, the RF coil is typically an RF coil in which a static magnetic field is effectively applied in the direction of the central axis of a cylindrical shape, the RF coil further including plural capacitors disposed at circumferential positions in at least one cross-section which is effectively orthogonal to the direction of the static magnetic field, in which the plural capacitors may include plural first capacitors, and at least one third capacitor disposed at a position from 22.5° to 67.5° or 202.5° to 247.5° in a counterclockwise direction with respect to the center of the cylindrical shape from the feeding port in a cross-section viewed from a direction passing through the static magnetic field, the third capacitor having a larger capacity than the capacity of the first capacitor.

The RF coil of the invention may include a parallel circuit including an inductor and capacitor instead of the second capacitor.

The RF coil of the invention may include a serial circuit including an inductor and capacitor instead of the third capacitor.

The RF coil of the invention may be applied specifically to a cylindrical coil such as a birdcage coil or TEM coil.

In the case of a birdcage coil, it can be applied to a low-pass birdcage coil in which plural capacitors are respectively disposed in plural linear conductors, to a high pass birdcage coil in which the plural capacitors are respectively inserted between the connection points of at least one of the aforesaid loop conductors and plural linear conductors, or to a bandwidth pass birdcage coil in which the plural capacitors are respectively inserted between the connection points of at least one of the aforesaid loop conductors and plural linear conductors, and in the plural linear conductors.

In the case of the aforesaid low-pass birdcage coil, the Q value $Q_{RF}$ of the coil, capacity $C_1$ of the first capacitor and capacity of the third capacitor $C_3$, may have the relation:

$$\frac{C_3}{C_1} = \left(\frac{Q_{RF} + 40}{Q_{RF}}\right)^{\frac{1}{4}}$$

while the Q value $Q_{RF}$ of the coil, capacity $C_1$ of the first capacitor and capacity of the second capacitor $C_2$, may have the relation:

$$\frac{C_2}{C_1} = \left(\frac{Q_{RF}}{Q_{RF} + 5}\right)^2$$

In the case of the aforesaid high-pass birdcage coil, the Q value $Q_{RF}$ of the coil, capacity $C_1$ of the first capacitor and capacity of the third capacitor $C_3$, may have the relation:

$$\frac{C_3}{C_1} = \left(\frac{Q_{RF} + 15}{Q_{RF}}\right)$$

while the Q value $Q_{RF}$ of the coil, capacity $C_1$ of the first capacitor and capacity of the second capacitor $C_2$, may have the relation:

$$\frac{C_2}{C_1} = \left(\frac{Q_{RF}}{Q_{RF} + 150}\right)^{\frac{1}{8}}$$

In the RF coil of the invention, the second capacitor may be disposed at an angle of about 45° or about 225° in the clockwise direction with respect to the center of the cylindrical shape from the feeding port in the aforesaid cross-section viewed from a direction passing through the static magnetic field. Here, "about" means the error in the angle due to manufacturing error.

In the RF coil of the invention, the third capacitor may be disposed at an angle of about 45° or about 225° in the counterclockwise direction with respect to the center of the cylindrical shape from the feeding port in the aforesaid cross-section viewed from a direction passing through the static magnetic field. Here, "about" means the error in the angle due to manufacturing error.

As an example of the RF coil of the invention, the RF coil has a cylindrical shape, in which a static magnetic field is applied in effectively the same direction as the direction of the central axis of the cylindrical shape, and includes plural double-tuned circuits disposed circumferentially in at least one cross-section effectively orthogonal to the direction of the static magnetic field for the purpose of resonating with a first resonance frequency and a second resonance frequency, a first feeding port which feeds a first resonance frequency signal, and a second feeding port which feeds a second resonance frequency signal, in which the second feeding port is disposed at a position 90° in the counterclockwise direction with respect to the center of the cylindrical shape from the first feeding port in the cross-section viewed from a direction passing through the static magnetic field, and the plural double-tuned circuits include plural first double-tuned circuits in which, when the first resonance frequency is higher than the second resonance frequency, the first capacity at the first resonance frequency shows a smaller value than the second capacity at the second resonance frequency, and a second double-tuned circuit disposed at a position 22.5° to 67.5° or 202.5° to 247.5° in the clockwise direction with respect to the center of the cylindrical shape from the first feeding port in a cross-section viewed in a direction passing through the static magnetic field, showing a smaller capacity than the first capacity at the first resonance frequency and showing a larger capacity than the second capacity at the second resonance frequency.

As another example of the RF coil of the invention, the RF coil has a cylindrical shape, in which a static magnetic field is applied in effectively the same direction as the direction of the central axis of the cylindrical shape, and includes plural double-tuned circuits disposed circumferentially in at least one cross-section effectively orthogonal to the direction of the static magnetic field for the purpose of resonating with a first resonance frequency and a second resonance frequency, a first feeding port which feeds a first resonance frequency signal, and a second feeding port which feeds a second resonance frequency signal, in which the second feeding port is disposed at a position 90° in the clockwise direction with respect to the center of the cylindrical shape from the first feeding port in the cross-section viewed from a direction passing through the static magnetic field, and the plural double-tuned circuits include plural first double-tuned circuits in which, when the first resonance frequency is higher than the second resonance frequency, the first capacity at the first resonance frequency shows a smaller value than the second capacity at the second resonance frequency, and a second double-tuned circuit disposed at a position 22.5° to 67.5° or 202.5° to 247.5° in the clockwise direction with respect to the center of the cylindrical shape from the first feeding port in a cross-section viewed in a direction passing through the static magnetic field, showing a smaller capacity than the first capacity at the first resonance frequency and showing a larger capacity than the second capacity at the second resonance frequency.

A magnetic resonance imaging apparatus, as an example, may use the aforesaid RF coil according to the invention comprising a static magnetic field providing instrument which forms a static magnetic field, gradient magnetic field providing instrument which forms a gradient magnetic field, RF magnetic field providing instrument which forms a RF magnetic field, a transmit coil which applies a RF magnetic field to a test subject, a receive coil which detects a magnetic resonance signal from the test subject, a receive instrument which receives a magnetic resonance signal, and a control instrument which controls the gradient magnetic field providing instrument, RF magnetic field providing instrument and receive instrument, the RF coil being used as at least one of a transmit coil and a receive coil. In this case, in the RF coil of the invention, a decoupling circuit which is in the open state at the magnetic resonance frequency of the magnetic resonance signal of the test subject to be measured, may be connected to the plural capacitors.

What is claimed is:

1. An RF coil having a cylindrical shape, wherein a static magnetic field is applied in effectively the same direction as direction of the central axis of the cylindrical shape, comprising:
    plural double-tuned circuits disposed circumferentially in at least one cross-section effectively orthogonal to the direction of the static magnetic field for the purpose of resonating with a first resonance frequency and a second resonance frequency;
    a first feeding port which feeds a first resonance frequency signal; and
    a second feeding port which feeds a second resonance frequency signal;
    wherein the second feeding port is disposed at a position 90° in the counterclockwise direction with respect to the center of the cylindrical shape from the first feeding port in a cross-section viewed from a direction passing through the static magnetic field; and
    wherein the plural double-tuned circuits comprise:
    plural first double-tuned circuits, wherein for each of the plural first double-tuned circuits, when the first resonance frequency is higher than the second resonance frequency, the first capacity of the first double-tuned circuit at the first resonance frequency shows a smaller value than the second capacity of the first double-tuned circuit at the second resonance frequency; and
    a second double-tuned circuit disposed at a position 22.5° to 67.5° or 202.5° to 247.5° in the clockwise direction with respect to the center of the cylindrical shape from the first feeding port in a cross-section viewed in a direction passing through the static magnetic field, and showing a smaller capacity than the first capacity of the first double-tuned circuit at the first resonance frequency and showing a larger capacity than the second capacity of the first double-tuned circuit at the second resonance frequency.

2. An RF coil having a cylindrical shape, wherein a static magnetic field is applied in effectively the same direction as direction of the central axis of the cylindrical shape, comprising:
    plural double-tuned circuits disposed circumferentially in at least one cross-section effectively orthogonal to the direction of the static magnetic field for the purpose of resonating with a first resonance frequency and a second resonance frequency;
    a first feeding port which feeds a first resonance frequency signal; and
    a second feeding port which feeds a second resonance frequency signal,
    wherein the second feeding port is disposed at a position 90° in the clockwise direction with respect to the center of the cylindrical shape from the first feeding port in the cross-section viewed from a direction passing through the static magnetic field; and
    wherein the plural double-tuned circuits comprise:
    plural first double-tuned circuits, in which for each of the plural first double-tuned circuits, when the first resonance frequency is higher than the second resonance frequency, the first capacity of the first double-tuned circuit at the first resonance frequency shows a smaller value than the second capacity of the first double-tuned circuit at the second resonance frequency; and
    a second double-tuned circuit disposed at a position 22.5° to 67.5° or 202.5° to 247.5° in the clockwise direction with respect to the center of the cylindrical shape from the first feeding port in a cross-section viewed in a direction passing through the static magnetic field, and showing a smaller capacity than the first capacity of the first double-tuned circuit at the first resonance frequency and showing a larger capacity than the second capacity of the first double-tuned circuit at the second resonance frequency.

3. The RF coil according to claim 1 or 2, wherein the first resonance frequency and second resonance frequency correspond respectively to a first element and a second element having different respective magnetic resonance frequencies.

4. A magnetic resonance imaging apparatus, comprising:
    a static magnetic field providing instrument which forms a static magnetic field;
    a gradient magnetic field providing instrument which forms a gradient magnetic field;
    a RF magnetic field providing instrument which forms a RF magnetic field;
    a transmit coil which applies a RF magnetic field to a test subject;
    a receive coil which detects a magnetic resonance signal from the test subject;
    a receive instrument which receives the magnetic resonance signal; and a control instrument which controls the gradient magnetic field providing instrument, the RF magnetic field providing instrument and the receive instrument, wherein the RF coil according to claim 1 or 2 is used as the transmit coil.

5. A magnetic resonance imaging apparatus, comprising:
a static magnetic field providing instrument which forms a static magnetic field;
a gradient magnetic field providing instrument which forms a gradient magnetic field;
a RF magnetic field providing instrument which forms a RF magnetic field;
a transmit coil which applies a RF magnetic field to a test subject;
a receive coil which detects a magnetic resonance signal from the test subject;
a receive instrument which receives the magnetic resonance signal; and
a control instrument which controls the gradient magnetic field providing instrument, the RF magnetic field providing instrument and the receive instrument,
wherein the RF coil according to claim 1 or 2 is used as the receive coil.

6. The magnetic resonance imaging apparatus according to claim 4, wherein the RF coil according to claim 1 or 2 is used as the receive coil.

7. The RF coil according to claim 1 or 2, wherein each of the plural first double-tuned circuits include a parallel resonance circuit of an inductor and a capacitor which is connected in series to at least another capacitor.

8. An RF coil having a cylindrical shape in which a static magnetic field is applied is essentially the same direction as the direction of the central axis of the cylindrical shape, the RF coil having:
a loop shaped first conductor disposed at one end of the cylindrical shape;
a loop shaped second conductor disposed at another end of the cylindrical shape;
plural third conductors connected respectively to the first conductor and the second conductor;
plural capacitors disposed at circumferential positions on the first conductor and on the second conductor; and
only one feeding port disposed at one position on the first conductor;
wherein the only one feeding port is used for generating or detecting a circularly-polarized magnetic field inside the cylindrical shape; and
wherein the plural capacitors comprise plural first capacitors having a first capacity, and at least one second capacitor disposed at a position from 22.5° to 67.5° or 202.5° to 247.5° in a clockwise direction with respect to the center of the cylindrical shape from the only one feeding port in a cross-section viewed from a direction passing through the static magnetic field, the at least one second capacitor having a second capacity which is smaller than the first capacity of the first capacitors.

9. The RF coil according to claim 8, wherein the plural capacitors further comprise at least one third capacitor disposed at a position from 22.5° to 67.;5° or 202.5° to 247.5° in a counterclockwise direction with respect to the center of the cylindrical shape from the only one feeding port in a cross-section viewed from a direction passing through the static magnetic field, the at least one third capacitor having a third capacity which is larger than the first capacity of the first capacitor.

10. The RF coil according to claim 8, wherein the Q value $Q_{RF}$ of the RF coil, capacity $C_1$ of the first capacitor and capacity $C_2$ of the second capacitor have the relation:

$$\left(\frac{Q_{RF}}{Q_{RF}+150}\right)^{0.22} \le \frac{C_2}{C_1} \le \left(\frac{Q_{RF}}{Q_{RF}+150}\right)^{0.07}.$$

11. An RF coil having a cylindrical shape in which a static magnetic field is applied in essentially the same direction as the direction of the central axis of the cylindrical shape, the RF coil having:
a loop shaped first conductor disposed at on end of the cylindrical shape;
a loop shaped second conductor disposed at another end of the cylindrical shape;
plural third conductors connected respectively to the first conductor and the second conductor;
plural capacitors disposed at circumferential positions on the first conductor and on the second conductor; and
only one feeding port disposed at one position on the first conductor;
wherein the only one feeding port is used for generating or detecting a circularly-polarized magnetic field inside the cylindrical shape; and
wherein the plural capacitors comprise plural first capacitors having a first capacity, and at least one second capacitor disposed at a position from 22.5° to 67.5° or 202.5° to 247.5° in a counterclockwise direction with respect to the center of the cylindrical shape from the only one feeding port in a cross-section viewed from a direction passing through the static magnetic field, the at least one second capacitor having a second capacity which is smaller than the first capacity of the first capacitors.

12. The RF coil according to claim 11, wherein the Q value $Q_{RF}$ of the RF coil, capacity $C_1$ of the first capacitor and capacity $C_3$ of the third capacitor have the relation:

$$\left(\frac{Q_{RF}+15}{Q_{RF}}\right)^{0.5} \le \frac{C_3}{C_1} \le \left(\frac{Q_{RF}+15}{Q_{RF}}\right)^{2}.$$

13. An RF coil having a cylindrical shape in which a static magnetic field is applied in essentially the same direction as the direction of the central axis of the cylindrical shape, the RF coil having:
a loop shaped first conductor disposed at on end of the cylindrical shape;
a loop shaped second conductor disposed at another end of the cylindrical shape;
plural third conductors connected respectively to the first conductor and the second conductor;
plural capacitors respectively disposed for each of the plural third conductors; and
only one feeding port disposed on one of the third conductors;
wherein the only one feeding port is used for generating or detecting a circularly-polarized magnetic field inside the cylindrical shape; and
wherein the plural capacitors comprise plural first capacitors having a first capacity, and at least one second capacitor disposed at a position from 22.5° to 67.5° or 202.5° to 247.5° in a clockwise direction with respect to the center of the cylindrical shape from the only one feeding port in a cross-section viewed from a direction passing through the static magnetic field, the at least one second capacitor having a second capacity which is smaller than the first capacity of the first capacitors.

14. The RF coil according to claim 13, wherein the Q value $Q_{RF}$ of the RF coil, capacity $C_1$ of the first capacitor and capacity $C_2$ of the second capacitor have the relation:

$$\left(\frac{Q_{RF}}{Q_{RF}+5}\right)^5 \le \frac{C_2}{C_1} \le \left(\frac{Q_{RF}}{Q_{RF}+5}\right).$$

15. An RF coil having a cylindrical shape in which a static magnetic field is applied in essentially the same direction as the direction of the central axis of the cylindrical shape, the RF coil having:
 a loop shaped first conductor disposed at on end of the cylindrical shape;
 a loop shaped second conductor disposed at another end of the cylindrical shape;
 plural third conductors connected respectively to the first conductor and the second conductor;
 plural capacitors respectively disposed for each of the plural third conductors; and
 only one feeding port disposed on one on the third conductors;
 wherein the only one feeding port is used for generating or detecting a circularly-polarized magnetic field inside the cylindrical shape; and
 wherein the plural capacitors comprise plural first capacitors having a first capacity, and at least one second capacitor disposed at a position from 22.5° to 67.5° or 202.5° to 247.5° in a counterclockwise direction with respect to the center of the cylindrical shape from the only one feeding port in a cross-section viewed from a direction passing through the static magnetic field, the at least one second capacitor having a second capacity which is smaller than the first capacity of the first capacitors.

16. The RF coil according to claim 15, wherein the Q value $Q_{RF}$ of the RF coil, capacity $C_1$ of the first capacitor and capacity $C_3$ of the third capacitor have the relation:

$$\left(\frac{Q_{RF}+40}{Q_{RF}}\right)^{0.14} \le \frac{C_3}{C_1} \le \left(\frac{Q_{RF}+40}{Q_{RF}}\right)^{0.42}.$$

17. An RF coil having a cylindrical shape in which a static magnetic field is applied in essentially the same direction as the direction of the central axis of the cylindrical shape, the RF coil having:
 a cylindrical conductor;
 plural linear conductors disposed at effectively equidistant intervals along the cylinder conductor inside the cylinder conductor effectively parallel to the axis of the cylinder conductor, and electrically connected to the cylinder conductor respectively via each of plural capacitors at both ends; and
 only one feeding port disposed at one end of the one of the linear conductors;
 wherein the only one feeding port is used for generating or detecting a circularly-polarized magnetic field inside the cylindrical shape; and
 wherein the plural capacitors comprise plural first capacitors having a first capacity, and at least one second capacitor disposed at a position from 22.5° to 67.5° or 202.5° to 247.5° in a clockwise direction with respect to the center of the cylindrical shape from the only one feeding portion in a cross-section viewed from a direction passing through the static magnetic field, the at least one second capacitor having a second capacity which is smaller than the first capacity of the first capacitors.

18. An RF coil having a cylindrical shape in which a static magnetic field is applied in essentially the same direction as the direction of the central axis of the cylindrical shape, the RF coil having:
 a cylindrical conductor;
 plural linear conductors disposed at effectively equidistant intervals along the cylinder conductor inside the cylinder conductor effectively parallel to the axis of the cylinder conductor, and electrically connected to the cylinder conductor respectively via each of plural capacitors at both ends; and
 only one feeding port disposed at one end of the one of the linear conductors;
 wherein the only one feeding port is used for generating or detecting a circularly-polarized magnetic field inside the cylindrical shape; and
 wherein the plural capacitors comprise plural first capacitors having a first capacity, and at least one second capacitor disposed at a position from 22.5° to 67.5° or 202.5° to 247.5° in a counterclockwise direction with respect to the center of the cylindrical shape from the only one feeding portion in a cross-section viewed from a direction passing through the static magnetic field, the at least one second capacitor having a second capacity which is smaller than the first capacity of the first capacitors.

19. An RF coil having a cylindrical shape in which a static magnetic field is applied in essentially the same direction as the direction of the central axis of the cylindrical shape, the RF coil having:
 a loop shaped first conductor disposed at one end of the cylindrical shape;
 a loop shaped second conductor disposed at another end of the cylindrical shape;
 plural third conductors connected respectively to the first conductor and the second conductor;
 plural capacitors disposed at circumferential positions on the first conductor and on the second conductor and having a first capacity;
 only one feeding port disposed at one on the first conductor; and
 a parallel circuit disposed at a position from 22.5° to 67.5° or 202.5° to 247.5° in a clockwise direction with respect to the center of the cylindrical shape from the one feeding port in a cross-section viewed from a direction passing through the static magnetic field, the one parallel circuit comprising an inductor and a capacitor having a second capacity which is smaller than the first capacity;
 wherein the only one feeding port is used for generating or detecting a circularly-polarized magnetic field inside the cylindrical shape.

20. An RF coil having a cylindrical shape in which a static magnetic field is applied in essentially the same direction as the direction of the central axis of the cylindrical shape, the RF coil having:
 a loop shaped first conductor disposed at one end of the cylindrical shape;
 a loop shaped second conductor disposed at another end of the cylindrical shape;

plural third conductors connected respectively to the first conductor and the second conductor;

plural capacitors disposed at circumferential positions on the first conductor and on the second conductor and having a first capacity;

only one feeding port disposed at one position on the first conductor; and a serial circuit disposed at a position from 22.5° to 67.5° or 202.5° to 247.5° in a counterclockwise direction with respect to the center of the cylindrical shape from the only one feeding port in a cross-section viewed from a direction passing through the static magnetic field, the serial circuit comprising an inductor and a capacitor having a capacity which is larger than the first capacity;

wherein the only one feeding port is used for generating or detecting a circularly-polarized field inside the cylindrical shape.

* * * * *